(12) United States Patent
Kang et al.

(10) Patent No.: US 11,817,347 B2
(45) Date of Patent: Nov. 14, 2023

(54) SEMICONDUCTOR DEVICE AND MANUFACTURING METHOD OF A SEMICONDUCTOR DEVICE

(71) Applicant: SK hynix Inc., Icheon-si (KR)

(72) Inventors: In Ku Kang, Icheon-si (KR); Sung Hyun Yoon, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/149,624

(22) Filed: Jan. 14, 2021

(65) Prior Publication Data

US 2022/0013651 A1 Jan. 13, 2022

(30) Foreign Application Priority Data

Jul. 8, 2020 (KR) .................. 10-2020-0084276

(51) Int. Cl.
*H10B 43/27* (2023.01)
*H01L 21/764* (2006.01)
*H01L 29/10* (2006.01)
*H01L 21/768* (2006.01)

(52) U.S. Cl.
CPC ...... *H01L 21/764* (2013.01); *H01L 21/76831* (2013.01); *H01L 29/1037* (2013.01); *H10B 43/27* (2023.02)

(58) Field of Classification Search
CPC ............ H01L 21/764; H01L 21/76831; H01L 21/76877; H01L 21/76879; H01L 21/7682; H01L 27/11556; H01L 27/11582; H01L 27/11553; H01L 27/1158; H10B 41/27; H10B 43/27
See application file for complete search history.

(56) References Cited

U.S. PATENT DOCUMENTS

| | | | |
|---|---|---|---|
| 8,912,591 B2 * | 12/2014 | Baek | H10B 43/30 257/E27.103 |
| 10,290,648 B1 | 5/2019 | Zhou et al. | |
| 2012/0001264 A1 * | 1/2012 | Kim | H01L 27/11582 257/368 |
| 2017/0062330 A1 * | 3/2017 | Kim | H01L 23/5226 |
| 2017/0084626 A1 * | 3/2017 | Kim | H01L 23/485 |
| 2017/0229474 A1 * | 8/2017 | Shimizu | H01L 27/11568 |
| 2020/0091176 A1 * | 3/2020 | Yun | H01L 21/76877 |
| 2020/0168625 A1 * | 5/2020 | Liu | H01L 27/11582 |
| 2020/0402997 A1 * | 12/2020 | Ahn | H01L 27/1157 |
| 2021/0343729 A1 * | 11/2021 | Surthi | H01L 27/11519 |

FOREIGN PATENT DOCUMENTS

KR 102001511 B1 7/2019

* cited by examiner

*Primary Examiner* — Yu Chen
(74) *Attorney, Agent, or Firm* — WILLIAM PARK & ASSOCIATES LTD.

(57) ABSTRACT

A semiconductor device includes a stack structure including conductive patterns spaced apart from each other, a channel structure penetrating the stack structure, and a slit insulating layer penetrating the stack structure. Air gaps are defined between the conductive patterns. The slit insulating layer includes a first interposition part covering a sidewall of one of the conductive patterns and a second interposition part covering one of the air gaps from the side. A smallest width of the second interposition part is smaller than a smallest width of the first interposition part.

16 Claims, 43 Drawing Sheets

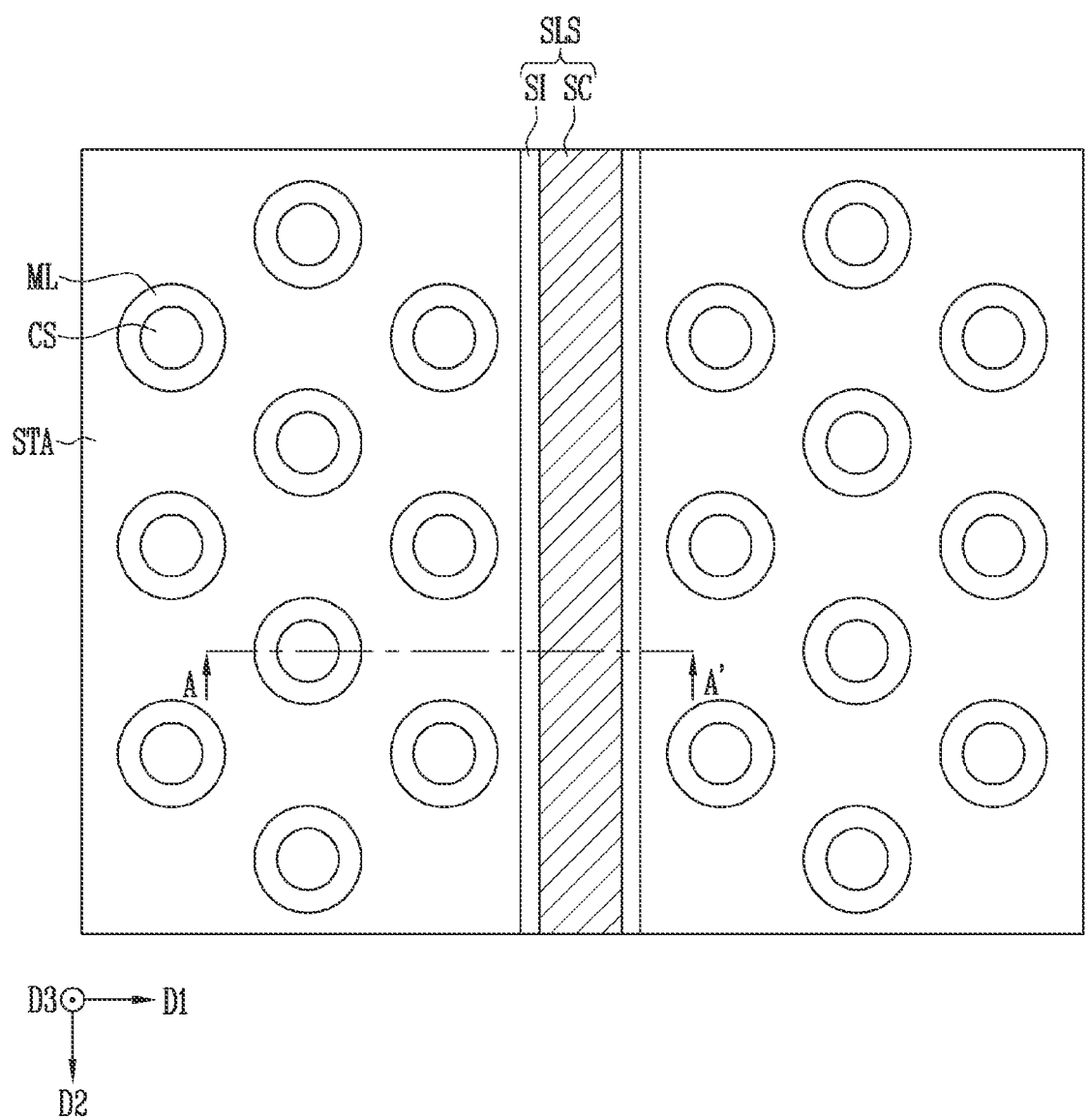

US 11,817,347 B2

SEMICONDUCTOR DEVICE AND MANUFACTURING METHOD OF A SEMICONDUCTOR DEVICE

CROSS-REFERENCE TO RELATED APPLICATION

The present application claims priority under 35 U.S.C. § 119(a) to Korean patent application number 10-2020-0084276, filed on Jul. 8, 2020, in the Korean Intellectual Property Office, the entire disclosure of which is incorporated herein by reference.

BACKGROUND

1. Technical Field

The present disclosure generally relates to a semiconductor device and a manufacturing method of a semiconductor device, and more particularly, to a three-dimensional semiconductor device and a manufacturing method of a three-dimensional semiconductor device.

2. Related Art

A semiconductor device includes memory cells capable of storing data. A three-dimensional semiconductor device includes memory cells arranged in three dimensions so that a two-dimensional area occupied by memory cells on a substrate can be reduced.

A degree of integration of the three-dimensional semiconductor device may be increased my increasing the number of stacked memory cells. However, the operational reliability of the three-dimensional semiconductor device may deteriorate as the number of stacked memory cells increases.

SUMMARY

In accordance with an aspect of the present disclosure, a semiconductor device includes: a stack structure including conductive patterns spaced apart from each other; a channel structure penetrating the stack structure; and a slit insulating layer penetrating the stack structure. Air gaps are defined between the conductive patterns, the slit insulating layer includes a first interposition part covering a sidewall of one of the conductive patterns and a second interposition part covering one of the air gaps from the side, and a smallest width of the second interposition part is smaller than that of the first interposition part.

In accordance with another aspect of the present disclosure, a semiconductor device includes: a stack structure including conductive patterns spaced apart from each other; a channel structure penetrating the stack structure; and a slit insulting layer penetrating the stack structure. Air gaps are defined between the conductive patterns, the slit insulating layer includes a second sidewall defining an air gap adjacent to the second interposition part and a first sidewall facing the second sidewall, and the first sidewall and the second sidewall are curved.

In accordance with still another aspect of the present disclosure, a method of manufacturing a semiconductor device includes: forming a stack structure including alternately stacked insulating layers and sacrificial layers; forming a trench penetrating the stack structure; replacing the sacrificial layers with conductive patterns; forming buffer patterns on sidewalls of the conductive patterns; forming air gaps by removing the insulating layers; and forming a slit insulating layer sealing the air gaps. Forming the slit insulating layer includes oxidizing the buffer patterns.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

Embodiments are directed to a semiconductor device and a manufacturing method of a semiconductor device, which can improve operational reliability.

FIG. 1A is a plan view of a semiconductor device in accordance with an embodiment of the present disclosure.

Figure 1B:
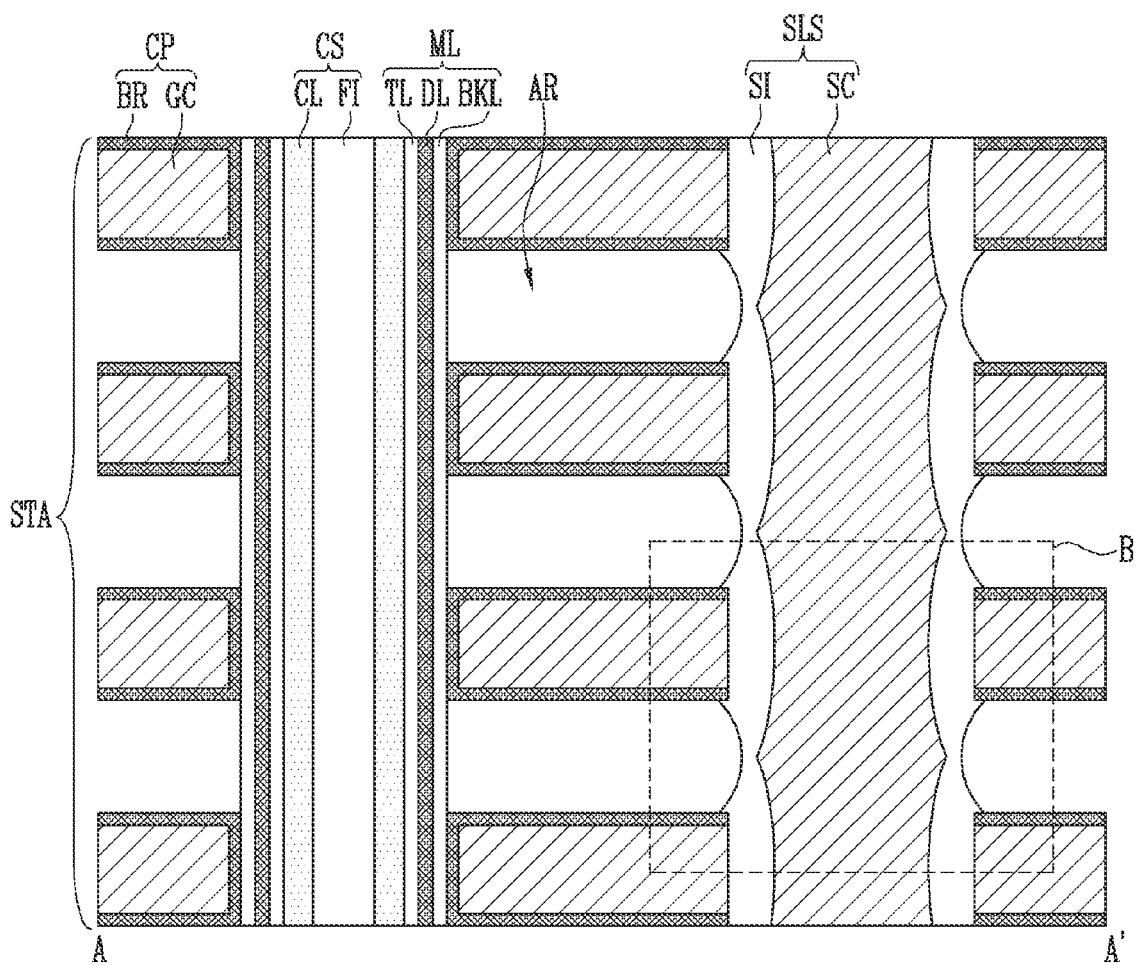
Figure 1B:
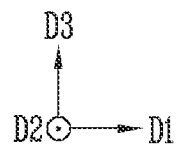

FIG. 1B is a sectional view taken along line A-A' shown in FIG. 1A.

Figure 1C:
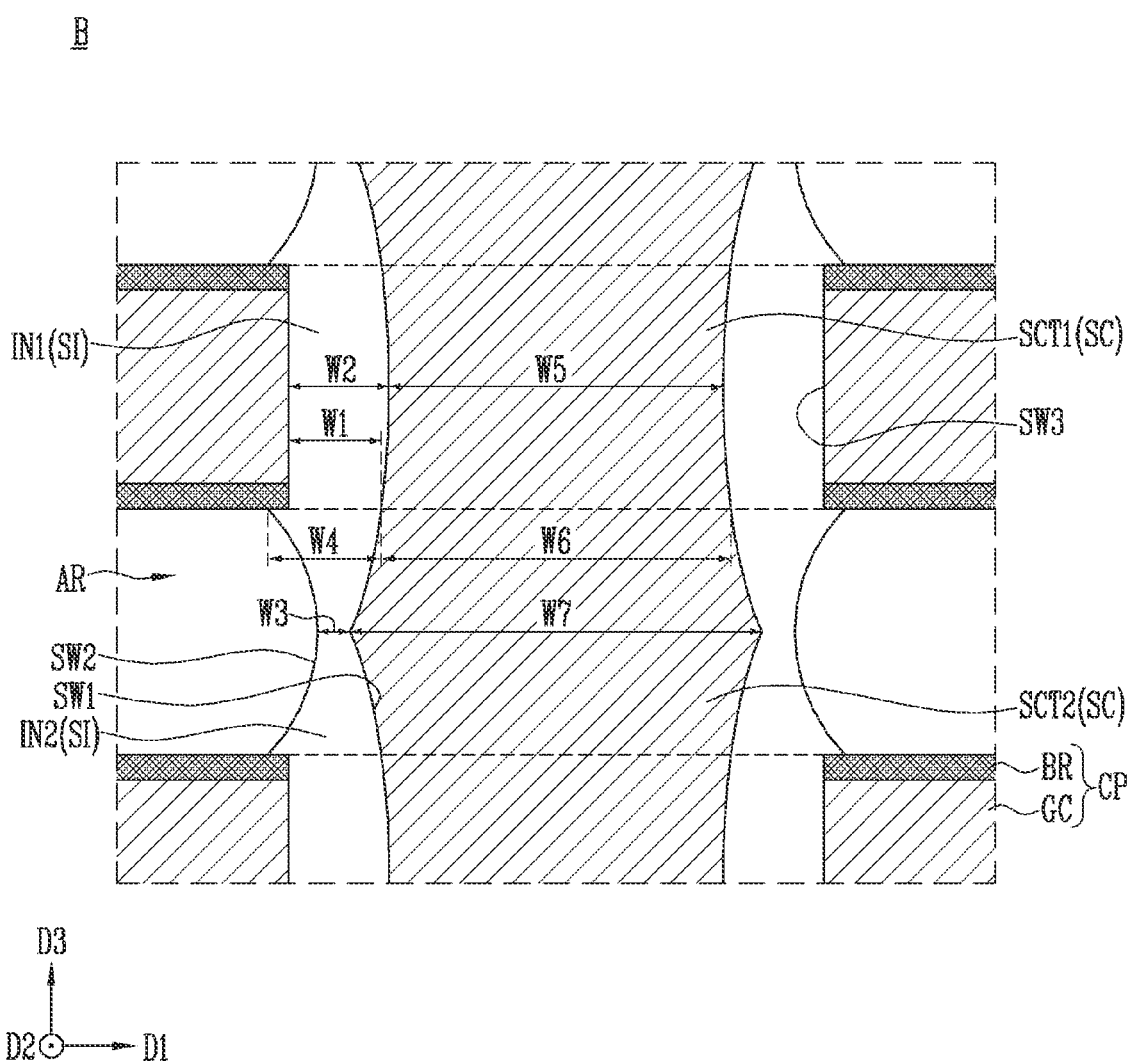

FIG. 1C is an enlarged view of region B shown in FIG. 1B.

FIGS. 2A, 2B, 2C, 2D, 2E, 2F, 2G, 2H, 2I, 2J, 2K, and 2L are sectional views illustrating a manufacturing method of the semiconductor device shown in FIGS. 1A to 1C.

Figure 3A:
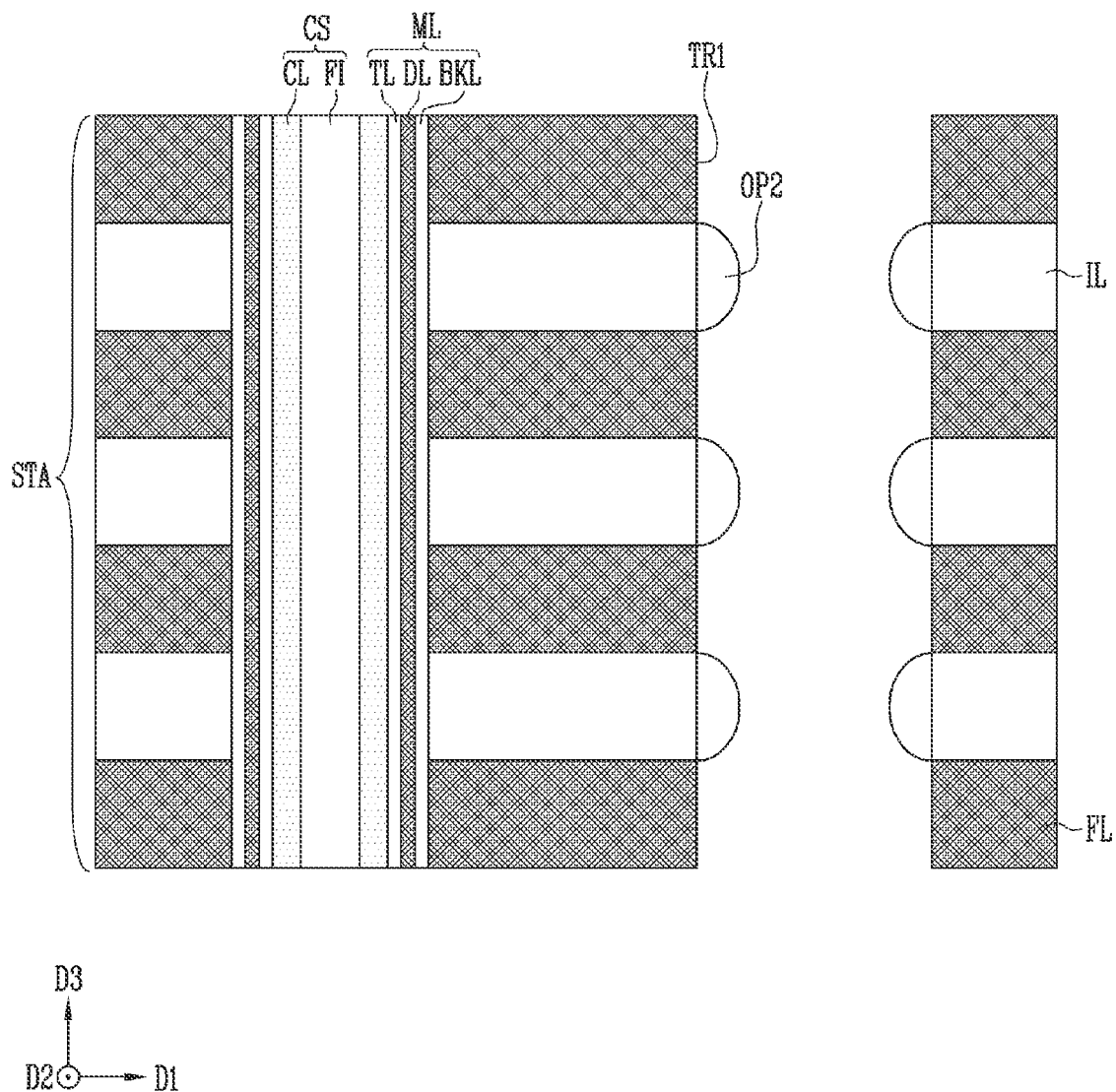
Figure 3B:
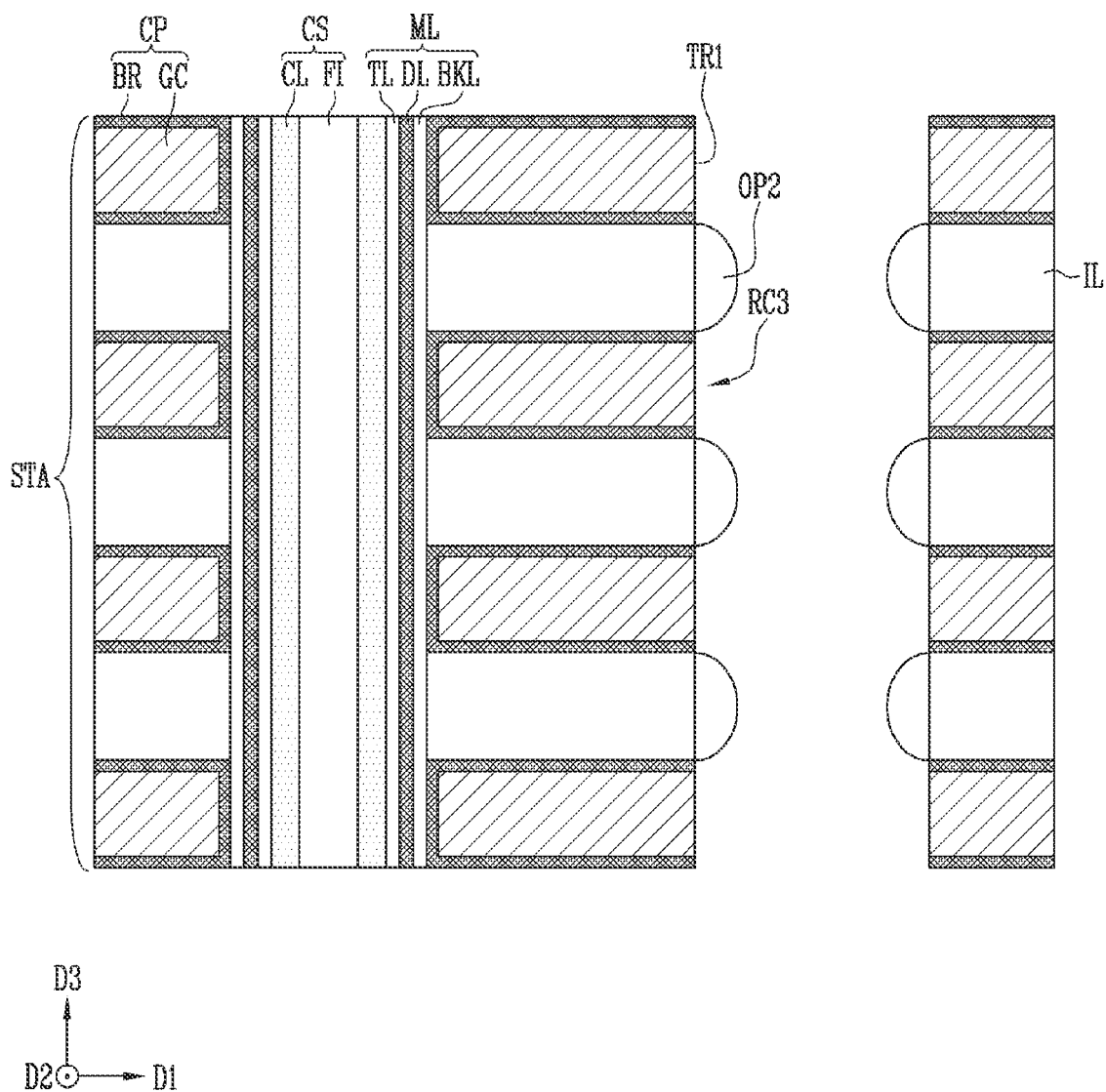
Figure 3C:
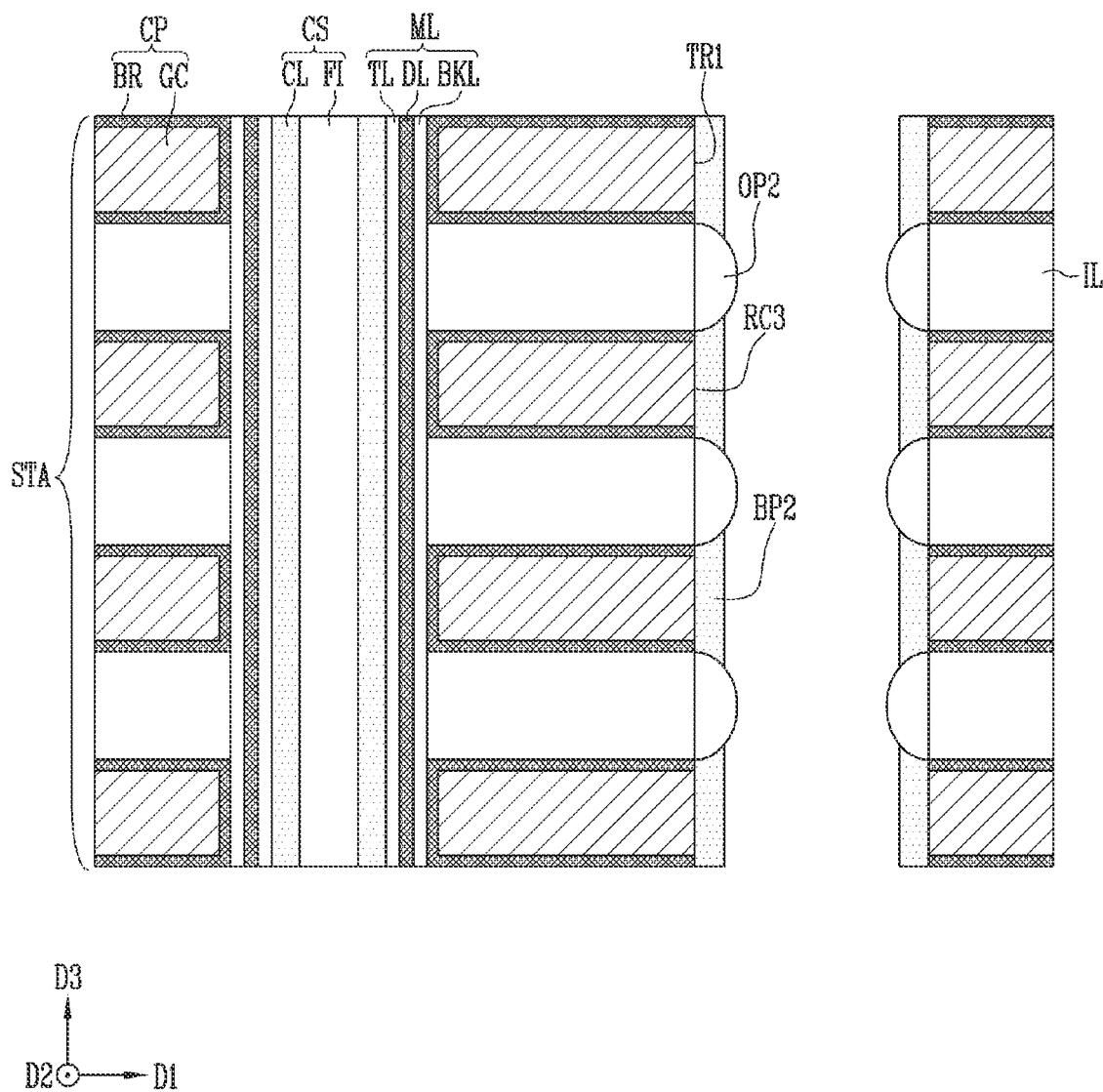

FIGS. 3A, 3B, and 3C are sectional views illustrating a manufacturing method of the semiconductor device shown in FIGS. 1A to 1C.

FIGS. 4A, 4B, 4C, 4D, and 4E are sectional views illustrating a manufacturing method of the semiconductor device shown in FIGS. 1A to 1C.

Figure 5A:
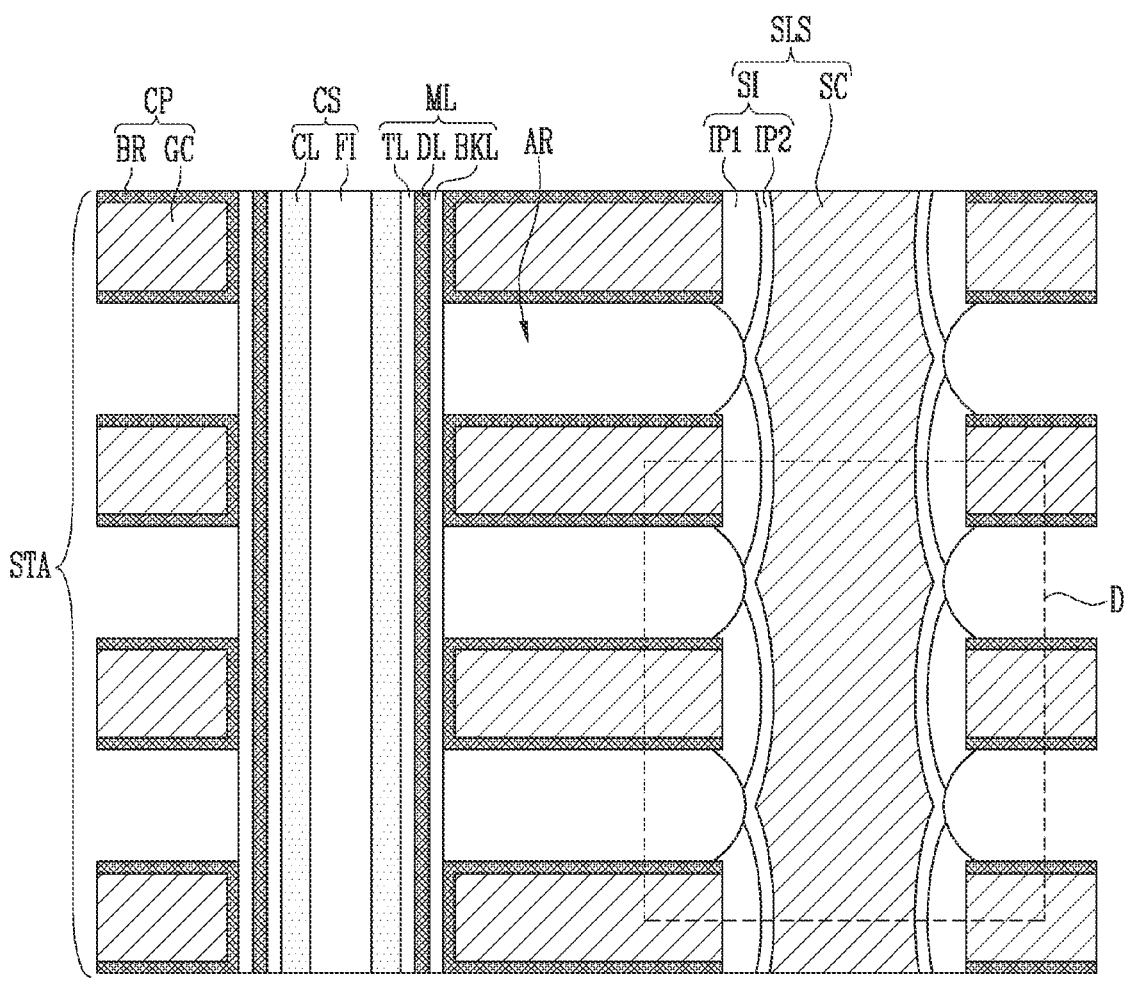

FIG. 5A is a sectional view of a semiconductor device in accordance with an embodiment of the present disclosure.

Figure 5B:
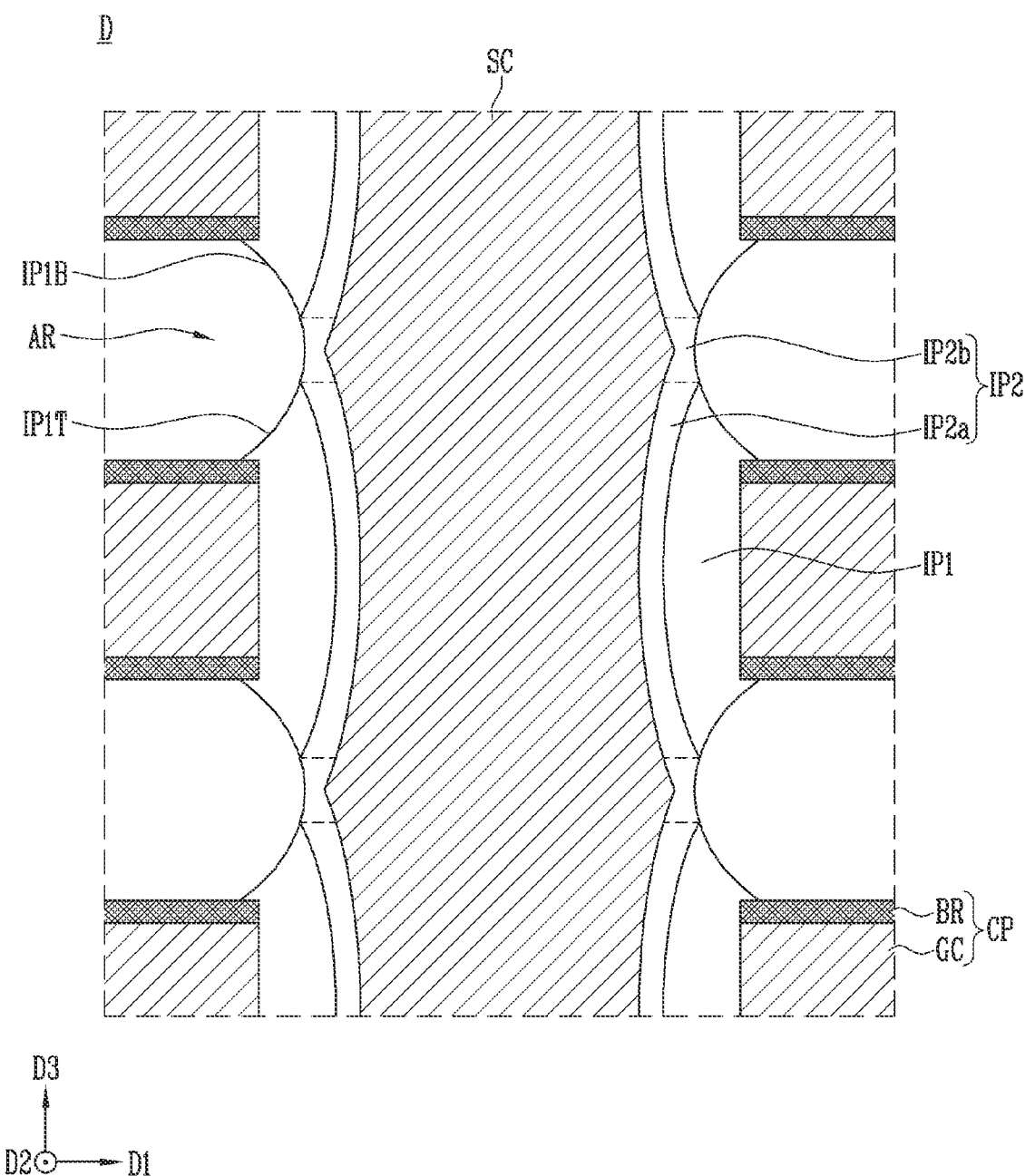

FIG. 5B is an enlarged view of region D shown in FIG. 5A.

Figure 6A:
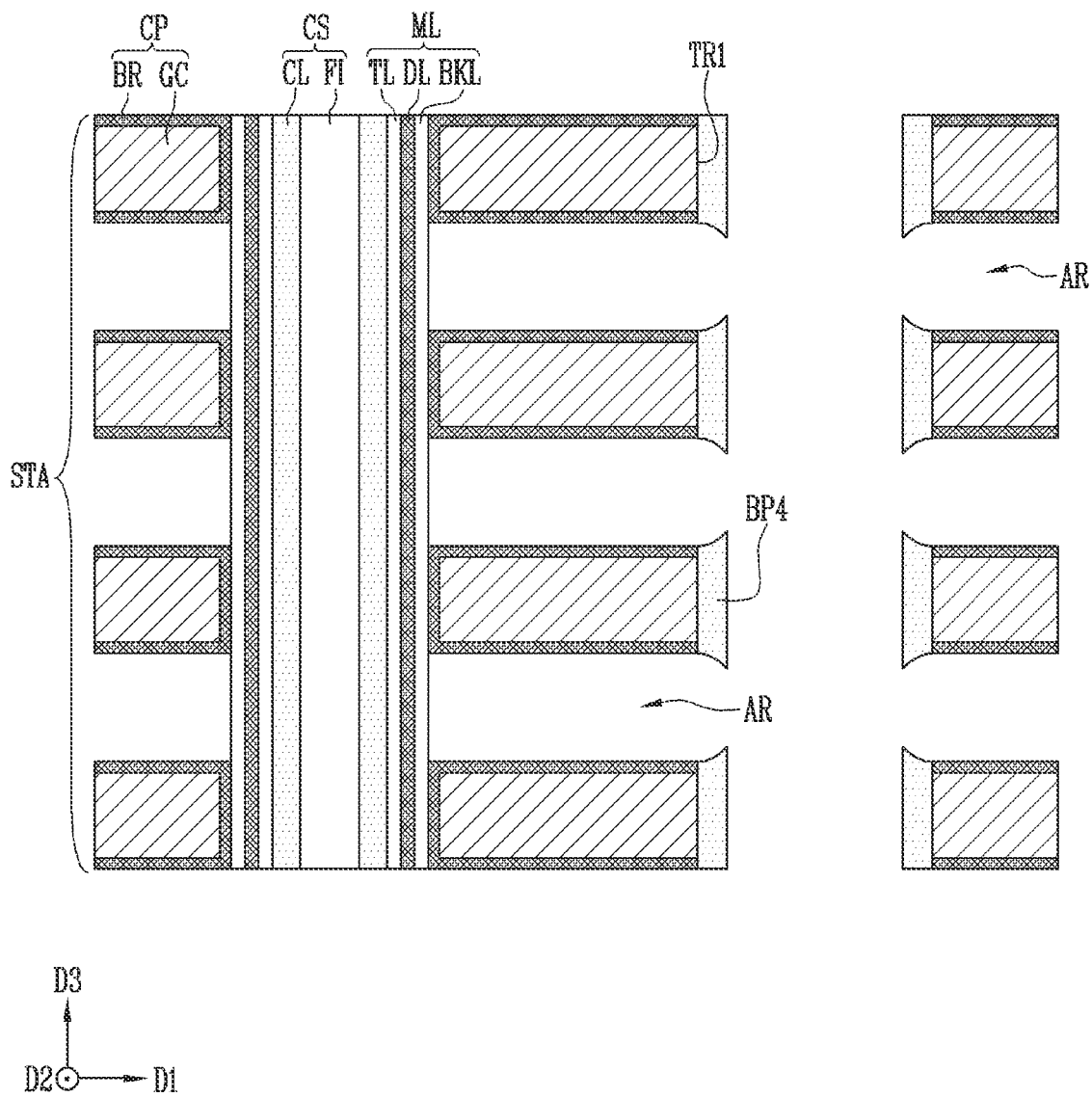
Figure 6B:
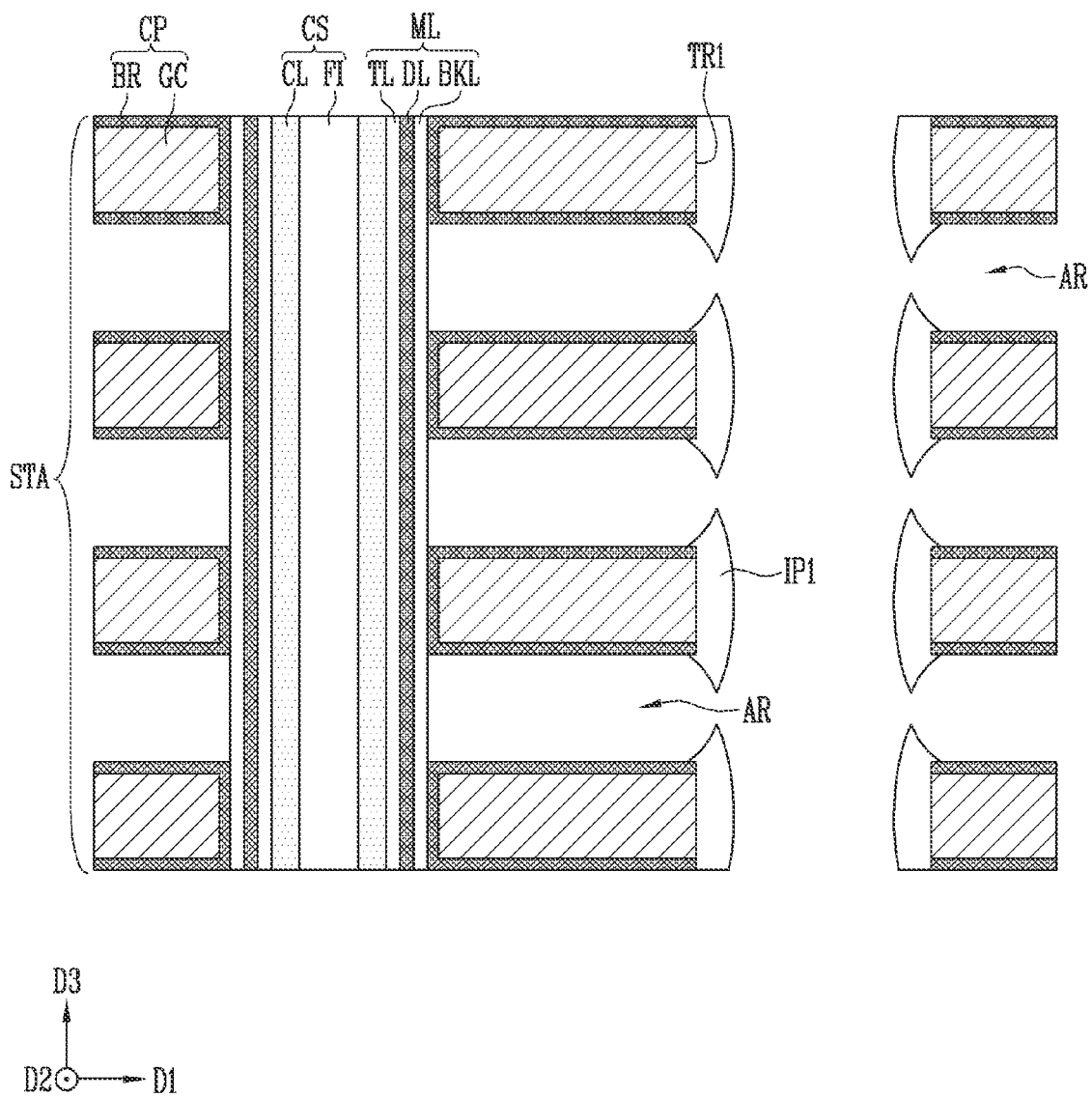
Figure 6C:
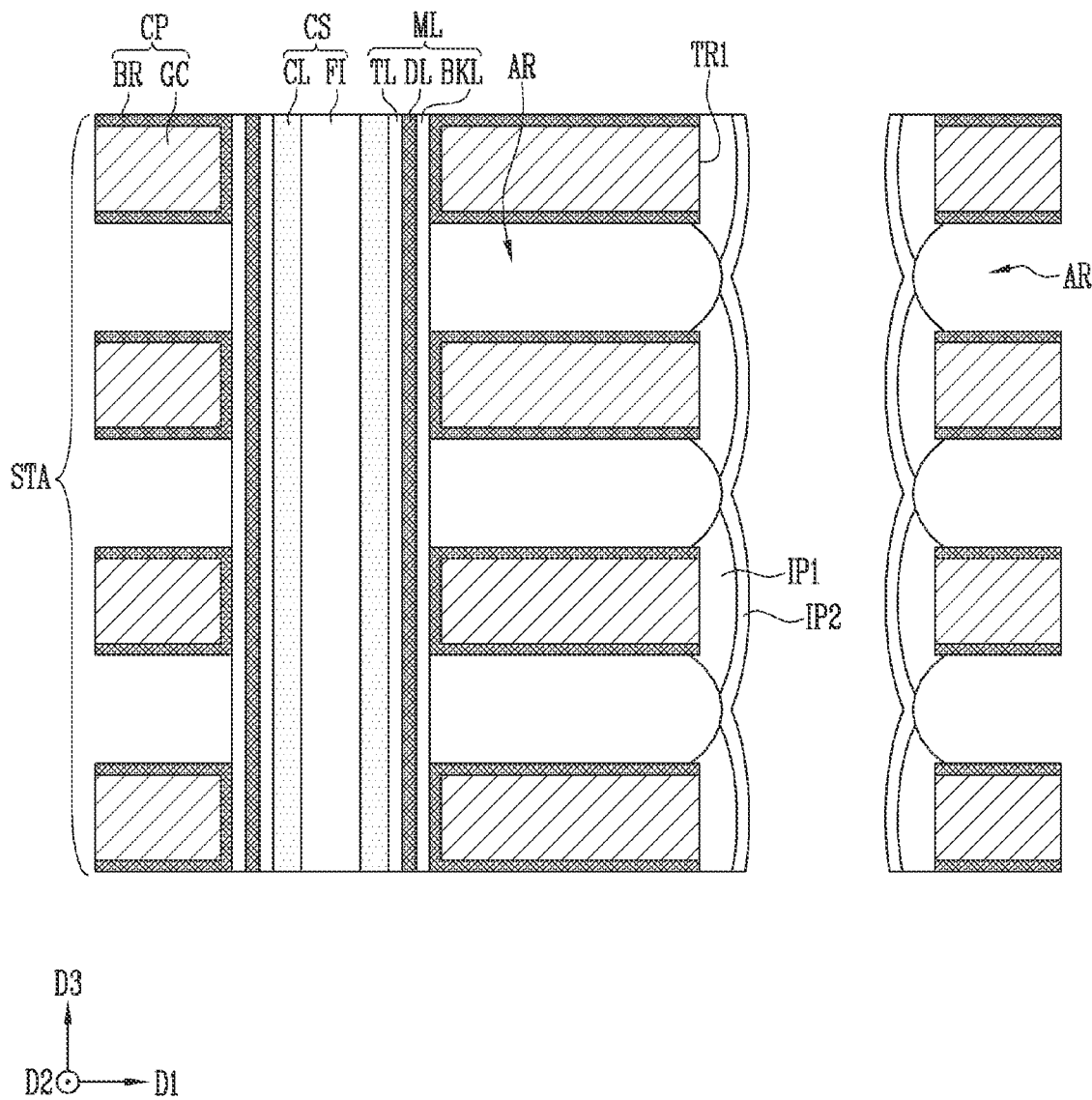

FIGS. 6A, 6B, and 6C are sectional views illustrating a manufacturing method of the semiconductor device shown in FIGS. 5A and 5B.

Figure 7:
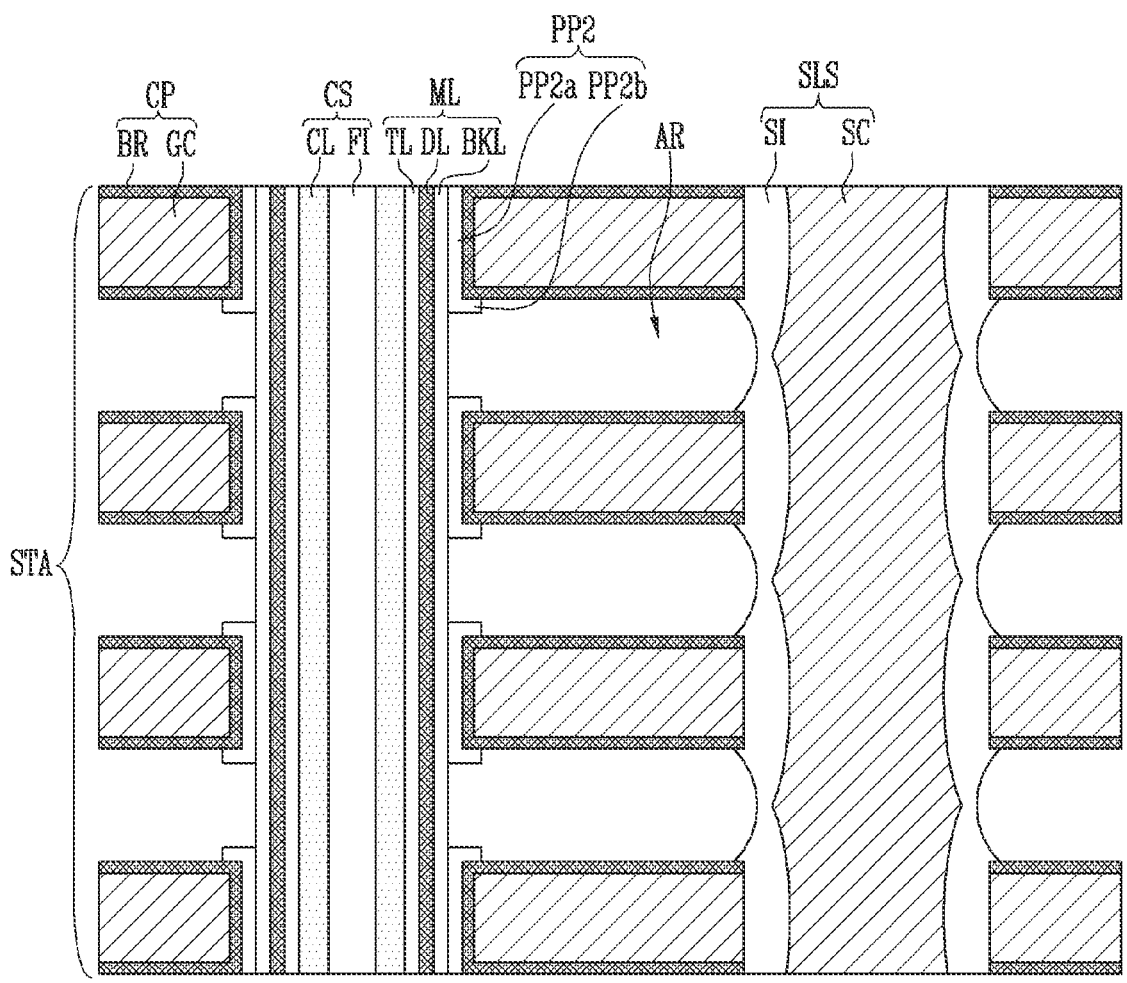

FIG. 7 is a sectional view of a semiconductor device in accordance with an embodiment of the present disclosure.

FIGS. 8A, 8B, 8C, 8D, and 8E are sectional views illustrating a manufacturing method of the semiconductor device shown in FIG. 7.

Figure 9:
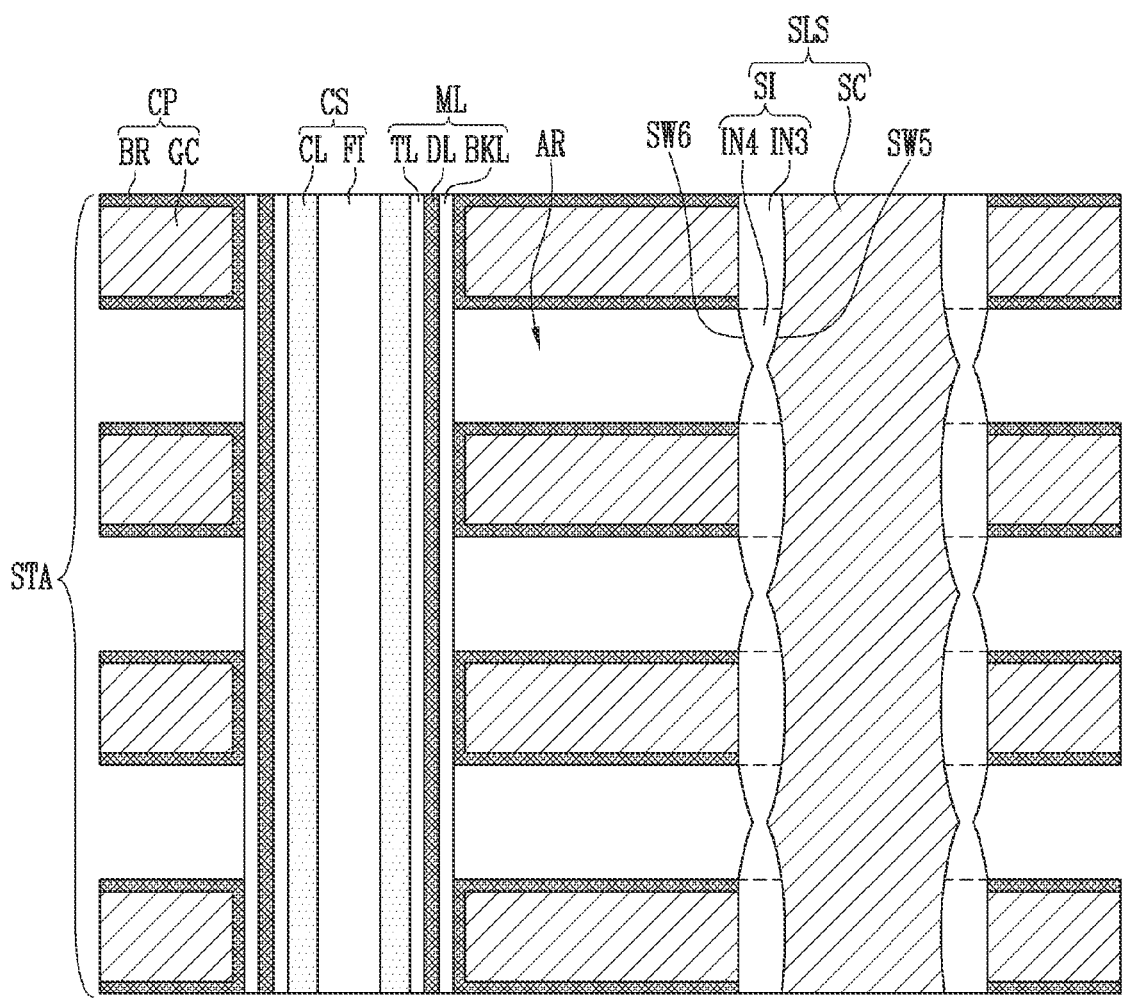

FIG. 9 is a sectional view of a semiconductor device in accordance with an embodiment of the present disclosure.

FIGS. 10A, 10B, 10C, and 10D are sectional views illustrating a manufacturing method of the semiconductor device shown in FIG. 9.

Figure 11A:
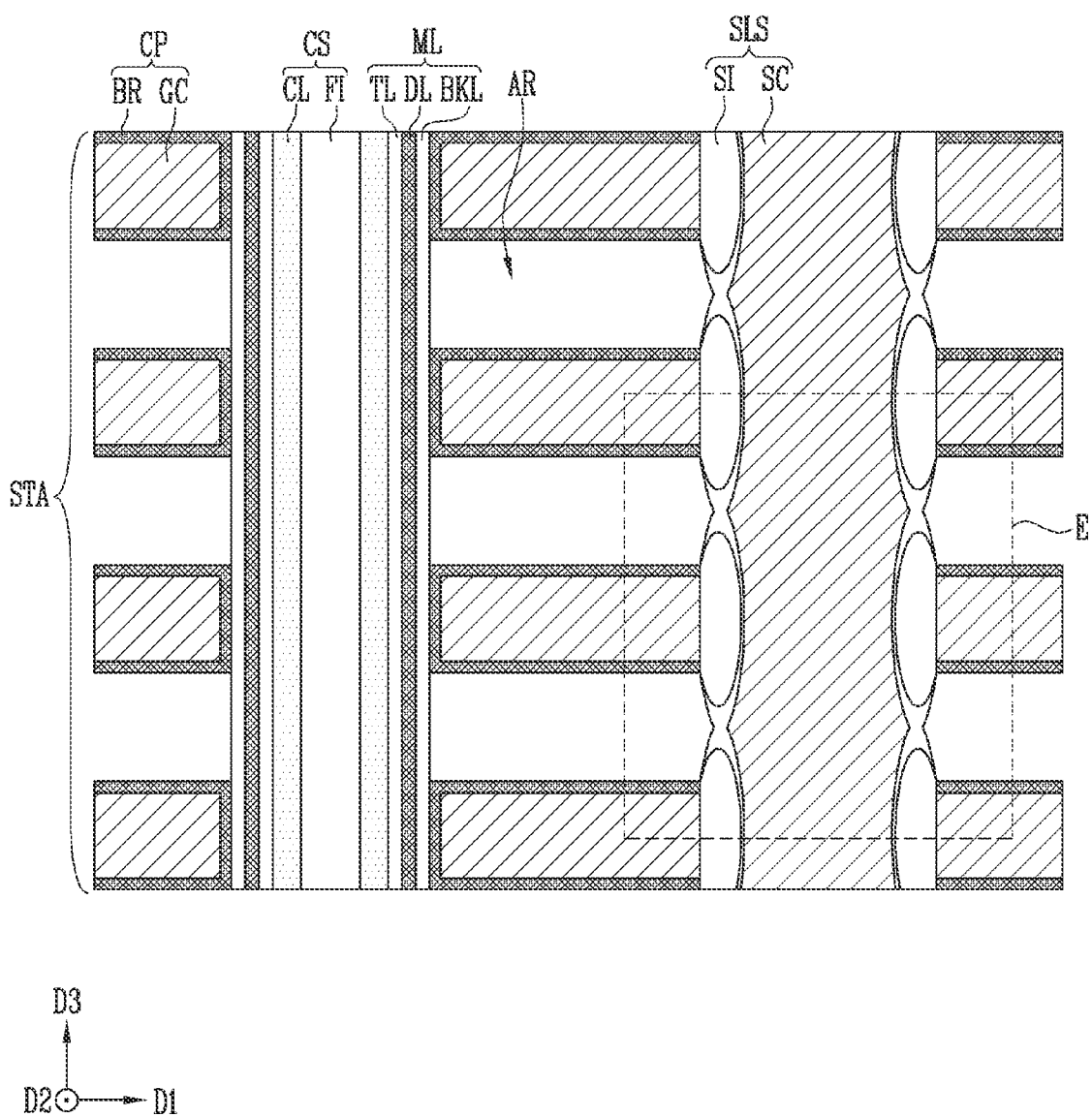

FIG. 11A is a sectional view of a semiconductor device in accordance with an embodiment of the present disclosure.

Figure 11B:
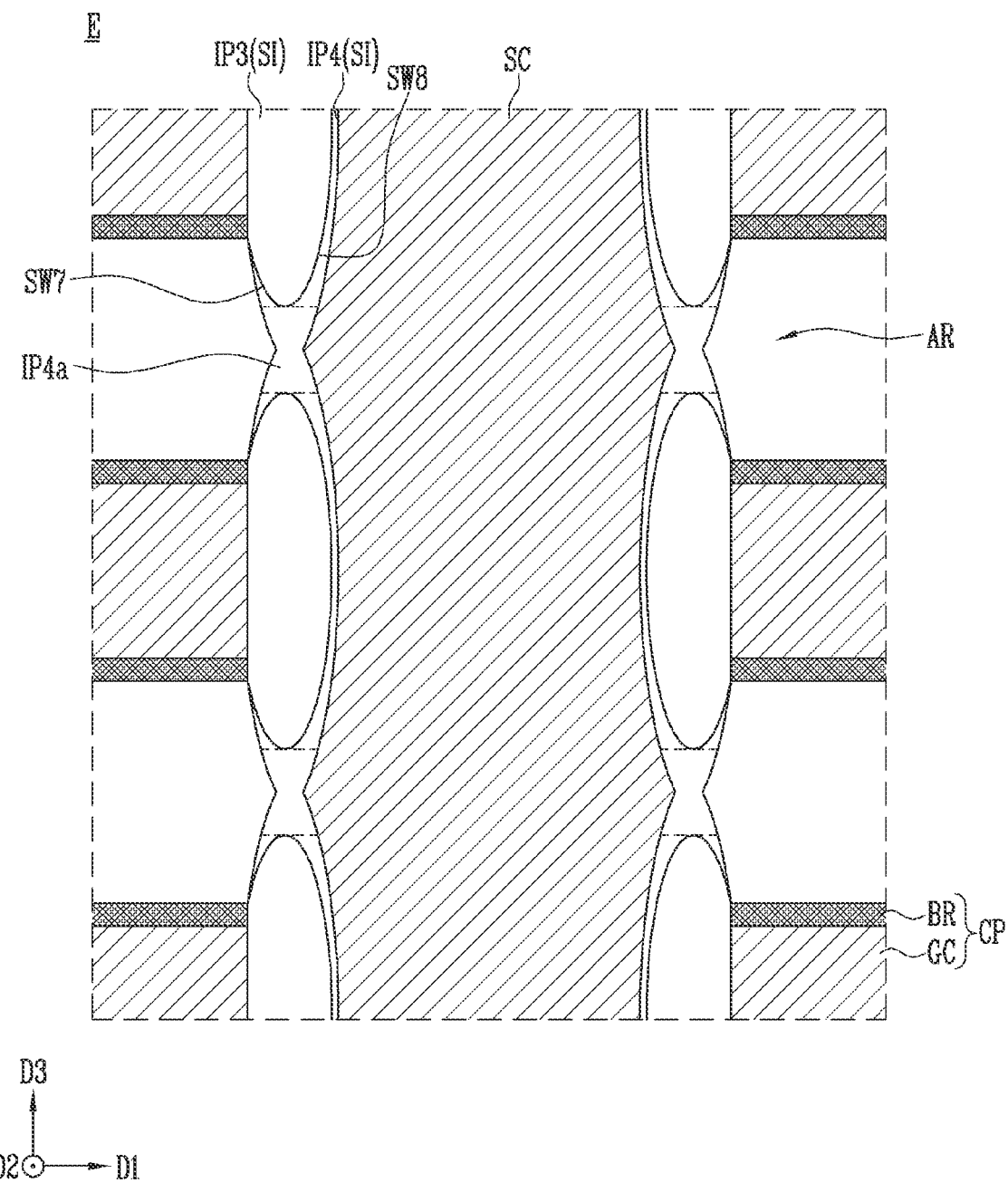

FIG. 11B is an enlarged view of region E shown in FIG. 11A.

Figure 12:
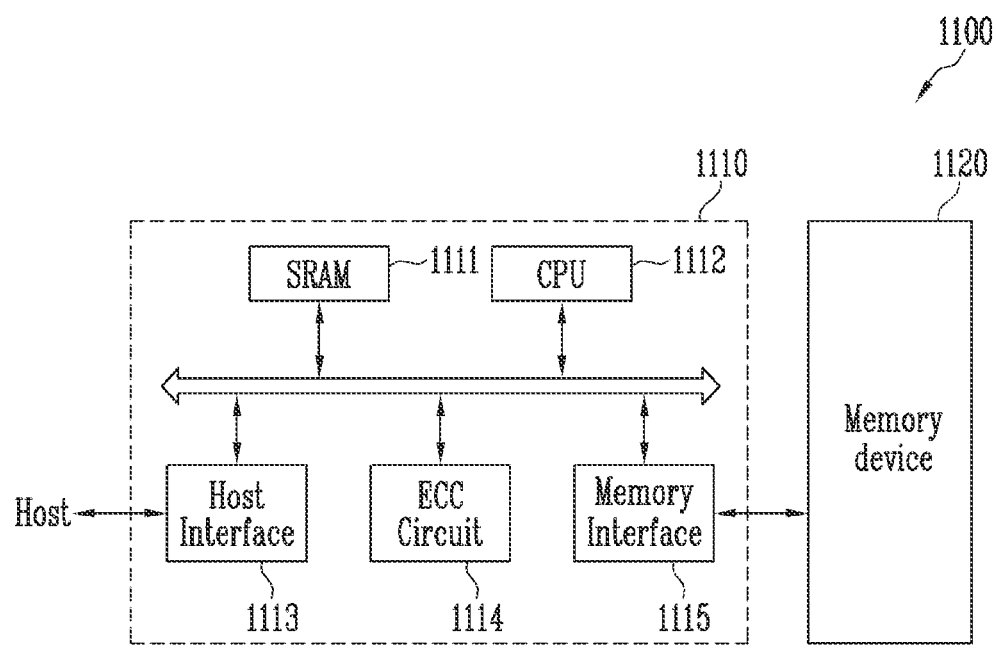

FIG. 12 is a block diagram illustrating a configuration of a memory system in accordance with an embodiment of the present disclosure.

Figure 13:
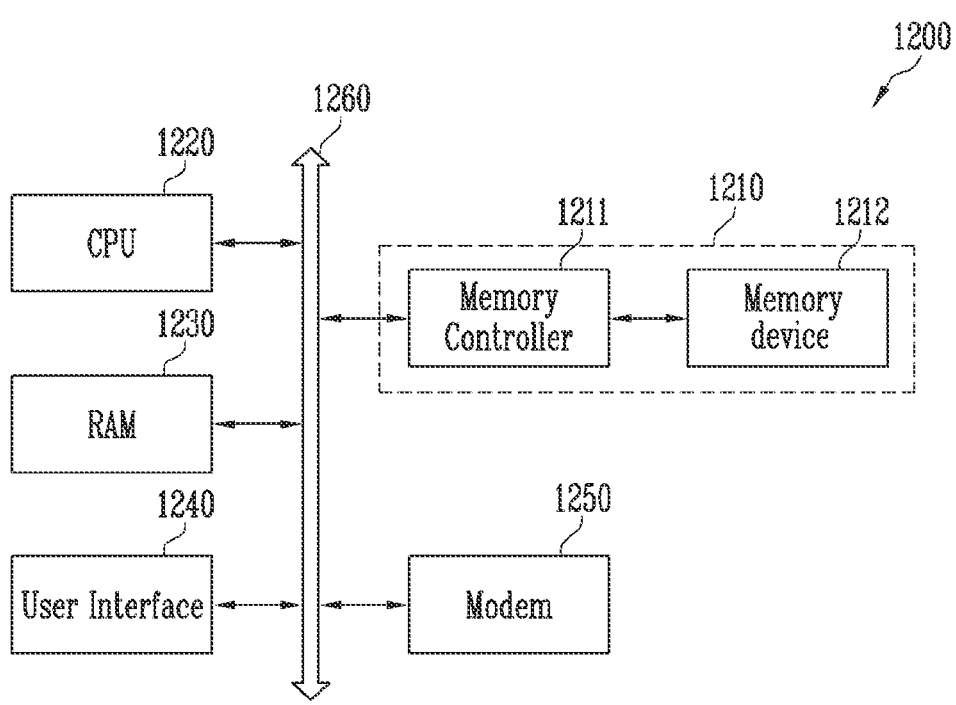

FIG. 13 is a block diagram illustrating a configuration of a computing system in accordance with an embodiment of the present disclosure.

DETAILED DESCRIPTION

The specific structural and functional descriptions disclosed herein are merely illustrative for the purpose of describing embodiments according to the concept of the present disclosure. Embodiments can be implemented in various forms, so the present teachings should not be construed as being limited to the embodiments set forth herein.

FIG. 1A is a plan view of a semiconductor device in accordance with an embodiment of the present disclosure. FIG. 1B is a sectional view taken along line A-A' shown in FIG. 1A. FIG. 1C is an enlarged view of region B shown in FIG. 1B.

Referring to FIGS. 1A and 1B, the semiconductor device may include a stack structure STA. The stack structure STA may be provided on a source structure (not shown). The source structure may have the shape of a plate expanding along a plane defined by a first direction D1 and a second direction D2. The first direction D1 and the second direction D2 may intersect each other in that they are not parallel. In an example, the first direction D1 and the second direction D2 may be orthogonal to each other.

The source structure may include a conductive material. In an example, the source structure may include poly-silicon.

In an embodiment, the source structure may be provided on a substrate (not shown) which physically supports the source structure. In an embodiment, a peripheral circuit structure (not shown) including transistors and lines may be provided between the source structure and the substrate.

The stack structure STA may include conductive patterns CP spaced apart from each other in a third direction D3. The third direction D3 may intersect the first direction D1 and the second direction D2. In an example, the third direction D3 may be orthogonal to the first direction D1 and the second direction D2.

The conductive pattern CP may include a gate conductive layer GC and a barrier layer BR. The gate conductive layer GC may include a conductive material. In an example, the gate conductive layer GC may include at least one of a doped silicon layer, a metal silicide layer, tungsten, nickel, and cobalt. The gate conductive layer GC may be used as a word line connected to a memory cell or a select line connected to a select transistor. The barrier layer BR may cover a surface of the gate conductive layer GC. In an example, the barrier layer BR may include at least one of titanium nitride and tantalum nitride.

Channel structures CS may be provided, which penetrate the stack structure STA. The channel structures CS may penetrate the conductive patterns CP of the stack structure STA. The channel structures CS may extend in the third direction D3. The channel structures CS may be electrically connected to the source structure.

Each of the channel structures CS may include a filling layer FI and a channel layer CL surrounding the filling layer FI. The filling layer FI and the channel layer CL may penetrate the stack structure STA. The filling layer FI and the channel layer CL may penetrate the conductive patterns CP of the stack structure STA. The filling layer FI and the channel layer CL may extend in the third direction D3. The channel layer CL may be electrically connected to the source structure.

The filling layer FI may include an insulating material. In an example, the filling layer FI may include oxide. The channel layer CL may include a semiconductor material. In an example, the channel layer CL may include poly-silicon.

Memory layers ML may be provided, which surround the respective channel structures CS. The memory layer ML may penetrate the stack structure STA. The memory layers ML may penetrate the conductive patterns CP of the stack structure STA. The memory layers ML may extend in the third direction D3.

Each of the memory layers ML may include a tunnel insulating layer TL surrounding the channel structure CS, a data storage layer DL surrounding the tunnel insulating layer TL, and a blocking layer BKL surrounding the data storage layer DL. The tunnel insulating layer TL, the data storage layer DL, and the blocking layer BKL may extend in the third direction D3 and penetrate the stack structure STA.

The tunnel insulating layer TL may include a material through which charges can tunnel. In an example, the tunnel insulating layer TL may include oxide. The data storage layer DL may include a material capable of storing data. In an example, the data storage layer DL may include nitride in which charges can be trapped. In an example, the data storage layer DL may include silicon, a phase change material, or nano dots. The blocking layer BKL may include a material capable of blocking movement of charges.

A slit structure SLS may be provided, which penetrates the stack structure STA. The conductive patterns CP may be disposed at both sides of the slit structure SLS. The conductive patterns CP disposed at the same level by the slit structure SLS may be spaced apart from each other in the first direction D1. The slit structure SLS may extend in the second direction D2 and the third direction D3, The channel structures CS may be symmetrically disposed at both the sides of the slit structure SLS. The slit structure SLS may be electrically connected to the source structure. The slit structure SLS and the channel structure CS may be electrically connected to each other through the source structure.

The slit structure SLS may include a source contact SC and silt insulating layers SI at both sides of the source contact SC. The source contact SC may penetrate the stack structure STA. The source contact SC may extend in the second direction D2 and the third direction D3. The source contact SC may include a conductive material. In an example, the source contact SC may include at least one of poly-silicon and tungsten. The source contact SC may be electrically connected to the source structure. The source contact SC and the channel layer CL of the channel structure CS may be electrically connected to each other by the source structure.

In another embodiment different from the embodiment shown in the drawings, the slit structure SLS may include an insulating structure instead of the source contact SC. The insulating structure may penetrate the stack structure STA. The insulating structure may extend in the second direction D2 and the third direction D3. The insulating structure may include an insulating material. In an example, the insulating structure may include oxide.

The slit insulating layers SI may penetrate the stack structure STA. The slit insulating layers SI may extend in the second direction D2 and the third direction D3. The slit insulating layers SI may be respectively in contact with both sidewalls of the source contact SC. The slit insulating layers SI may be spaced apart from each other in the first direction D1 with the source contact SC interposed therebetween. The slit insulating layer SI may be disposed between the source contact SC and the conductive patterns CP. A surface of the slit insulating layer SI, which is in contact with the source contact SC, may be curved. The slit insulating layer SI may include an insulating material. In an example, the slit insulating layer SI may include oxide.

Air gaps AR may be defined by the memory layers ML, the conductive patterns CP, and the slit structure SLS. The air gaps AR may be empty spaces provided among the channel structures CS, the conductive patterns CP, and the slit structure SLS. One air gap AR may be disposed between two conductive patterns CP. The conductive patterns CP of the stack structure STA may be spaced apart from each other in the third direction D3 with the air gaps AR interposed therebetween. One air gap AR may be defined by a bottom surface of a conductive pattern CP, a top surface of a next-lower conductive pattern CP, a sidewall of the slit insulating layer SI, and sidewalls of the blocking layers BLK of the channel structures CS. A surface of the slit insulating layer SI, which defines the air gap AR, may be curved. For different embodiments, the phrase "air gaps" refers to gaps filled with different types of gases other than atmospheric air.

Referring to FIG. 1C, the slit insulating layer SI may include first interposition parts IN1 and second interposition parts IN2. The first interposition part IN1 may be a part interposed between the conductive pattern CP and the source contact SC. The first interposition part IN1 may be a part disposed at the same level as the conductive pattern CP. The second interposition part IN2 may be a part interposed between the air gap AR and the source contact SC. The second interposition part IN2 may be a part disposed at the same level as the air gap AR. The first interposition parts IN1 and the second interposition parts IN2 may be alternately arranged along the third direction D3. A level of a boundary between the conductive pattern CP and the air gap AR may be equal to that of a boundary between the first and second interposition parts IN1 and IN2. The first interposition part IN1 may be in contact with a sidewall of the conductive pattern CP. The first interposition part IN1 may cover the sidewall of the conductive pattern CP. The second interposition part IN2 may define the air gap AR. The second interposition part IN2 may cover the air gap AR. The second interposition part IN2 may be in contact with a bottom surface of a conductive pattern CP thereabove and a top surface of a conductive pattern CP thereunder.

A width of the first interposition part IN1 in the first direction D1 may be changed according to a level. The width of the first interposition part IN1 in the first direction D1 may be equal to a distance between the conductive pattern CP and the source contact SC in the first direction D1.

The width of the first interposition part IN1 in the first direction D1 may become smallest at a lowermost portion and an uppermost portion of the first interposition part IN1. The width of the first interposition part IN1 in the first direction D1 may become smallest at a portion at which the first interposition part IN1 is in contact with the second interposition part IN2. A smallest width of the first interposition part IN1 in the first direction D1 may be defined as a first width W1.

The width of the first interposition part IN1 in the first direction D1 may become largest at a central level of the first interposition part IN1. In other words, the width of the first interposition part IN1 in the first direction D1 may become largest at a level equal to a central level of the conductive pattern CP in contact with the first interposition part IN1. A largest width of the first interposition part IN1 in the first direction D1 may be defined as a second width W2. The width of the first interposition part IN1 in the first direction D1 may become smaller when approaching to the uppermost portion and the lowermost portion of the first interposition part IN1 from the central level of the first interposition part IN1.

A width of the second interposition part IN2 in the first direction D1 may change according to level. The width of the second interposition part IN2 in the first direction D1 may be equal to a distance between the air gap AR and the source contact SC in the first direction D1.

The width of the second interposition part IN2 in the first direction D1 may become smallest at a central level of the second interposition part IN2. In other words, the width of the second interposition part IN2 in the first direction D1 may become smallest at a level equal to a central level of the air gap AR defined by the second interposition part IN2. A smallest width of the second interposition part IN2 in the first direction D1 may be defined as a third width W3. The third width W3 may be smaller than the first width W1. The smallest width of the second interposition part IN2 in the first direction D1 may be smaller than the smallest width of the first interposition part IN1 in the first direction D1. A width of the slit insulating layer SI in the first direction D1 may become smallest at a portion interposed between the air gap AR and the source contact SC.

The width of the second interposition part IN2 in the first direction D1 may become largest at a lowermost portion and an uppermost portion of the second interposition part IN2. The width of the second interposition part IN2 in the first direction D1 may be become largest at a portion at which the second interposition part IN2 is in contact with the first interposition part IN1. A largest width of the second interposition part IN2 in the first direction D1 may be defined as a fourth width W4. The width of the second interposition part IN2 in the first direction D1 may become larger approaching the uppermost portion and the lowermost portion of the second interposition part IN2 from the central level of the second interposition part IN2. The width of the second interposition part IN2 in the first direction D1 may become larger approaching the conductive pattern CP from the central level of the second interposition part IN2. The fourth width W4 may be larger than the second width W2. The largest width of the second interposition part IN2 in the first direction D1 may be larger than the largest width of the first interposition part IN1 in the first direction D1.

The second interposition part IN2 may include a first sidewall SW1 in contact with the source contact SC and a second sidewall SW2 defining the air gap AR. The first sidewall SW1 and the second sidewall SW2 may be sidewalls facing each other in that they are on opposite sides of the slit insulating layer SI. The first and second sidewalls SW1 and SW2 may be formed asymmetrically to each other. The first and second sidewalls SW1 and SW2 may be curved.

A side all of the conductive pattern CP, which is in contact with the first interposition part IN1, may be defined as a third sidewall SW3. A portion of the second sidewall of the second interposition part IN2 may be disposed closer to the source contact SC than the third sidewall SW3.

The source contact SC may include first contact parts SCT1 and second contact parts SCT2. The first contact part SCT1 may be a part disposed between the first interposition parts IN1. The first contact part SCT1 may be a part disposed at the same level as the first interposition parts IN1. The first interposition parts IN1 may be in contact with both sidewalls of the first contact part SCT1. The second contact part SCT2 may be a part disposed between the second interposition parts IN2. The second contact part SCT2 may be a part disposed at the same level as the second interposition parts IN2. The second interposition parts IN2 may be in contact with both sidewalls of the second contact part SCT2. The first contact parts SCT1 and the second contact parts SCT2 may be alternately arranged along the third direction D3. A level of a boundary between the conductive pattern CP and the air gap AR, a level of a boundary between the first and second interposition parts IN1 and IN2, and a level of a boundary between the first and second contact parts SCT1 and SCT2 may be the same.

A width of the first contact part SCT1 in the first direction D1 may be changed according to a level. The width of the first contact part SCT1 in the first direction D1 may become largest at an uppermost portion and a lowermost portion of the first contact part SCT1. The width of the first contact part SCT1 in the first direction D1 may become largest at a portion at which the first contact part SCT1 is in contact with the second contact part SCT2.

The width of the first contact part SCT1 in the first direction D1 may become smallest at a central level of the first contact part SCT1. In other words, the width of the first contact part SCT1 in the first direction D1 may become smallest at a level equal to the central level of the first interposition part IN1 in contact with the first contact part SCT1. A smallest width of the first contact part SCT1 may be defined as a fifth width W5. The width of the first contact part SCT1 in the first direction D1 may become larger as being closer to the uppermost portion and the lowermost portion of the first contact part SCT1.

A width of the second contact part SCT2 in the first direction D1 may be changed according to a level. The width of the second contact part SCT2 in the first direction D1 may become smallest at an uppermost portion and a lowermost portion of the second contact part SCT2. The width of the second contact part SCT2 in the first direction D1 may become smallest at a portion at which the second contact part SCT2 is in contact with the first contact part SCT1. A smallest width of the second contact part SCT2 may be equal to the largest width of the first contact part SCT1. The largest width of the first contact part SCT1 and the smallest width of the second contact part SCT2 may be defined as a sixth width W6. The sixth width W6 may be larger than the fifth width W5.

The width of the second contact part SCT2 in the first direction D1 may become largest at a central level of the second contact part SCT2. In other words, the width of the second contact part SCT2 in the first direction D1 may become largest at a level equal to the central level of the second interposition part IN2 in contact with the second contact part SCT2. A largest width of the second contact part SCT2 may be defined as a seventh width W7. The seventh width W7 may be larger than the sixth width W6. The width of the second contact part SCT2 in the first direction D1 may become smaller as being closer to the uppermost portion or the lowermost portion of the second contact part SCT2 from the central level of the second contact part SCT2. The width of the second contact part SCT2 in the first direction D1 may be larger than the width of the first contact part SCT1 in the first direction D1. The largest width of the second contact part SCT2 may be larger than the largest width of the first contact part SCT1.

A sidewall of the source contact SC may be curved corresponding to the sidewall of the slit insulating layer SI.

The semiconductor device in accordance with the embodiment of the present disclosure incudes the air gaps AR between the conductive patterns CP, so that parasitic capacitance between the conductive patterns CP can be minimized.

In semiconductor device in accordance with the embodiment of the present disclosure, the width of the silt insulating layer SI at a level equal to the central level of the air gap AR can be minimized. Accordingly, the volume of the air gap AR can be relatively large, and the parasitic capacitance between the conductive patterns CP can be minimized.

FIGS. 2A, 2B, 2C, 2D, 2E, 2F, 2G, 2H, 2I, 2J, 2K, and 2L are sectional views illustrating a manufacturing method of the semiconductor device shown in FIGS. 1A to 1C.

For convenience of description, components identical to those described with reference to FIGS. 1A to 1C are designated by like reference numerals, and their overlapping descriptions will be omitted.

A manufacturing method described below is merely one embodiment of the manufacturing method of the semiconductor device shown in FIGS. 1A to 1C, and the manufacturing method of the semiconductor device shown in FIGS. 1A to 1C might not be limited to that described below.

Figure 2A:
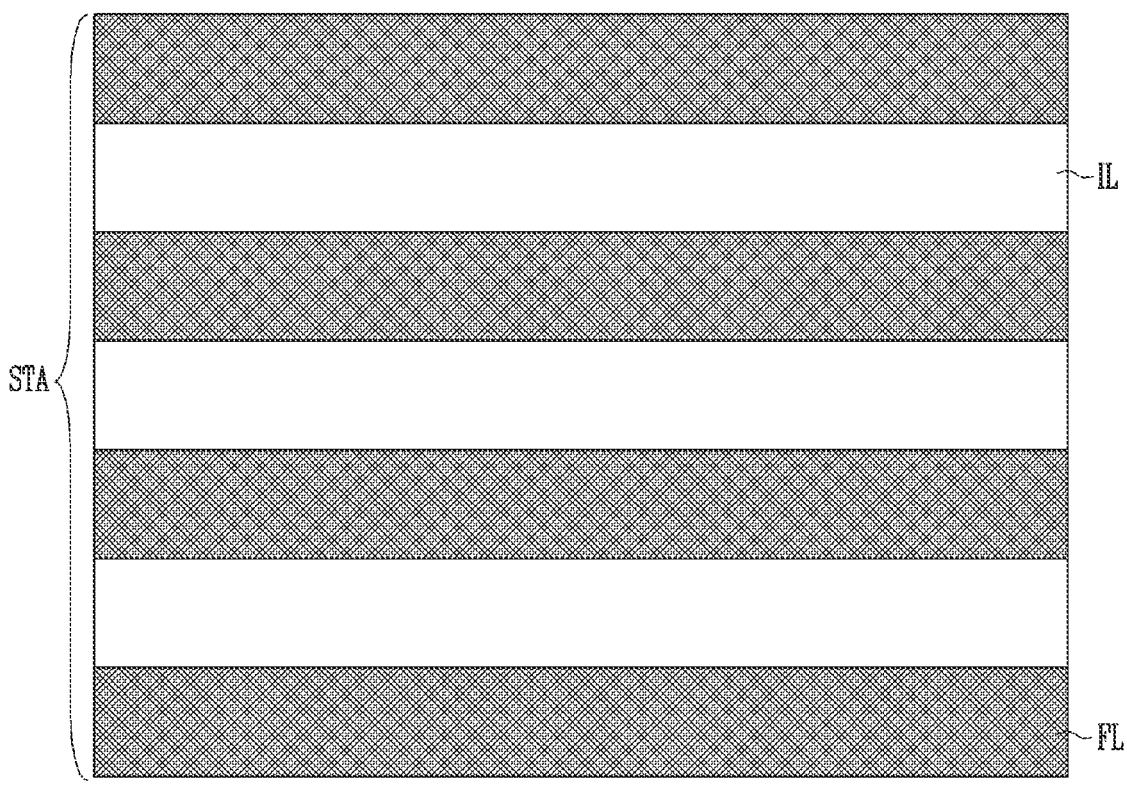
Figure 2A:
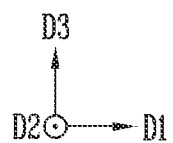

Referring to FIG. 2A, a stack structure STA may be formed, which includes sacrificial layers FL and insulating layers IL. The sacrificial layers FL and the insulating layers IL may be alternately stacked in the third direction D3. The insulating layers IL may include an insulating material. In an example, the insulating layers IL may include oxide. The sacrificial layers FL may include a material different from that of the insulating layers IL. In an example, the sacrificial layers FL may include nitride. The stack structure STA may be formed on a source structure.

Figure 2B:
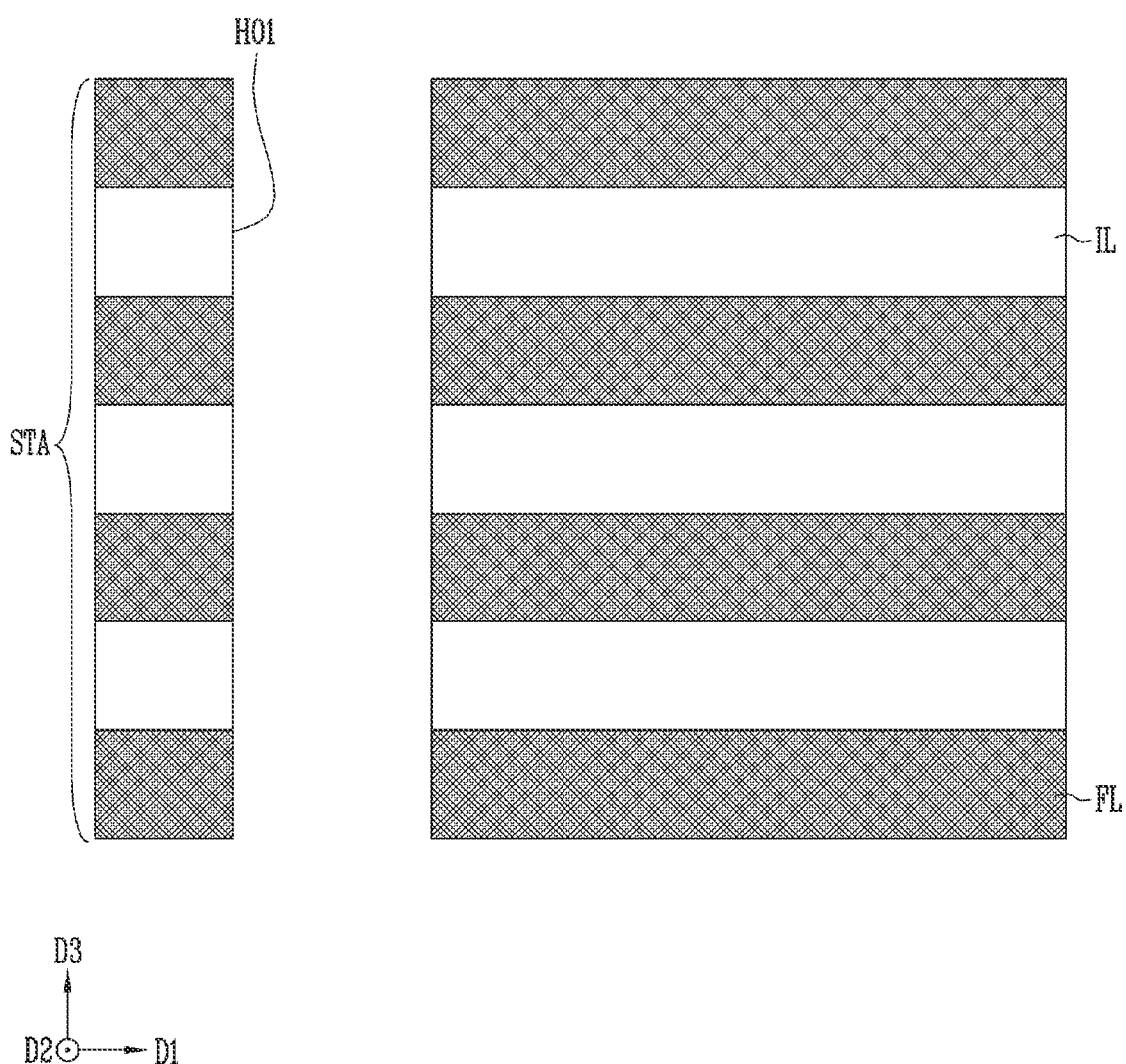

Referring to FIG. 2B, a first hole HO1 may be formed, which penetrates the stack structure STA. The first hole HO1 may extend in the third direction D3. The first hole HO1 may penetrate the insulating layers IL and the sacrificial layers FL of the stack structure STA. The forming of the first hole HO1 may include forming a first mask pattern including a first opening on the stack structure STA and etching the stack structure STA by using the first mask pattern as an etching mask.

Figure 2C:
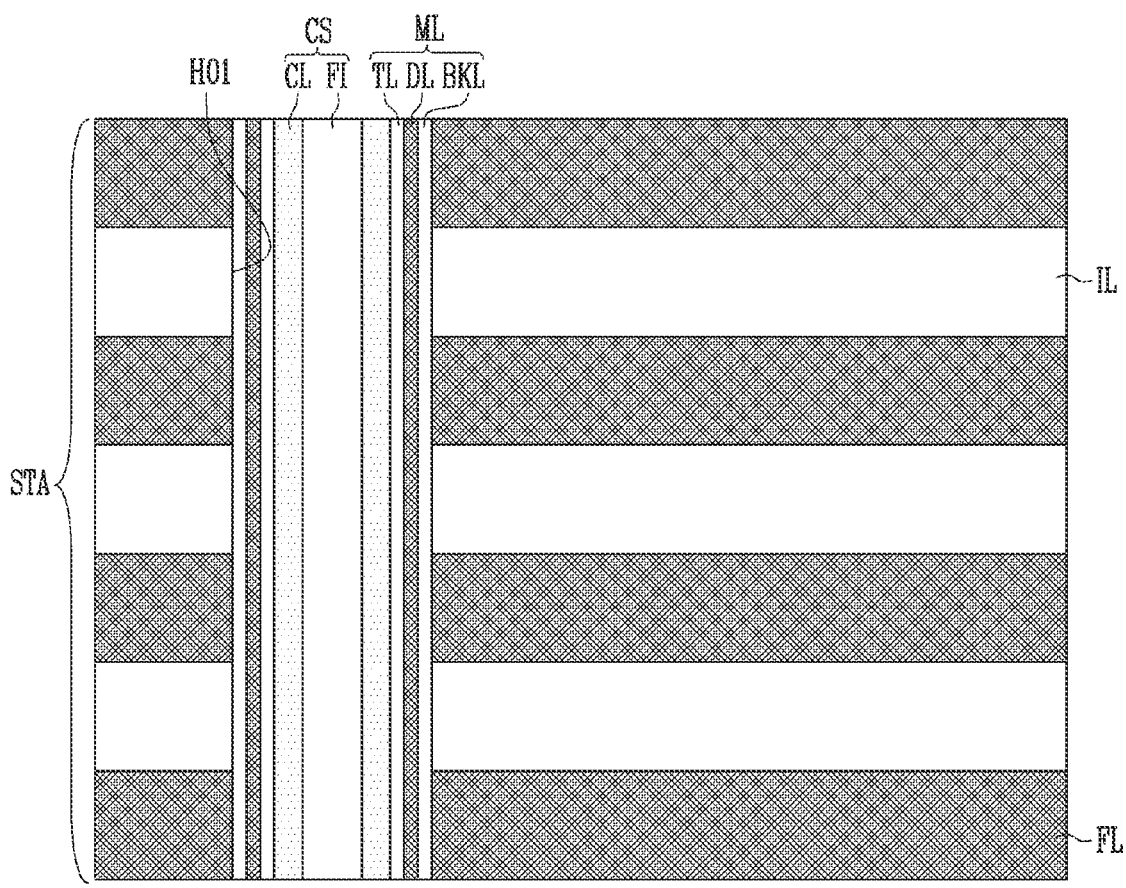

Referring to FIG. 2C, a memory layer ML and a channel structure CS may be formed in the first hole HO1. The forming of the memory layer ML and the channel structure CS in the first hole HO1 may include sequentially forming, in the first hole HO1, a blocking layer BKL, a data storage layer DL, a tunnel insulating layer TL, a channel layer CL, and a filling layer FI.

Figure 2D:
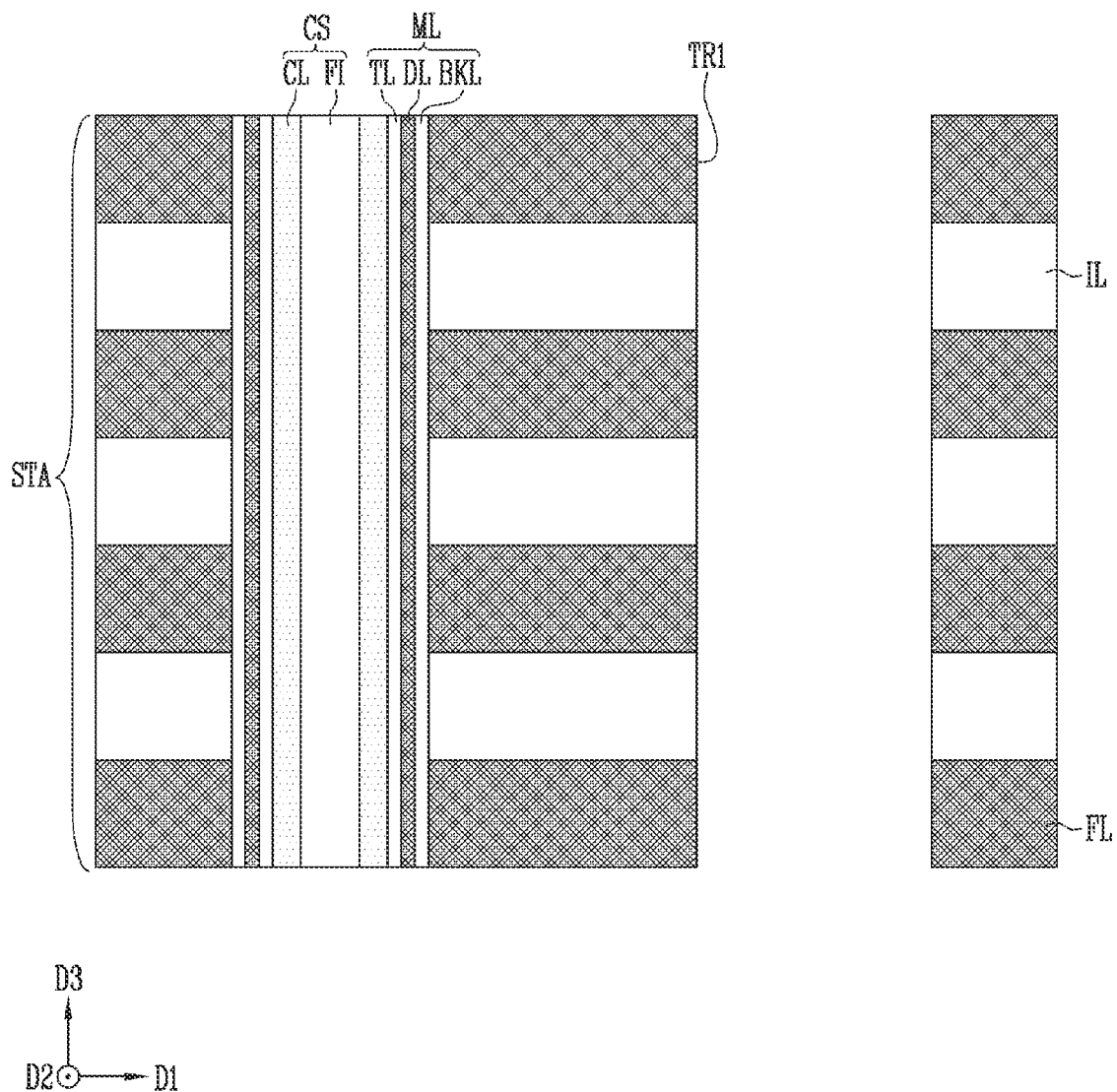

Referring to FIG. 2D, a first trench TR1 may be formed, which penetrate the stack structure STA. The first trench TR1 may extend in the second direction D2 and the third direction D3. The insulating layers IL and the sacrificial layers FL may be isolated from each other in the first direction D1 by the first trench TR1. The forming of the first trench TR1 may include forming a second mask pattern including a second opening on the stack structure STA and etching the stack structure STA by using the second mask pattern as an etching mask.

Figure 2E:
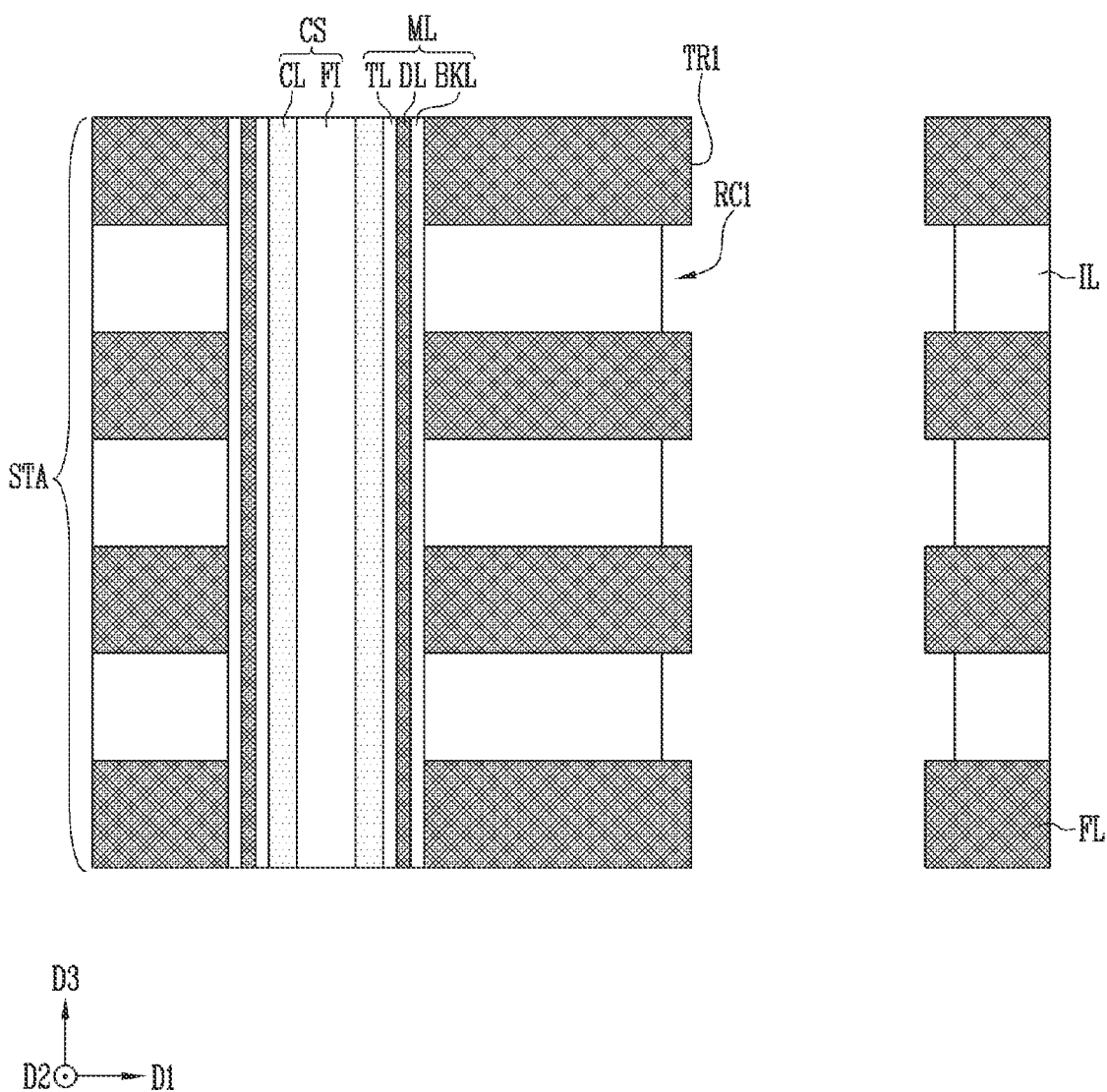

Referring to FIG. 2E, the insulating layers IL may be selectively etched through the first trench TR1. Sidewalk of the insulating layers IL, which are exposed through the first trench TR1, may be etched. When the insulating layers IL are etched, a portion of each of the insulating layer IL may be removed. When the portion of each of the insulating layers IL is removed, first recesses RC1 may be formed. A space between the sacrificial layers FL adjacent to each other in the third direction D3 may be defined as a first recess RC1. The first recess RC1 may be defined by the etched sidewall of the insulating layer IL, a bottom surface of one sacrificial layer FL, and a top surface of another sacrificial layer FL. The first recesses RC1 may be connected to the first trench TR1.

Figure 2F:
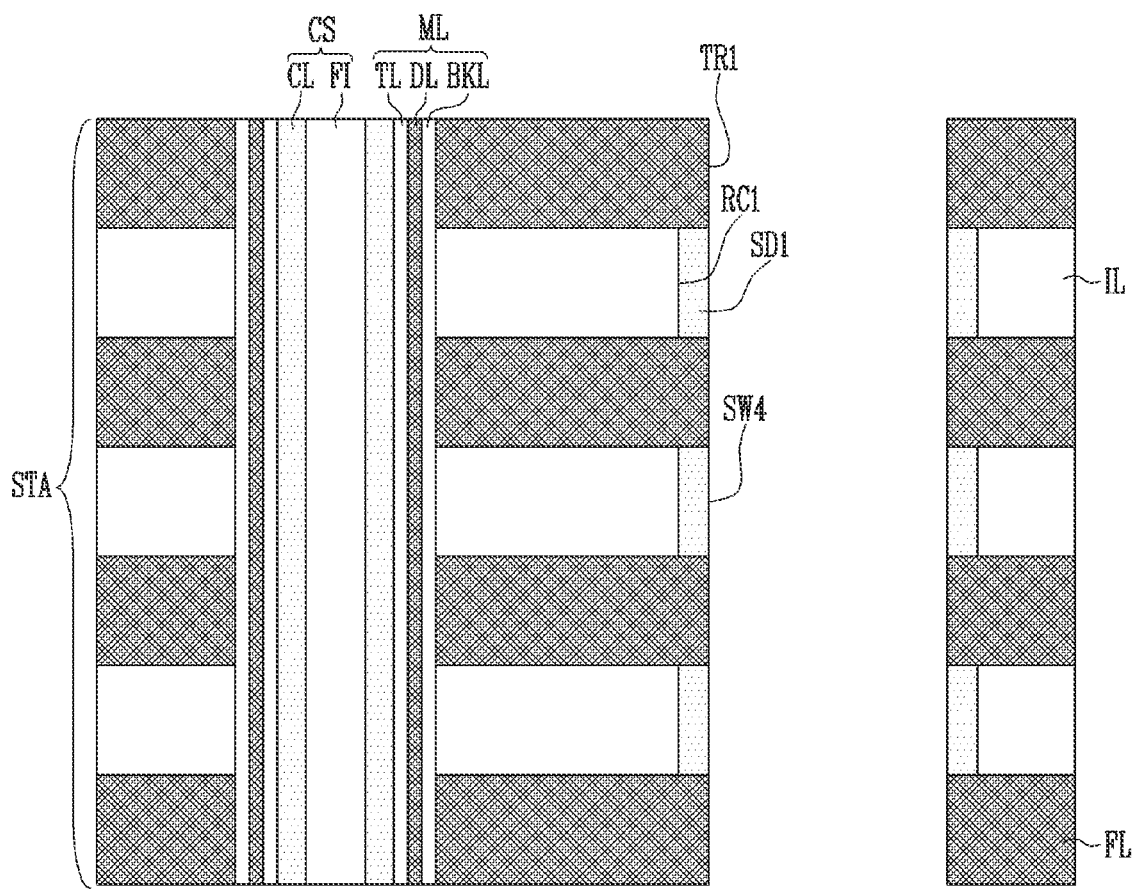

Referring to FIG. 2F, first seed patterns SD1 may be formed in the first recesses RC1. The forming of the first seed patterns SD1 may include forming a first seed layer filling at least a portion of the first trench TR1 and the first recesses RC1 and isolating the first seed layer into the first seed patterns SD1 by etching the first seed layer. The first seed pattern SD1 may be disposed between two sacrificial layers FL adjacent to each other in the third direction D3.

The first seed patterns SD1 may include a material which can serve as a seed in a subsequent process. The first seed patterns SD1 may include a material which can be oxidized through an oxidation process. In an example, the first seed patterns SD1 may include poly-silicon. A sidewall of the first seed pattern SD1, which is exposed through the first trench TR1, may be defined as a fourth sidewall SW4. The fourth sidewall SW4 may form a common surface with a sidewall of the sacrificial layer FL, which is exposed through the first trench TR1.

Figure 2G:
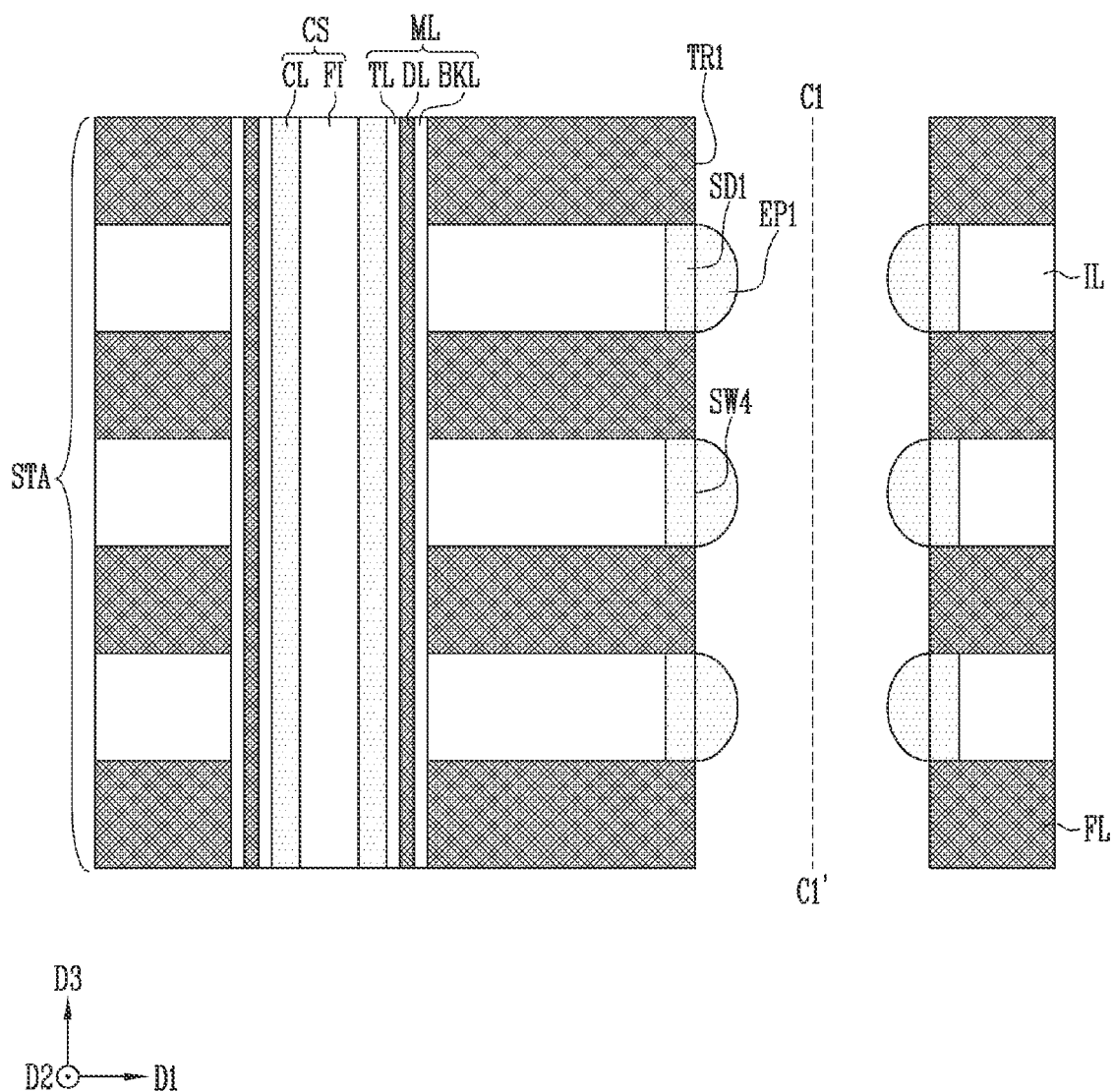

Referring to FIG. 2G, first preliminary oxidation patterns EP1 may be formed. The forming of the first preliminary oxidation patterns EP1 may include selectively forming the preliminary oxidation pattern EP1 by using the first seed patterns SD1 as a seed. The first preliminary oxidation patterns EP1 may be spaced apart from each other in the third direction D3. The first preliminary oxidation patterns EP1 may include the same material as the first seed patterns SD1. In an example, the first preliminary oxidation patterns EP1 may include poly-silicon.

A first central line C1-C1' of the first trench TR1 may be defined. The first central line C1-C1' may be a virtual line representing the center of the first trench TR1 in the first direction D1. The first central line C1-C1' may extend in the second direction D2 and the third direction D3.

The first preliminary oxidation patterns EP1 may be formed in the first trench TR1. The first preliminary oxidation patterns EP1 may be disposed closer to the center of the first trench TR1 than the sacrificial layers FL. A shortest distance between the first preliminary oxidation pattern EP1 and the first central line C1-C1' of the first trench TR1 may be smaller than a shortest distance between the sacrificial layer FL and the first central line C1-C1' of the first trench TR1. A surface of the first preliminary oxidation pattern EP1, which faces the center of the first trench TR1, may be curved.

Figure 2H:
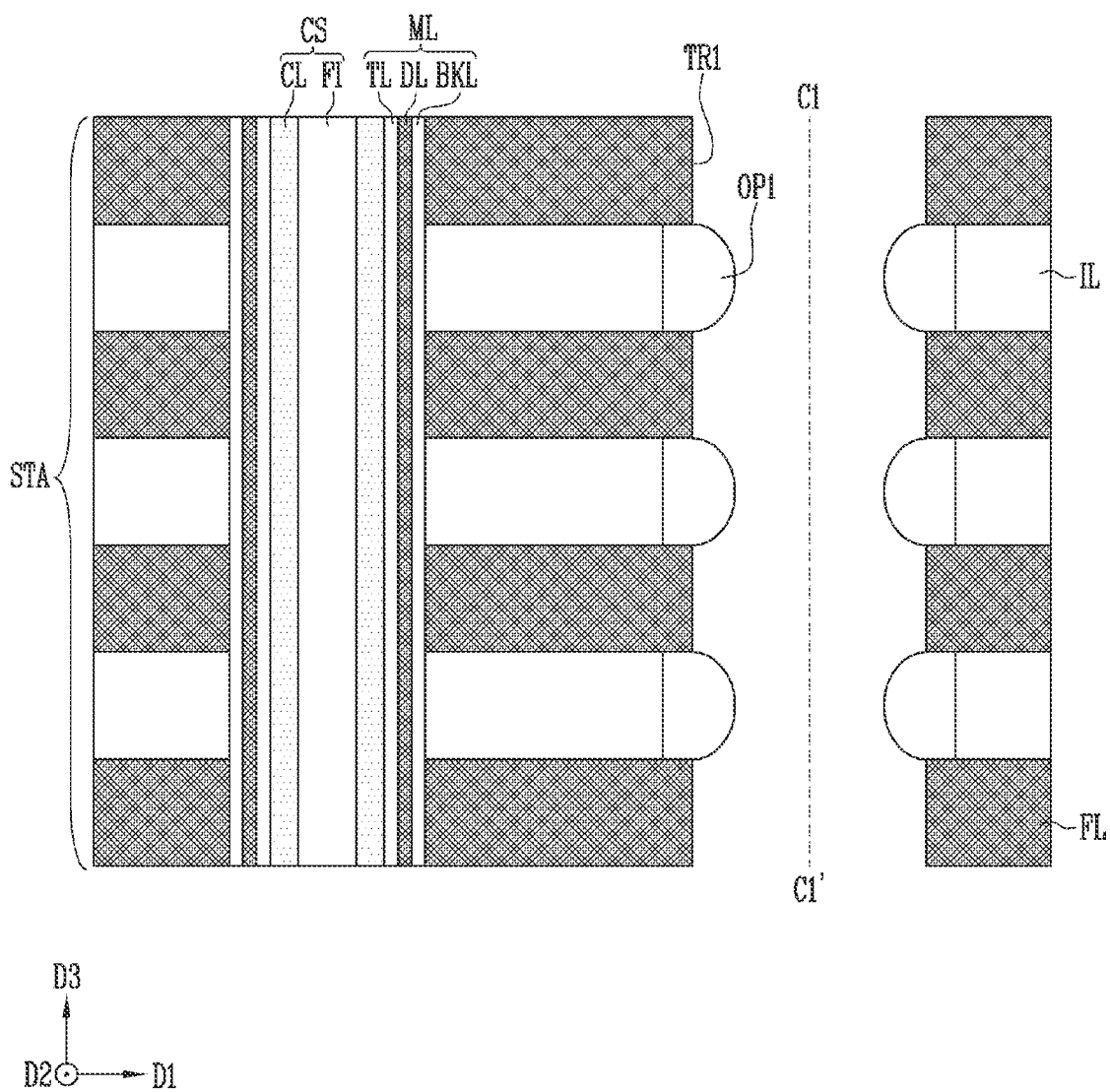

Referring to FIG. 2H, first oxidation patterns OP1 may be formed by oxidizing the first seed patterns SD1 and the first preliminary oxidation patterns EP1. The first seed patterns SD1 and the first preliminary oxidation patterns EP1 may be oxidized through an oxidation process. In an example, the oxidation process includes supplying an oxygen gas into the first trench TR1.

A volume of the first oxidation pattern OP1 may be larger than the sum of volumes of the first seed patterns SD1 and the first preliminary oxidation patterns EP1. While the first seed patterns SD1 and the first preliminary oxidation patterns EP1 are being oxidized, the volumes of the first seed patterns SD1 and the first preliminary oxidation patterns EP1 may become large. The first oxidation patterns OP1 may be disposed closer to the center of the first trench TR1 than the first preliminary oxidation patterns EP1. A shortest distance between the first oxidation pattern OP1 and the first central line C1-C1' of the first trench TR1 may be smaller than a shortest distance between the first preliminary oxidation pattern EP1 and the first central line C1-C1' of the first trench TR1. A surface of the first oxidation pattern OP1, which faces the center of the first trench TR1, may be curved.

Figure 2I:
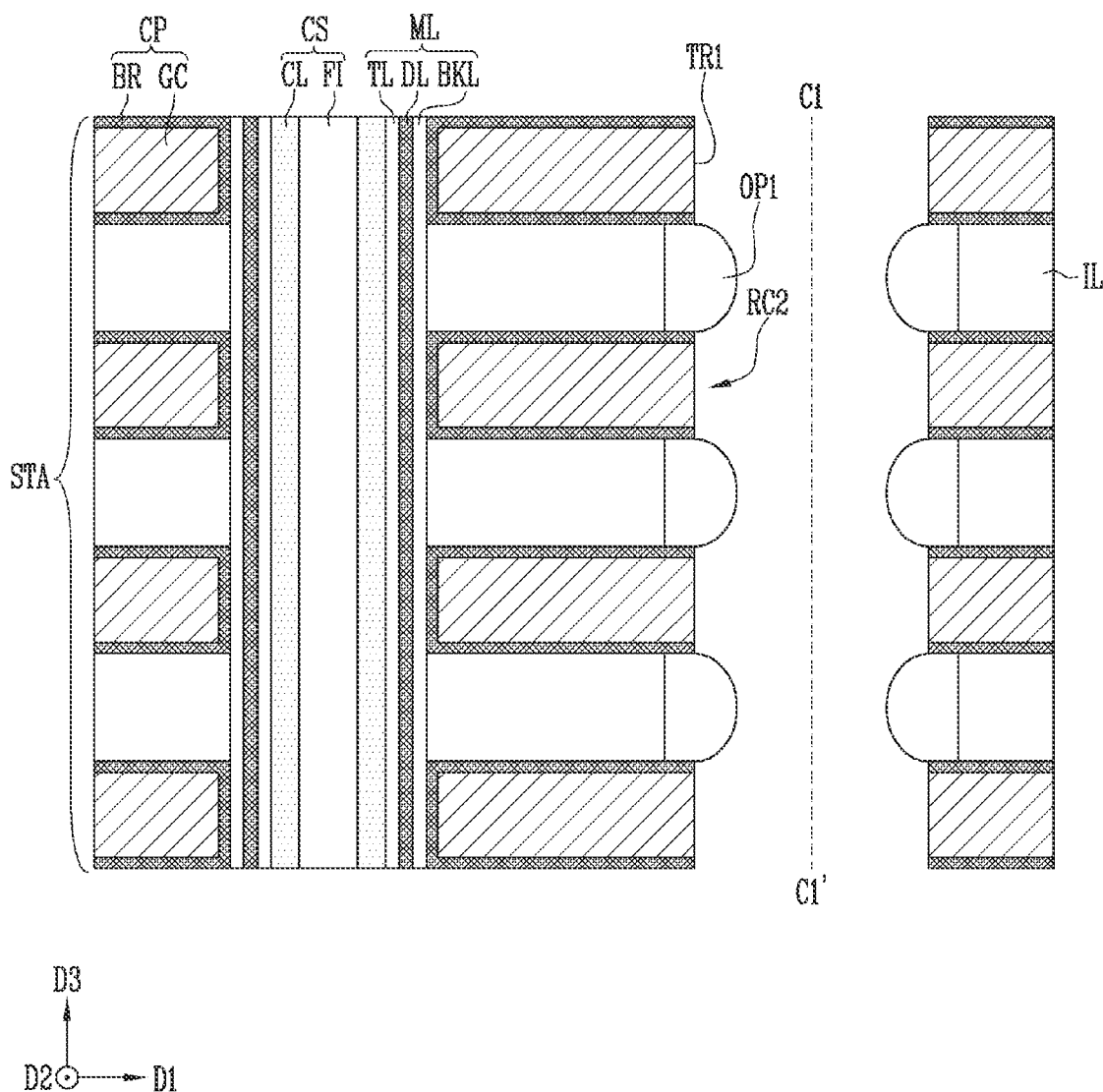

Referring to FIG. 2I, the sacrificial layers FL may be replaced with conductive patterns CP. The replacing of the sacrificial layers FL with the conductive patterns CP may include removing the sacrificial layers FL through the first trench TR1 and forming the conductive patterns CP in empty spaces formed by removing the sacrificial layers FL.

A space between the first oxidation patterns OP1 adjacent to each other in the third direction D3 may be defined as a second recess RC2. The second recess RC2 may be defined by a sidewall of the conductive pattern CP and two first oxidation patterns OP1.

Figure 2J:
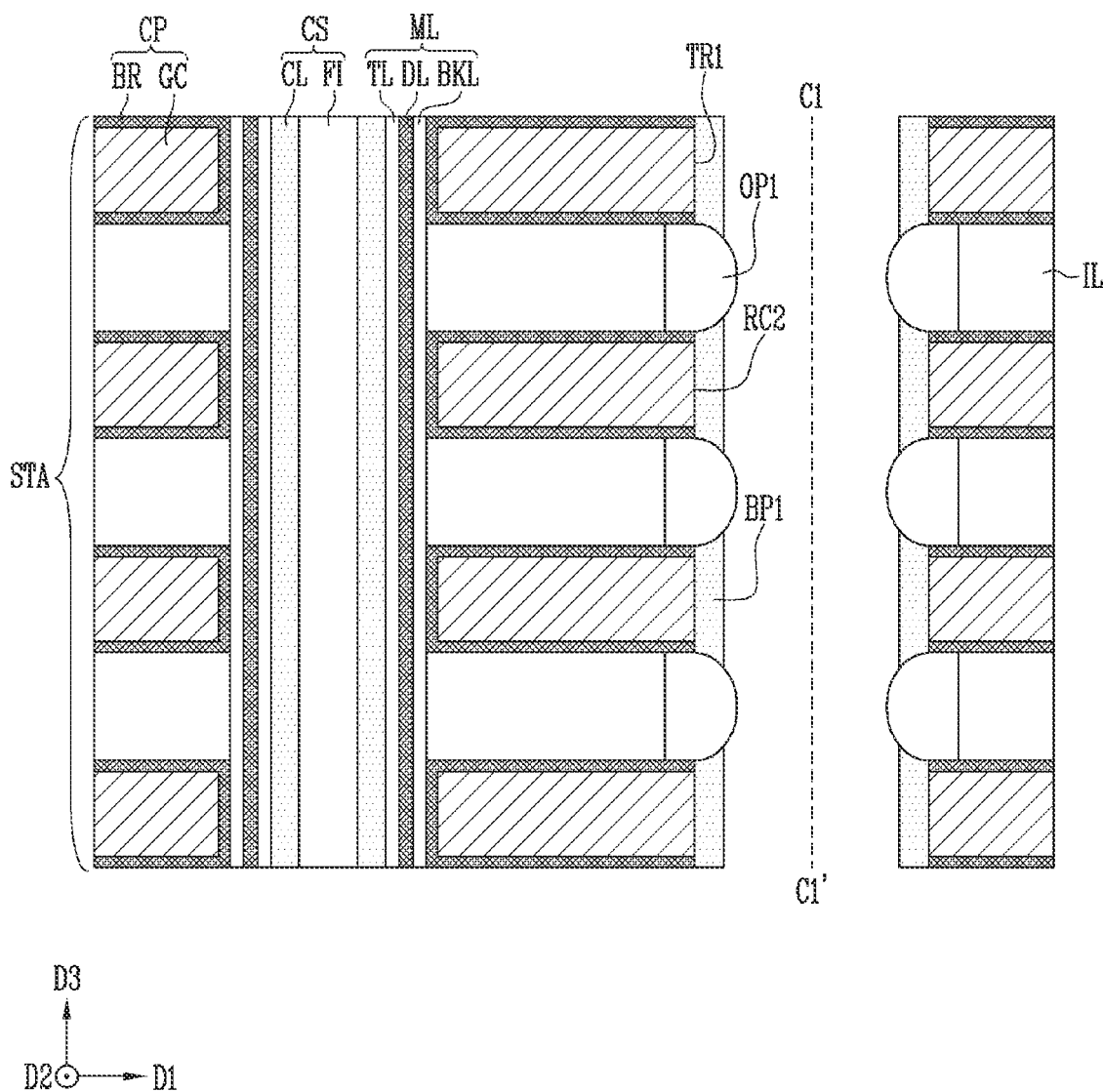

Referring to FIG. 2J, first buffer patterns BP1 may be formed in the second recesses RC2. The forming of the first buffer patterns BP1 may include forming a first buffer layer filling at least a portion of the first trench TR1 and isolating the first buffer layer into the first buffer patterns BP1 by etching the first buffer layer. A surface of the first buffer pattern BP1, which is contact with the first oxidation pattern OP1, may be curved corresponding to the curved surface of the first oxidation pattern OP1. A width of the first buffer pattern BP1 in the third direction D3 might not be constant. The width of the first buffer pattern BP1 in the third direction D3 may become larger as being closer to the center of the first trench TR1. A width of a sidewall of the first buffer pattern BP1, which faces the center of the first trench TR1, in the third direction D3 may be larger than a width of a sidewall of the first buffer pattern BP1, which is in contact with the conductive pattern CP, in the third direction D3.

The first buffer pattern BP1 may be provided between two first oxidation patterns OP1 adjacent to each other in the third direction D3. The first buffer pattern BP1 may be formed on the sidewall of the conductive pattern CP. The first buffer pattern BP1 may be disposed more distant from the center of the first trench TR1 than the first oxidation pattern OP1. A shortest distance between the sidewall of the first buffer pattern BP1, which is exposed between the first oxidation patterns OP1, and the first central line C1-C1' of the first trench TR1 may be larger than a shortest distance between the first oxidation pattern OP and the first central line C1-C1' of the first trench TR1.

The first buffer patterns BP1 may include a material which can be oxidized through an oxidation process. In an example, the first buffer patterns BP1 may include poly-silicon. In another example, the first buffer patterns BP1 may include nitride. The nitride which the first buffer patterns BP1 include may be silicon nitride.

Figure 2K:
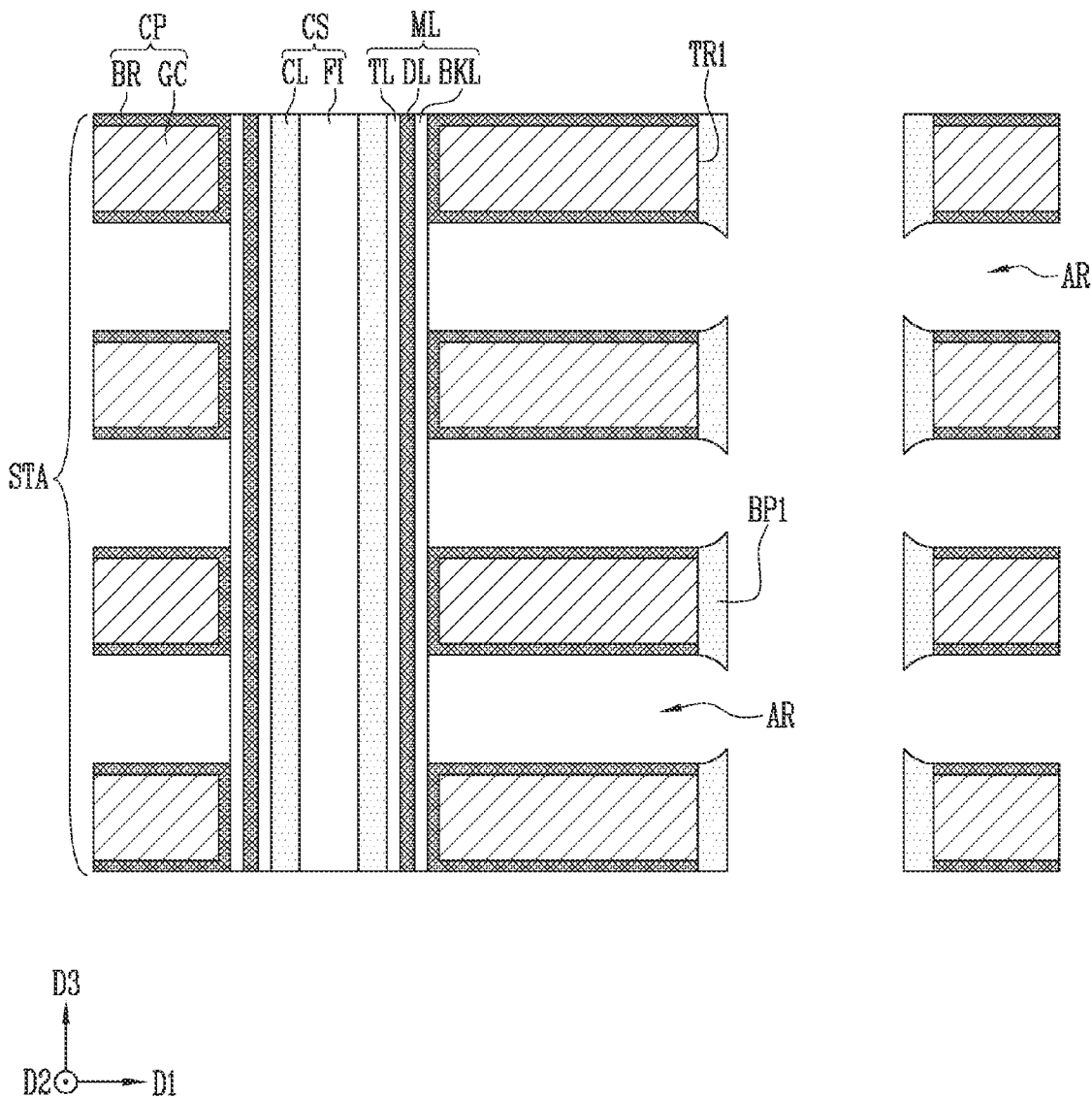

Referring to FIG. 2K, the first oxidation patterns OP1 and the insulating layers IL may be removed. The first oxidation patterns OP1 and the insulating layers IL may be selectively removed by using an etching material capable of selectively etching oxide.

Empty spaces in which the first oxidation patterns OP1 and the insulating layers IL are removed may be defined as air gaps AR. The air gaps AR may be connected to the first trench TR1. The air gap may be provided between two conductive patterns CP adjacent to each other in the third direction D3. A portion of the blocking layer BKL of the memory layer ML may be exposed by the air gap AR.

Figure 2L:
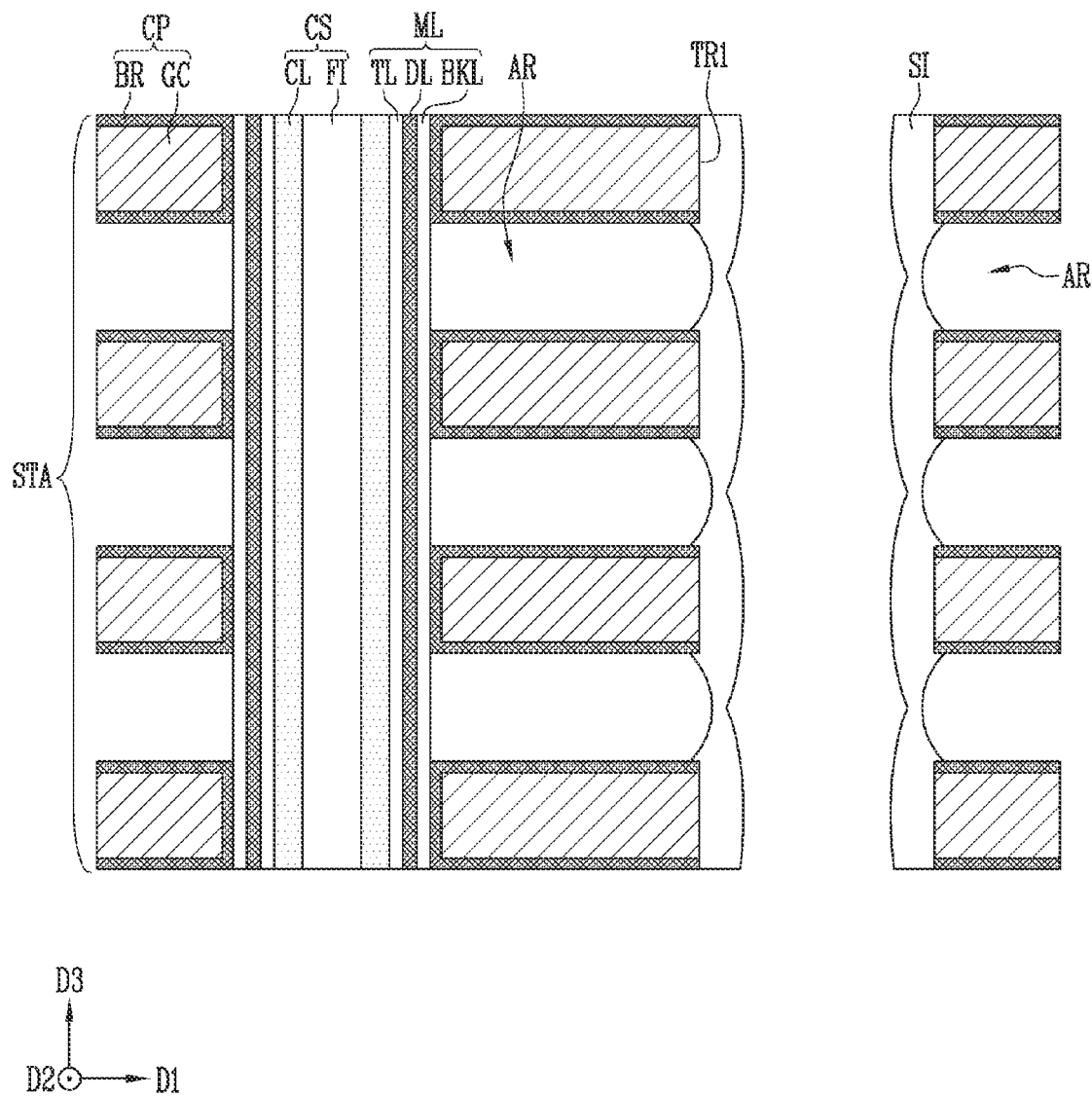

Referring to FIG. 2L, the first buffer patterns BP1 may be oxidized. While the first buffer patterns BP1 are being oxidized, a volume of the first buffer patterns BP1 may become large. The first buffer patterns BP1 adjacent to each other in the third direction D3 may be connected to each other in the third direction D3 as the volume of the first buffer patterns BP1 becomes large while being oxidized. A slit insulating layer SI may be formed while the first buffer patterns BP1 are connected to each other while being oxidized. Since a width of the first buffer pattern BP1 in the third direction D3 becomes larger as being closer to the center of the first trench TR1, first and second sidewalls SW1 and SW2 of a second interposition part IN2 of the slit insulating layer SI may be asymmetrically formed (see FIG. 1C).

The first buffer patterns BP1 may be oxidized through an oxidation process. In an example, when the first buffer patterns BP1 include poly-silicon, the first buffer patterns BP1 may be oxidized through a dry oxidation process using an oxygen gas, a wet oxidation process using water, or a radical oxidation process. In another example, when the first buffer patterns BP1 include nitride, the first buffer patterns BP1 may be oxidized through a radical oxidation process.

When the slit insulating layer SI is formed, the air gaps AR and the first trench TR1 may be isolated from each other. The air gaps AR may be sealed by the slit insulating layer SI. When the slit insulating layer SI is formed by expanding the volume of the first buffer pattern BP1 formed on the sidewall of the conductive pattern CP, a width of the slit insulating layer SI may become smallest at a portion at which the slit insulating layer SI located at the same level as the air gaps AR. Subsequently, a source contact SC (see FIG. 1B) may be formed between two slit insulating layers SI.

In the manufacturing method of the semiconductor device in accordance with the present disclosure, the first oxidation patterns OP1 may be formed between the conductive patterns CP, and the first buffer patterns BP1 may be formed between the first oxidation patterns OP1. Subsequently, the slit insulating layer SI may be formed by oxidizing the first buffer patterns BP1, and the air gaps AR may be formed between the conductive patterns CP.

The semiconductor device is manufactured through the above-described processes, so that the width of the slit insulating layer SI can become smallest at the same level as the central level of the air gap AR. Accordingly, the volume of the air gap can be formed to become relatively large, and parasitic capacitance between the conductive patterns CP can be minimized.

FIGS. 3A, 3B, and 3C are sectional views illustrating a manufacturing method of the semiconductor device shown in FIGS. 1A to 1C.

For convenience of description, components identical to those described with reference to FIGS. 1A to 1C are designated by like reference numerals, and their overlapping descriptions will be omitted.

A manufacturing method described below is merely one embodiment of the manufacturing method of the semiconductor device shown in FIGS. 1A to 1C, and the manufacturing method of the semiconductor device shown in FIGS. 1A to 1C might not be limited to that described below.

Referring to FIG. 3A, similarly to as described in FIGS. 2A to 2D, a stack structure STA including sacrificial layers FL and insulating layers IL, a channel structure CS, a memory layer ML, and a first trench TR1 may be formed.

Subsequently, second oxidation patterns OP2 may be formed on sidewalls of the insulating layers IL, which are exposed through the first trench TR1. The second oxidation patterns OP2 may be selectively formed on the sidewalls of the insulating layers IL. The second oxidation patterns OP2 may be formed through a selective oxide deposition process. The second oxidation patterns OP2 may be spaced apart from each other in the third direction D3. A surface of the second oxidation pattern OP2, which faces the center of the first trench TR1, may be curved.

The second oxidation patterns OP2 may be formed in the first trench TR1. The second oxidation patterns OP2 may be disposed closer to the center of the first trench TR1 than the sacrificial layers FL. The second oxidation patterns OP2 may include the same material as the insulating layer IL. In an example, the second oxidation patterns OP2 may include oxide.

Referring to FIG. 3B, the sacrificial layers FL may be replaced with conductive patterns CP. A space between two second oxidation patterns OP2 adjacent to each other in the third direction D3 may be defined as a third recess RC3. The third recess RC3 may be defined by a sidewall of the conductive pattern CP and two second oxidation patterns OP2.

Referring to FIG. 3C, second buffer patterns BP2 may be formed in the third recesses RC3. The second buffer patterns BP2 may be formed between the second oxidation patterns OP2. The second buffer patterns BP2 may be similar to the first buffer patterns BP1 described in FIGS. 2J to 2K.

Subsequently, similarly to as described in FIGS. 2K and 2L, the second buffer patterns BP2 may be oxidized after the second oxidation patterns OP2 and the insulating layers IL are removed. When the second buffer patterns BP2 are oxidized, a slit insulating layer SI (see FIG. 1B) may be formed, and air gaps AR (see FIG. 1B) may be formed, which are sealed by the slit insulating layer SI. Subsequently, a source contact SC (see FIG. 1B) may be formed between the slit insulating layers SI.

FIGS. 4A, 4B, 4C, 4D, and 4E are sectional views illustrating a manufacturing method of the semiconductor device shown in FIGS. 1A to 1C.

For convenience of description, components identical to those described with reference to FIGS. 1A to 1C are designated by like reference numerals, and their overlapping descriptions will be omitted.

A manufacturing method described below is merely one embodiment of the manufacturing method of the semiconductor device shown in FIGS. 1A to 1C, and the manufacturing method of the semiconductor device shown in FIGS. 1A to 1C might not be limited to that described below.

Figure 4A:
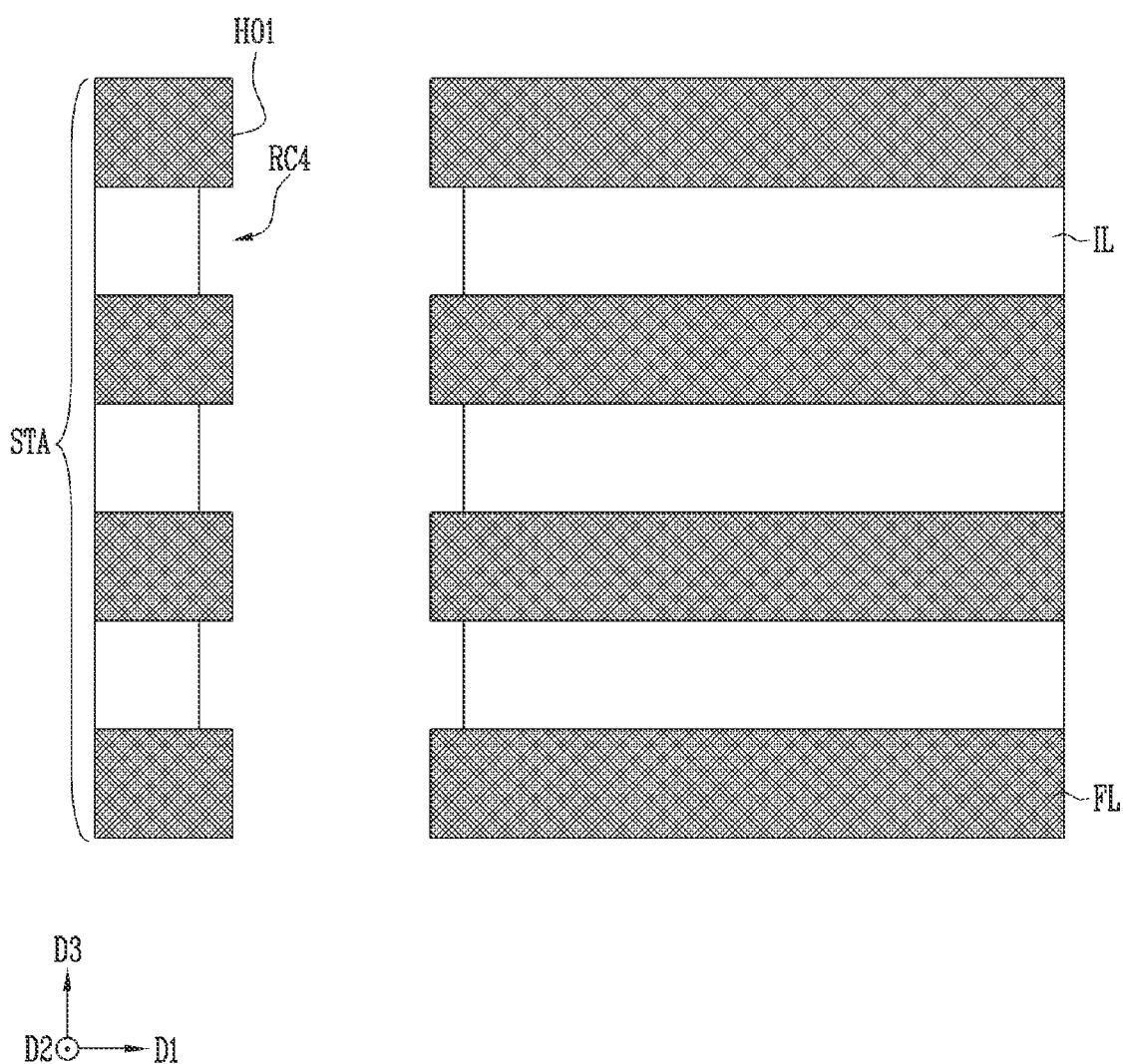

Referring to FIG. 4A, similarly to as described in FIGS. 2A and 2B, a stack structure STA may be formed, which includes sacrificial layers FL and insulating layers IL, and a first hole HO1 may be formed, which penetrates the stack structure STA.

Subsequently, the insulating layers IL may be selectively etched through the first hole HO1. Sidewalls of the insulating layers IL, which are exposed through the first hole HO1, may be etched. When the insulating layers IL are etched, a portion of each of the insulating layers IL may be removed. When the portion of each of the insulating layers IL is removed, fourth recesses RC4 may be formed. The fourth recess RC4 may be defined by the etched sidewall of the insulating layer IL, a bottom surface of one sacrificial layer FL, and a top surface of another sacrificial layer FL. The fourth recess RC4 may be disposed between two sacrificial layers FL adjacent to each other in the third direction D3. The fourth recesses RC4 may be connected to the first hole HO1.

Figure 4B:
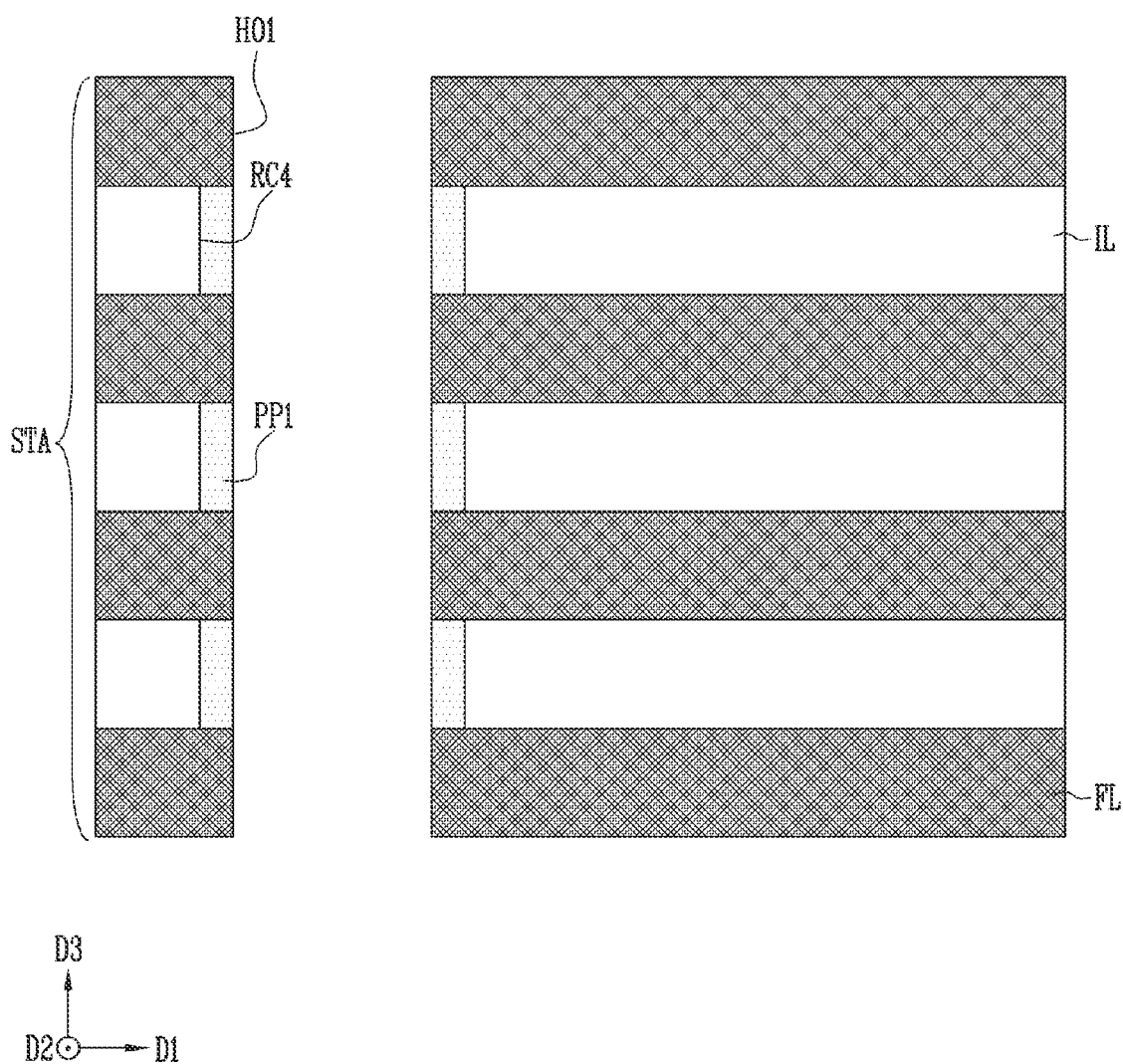

Referring to FIG. 4B, first protective patterns PP1 may be formed in the fourth recesses RC4. The forming of the first protective patterns PP1 may include forming a first protective layer by filling the fourth recesses RC4 and at least a portion of the first hole HO1 and isolating the first protective layer into the first protective patterns PP1 by etching the first protective layer. The first protective pattern PP1 may be disposed between two sacrificial layers FL adjacent to each other in the third direction D3.

The first protective patterns PP1 may include a material having an etch selectivity with respect to the sacrificial layers FL and the insulating layers IL. In an example, the first protective patterns PP1 may include poly-silicon. A sidewall of the first protective pattern PP1, which is exposed through the first hole HO1, may form a common surface with a sidewall of the sacrificial layer FL.

Figure 4C:
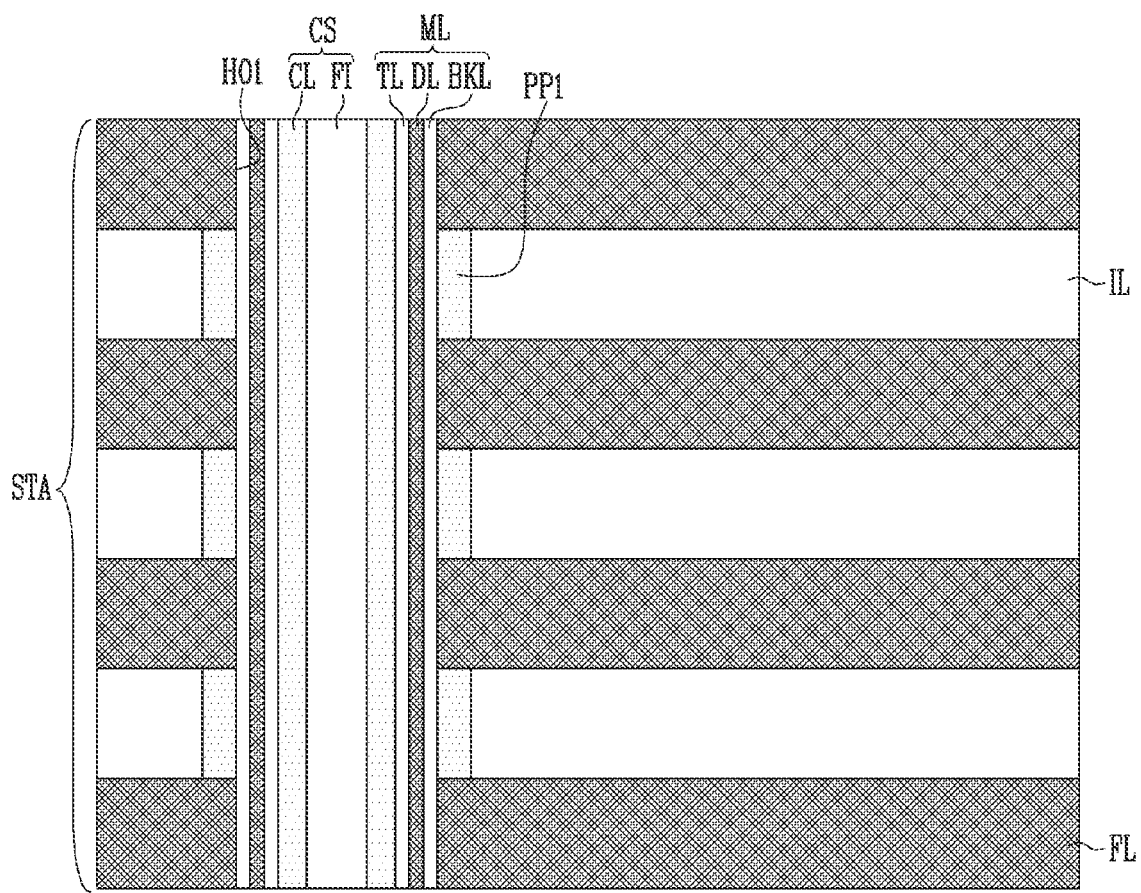

Referring to FIG. 4C, a memory layer ML and a channel structure CS may be formed in the first hole HO1. The forming of the memory layer ML and the channel structure CS in the first hole HO1 may include sequentially forming, in the first hole HO1, a blocking layer BKL, a data storage layer DL, a tunnel insulating layer IL, a channel layer CL, and a filling layer FI.

The blocking layer BKL of the memory layer ML may be in contact with the first protective patterns PP1. The blocking layer BKL of the memory layer ML may be spaced apart from the insulating layers IL by the first protective patterns PP1.

Figure 4D:
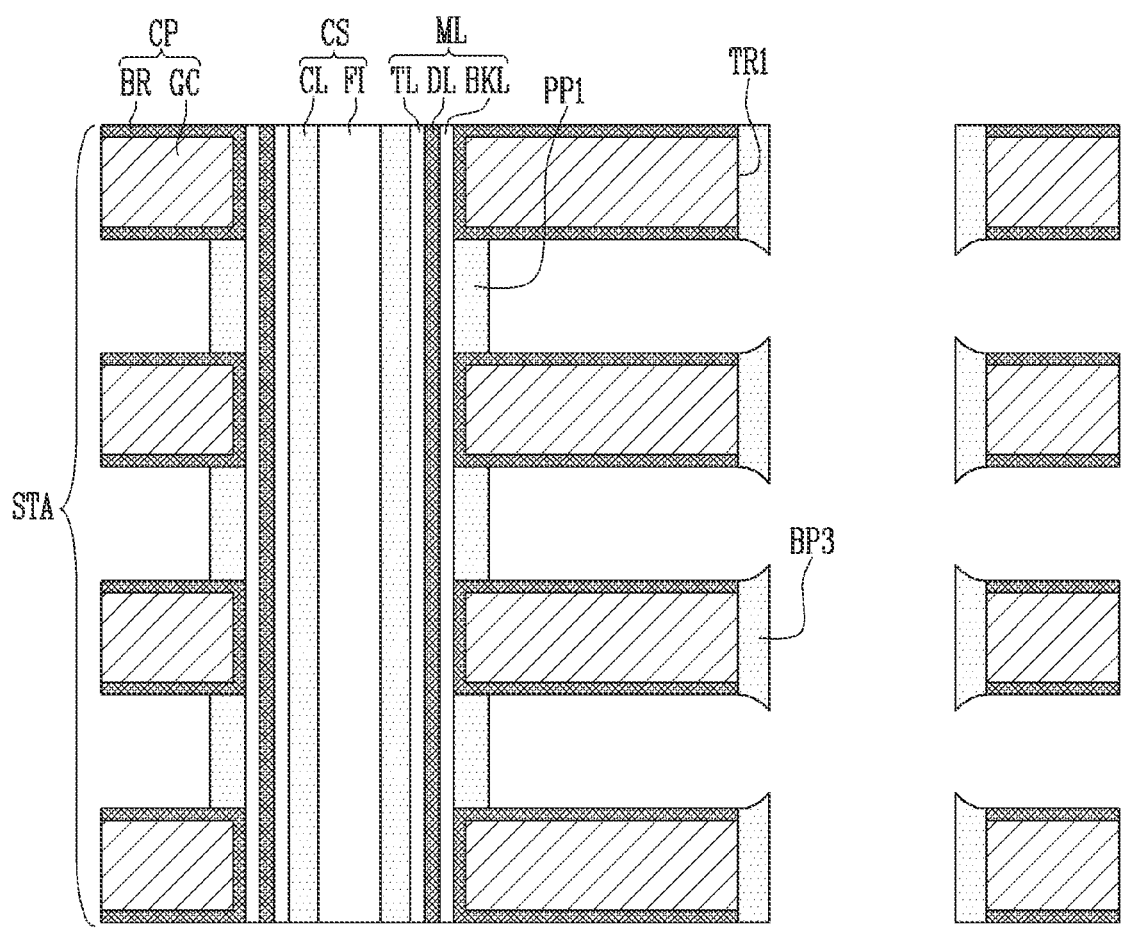

Referring to FIG. 4D, the sacrificial layers FL may be replaced with conductive patterns CP, third buffer patterns BP3 may be formed on sidewalls of the conductive patterns CP, and the insulating layers IL may be removed. The third buffer patterns BP3 may be similar to the first buffer patterns BP1 described in FIGS. 2J to 2L.

In an embodiment, similarly to as described in FIGS. 2D to 2K, the conductive patterns CP and the third buffer patterns BP3 may be formed, and the insulating layers IL may be removed. In another embodiment, similarly to as described in FIGS. 3A to 3C, the conductive patterns CP and the third buffer patterns BP3 may be formed, and the insulating layers IL may be removed.

When the insulating layers IL are removed, the first protective patterns PP1 may be exposed. Since the first protective patterns PP1 include a material having an etch selectivity with respect to the insulating layers IL, the first protective patterns PP1 might not be removed in the process of removing the insulating layers IL. The memory layer ML may be protected by the first protective patterns PP1 in the process of removing the insulating layers IL.

Figure 4E:
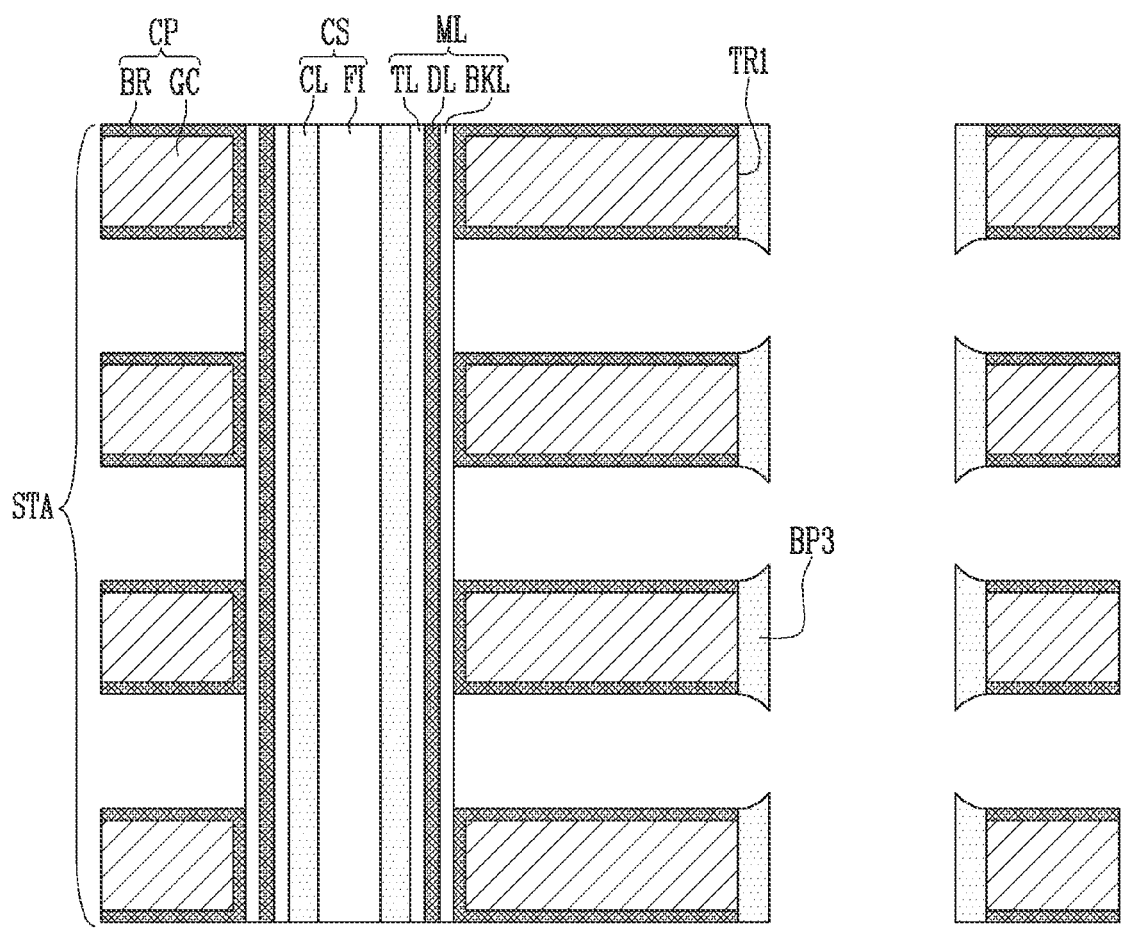

Referring to FIG. 4E, the blocking layer BKL of the memory layer ML may be exposed by removing the first protective patterns PP1. Subsequently, similarly to as described in FIG. 2L, the third buffer patterns BP3 may be oxidized. When the third buffer patterns BP3 are oxidized, a slit insulating layer SI (see FIG. 1B) may be formed, and air gaps AR (see FIG. 1B) may be formed, which are sealed by the slit insulating layer SI. Subsequently, a source contact SC (see FIG. 1B) may be formed between the slit insulating layers SI.

In the manufacturing method of the semiconductor device in accordance with the embodiment of the present disclosure, the first protective pattern PP1 is formed, which protects the blocking layer BKL of the memory layer, so that the blocking layer BKL can be protected in the process of removing the insulating layer IL.

FIG. 5A is a sectional view of a semiconductor device in accordance with an embodiment of the present disclosure. FIG. 5B is an enlarged view of region D shown in FIG. 5A.

The semiconductor device shown in FIGS. 5A and 5B may be similar to the semiconductor device shown in FIGS. 1A to 1C, except portions described below.

Referring to FIGS. 5A and 5B, the semiconductor device may include a stack structure STA including conductive patterns CP, a channel structure CS, a memory layer ML, and a slit structure SLS. Air gaps AR may be defined by the memory layers ML, the conductive patterns CP, and the slit structure SLS. The slit structure SLS may include a source contact SC and slit insulating layers SI.

Each of the slit insulating layers SI may include first insulating parts IP1 and a second insulating part IP2. The first and second insulating parts IP1 and IP2 may include the same material, or include different materials. In an example, the first insulating parts IP1 may include oxide, and the second insulating part IP2 may include nitride. The first insulating parts IP1 may be spaced apart from each other in the third direction D3. The first insulating parts IP1 may be in contact with sidewalls of the conductive patterns CP, respectively. The first insulating parts IP1 may be spaced apart from the source contact SC. A bottom surface IP1B of the first insulating part IP1 may be a surface defining the air gap AR. A top surface IP1T of the first insulating part IP1 may be a surface defining the air gap AR. The top surface IP1T and the bottom surface IP1B of the first insulating part IP1 may be in contact with the air gap AR. The top surface IP1T and the bottom surface IP1B of the first insulating part IP1 may be curved.

The second insulating part IP2 may be in contact with a plurality of first insulating parts IP1. The second insulating part IP2 may connect the plurality of first insulating parts IP1 spaced apart from each other in the third direction D3. The second insulating part IP2 may include first parts IP2*a* and second parts IP2*b*. The first parts IP2*a* of the second insulating part IP2 may be parts in contact with the first insulating parts IP1. The second parts IP2*b* of the second insulating part IP2 may be parts connecting the first parts IP2*a* of the second insulating part IP2. The second parts IP2*b* of the second insulating part IP2 may be parts which are not in contact with the first insulating parts IP1. The first parts IP2*a* and the second parts IP2*b* of the second insulating part IP2 may be alternately arranged in the third direction D3.

Each of both sidewalls of the first part IP2*a* of the second insulating part IP2 may be in contact with the source contact SC or the first insulating part IP1. Each of both the sidewalls of the first part IP2*a* of the second insulating part IP2 may be curved. One sidewall of the second part IP2*b* of the second insulating part IP2 may be in contact with the source contact SC, and the other sidewall of the second part IP2*b* of the second insulating part IP2 may define the air gap AR. Each of both the sidewalls of the second part IP2*b* of the second insulating part IP2 may be curved. The second part IP2*b* of the second insulating part IP2 may be a part exposed by the air gap AR. The second part IP2*b* of the second insulating part IP2 may be a part disposed at a level equal to a central level of the air gap AR.

A largest width of the first insulating part IP1 in the first direction D1 may be larger than a largest width of the second insulating part IP2 in the first direction D1. A portion at which a width of the slit insulating layer SI in the first direction D1 is smallest may be the second part IP2*b* of the second insulating part IP2. The width of the slit insulating layer SI in the first direction D1 may be smallest at a level equal to the central level of the air gap AR.

FIGS. 6A, 6B, and 6C are sectional views illustrating a manufacturing method of the semiconductor device shown in FIGS. 5A and 5B.

For convenience of description, components identical to those described with reference to FIGS. 5A and 5B are designated by like reference numerals, and their overlapping descriptions will be omitted.

A manufacturing method described below is merely one embodiment of the manufacturing method of the semiconductor device shown in FIGS. 5A and 5B, and the manufacturing method of the semiconductor device shown in FIGS. 5A and 5B might not be limited to that described below.

Referring to FIG. 6A, a stack structure STA including conductive patterns CP, a memory layer ML, and a channel structure CS may be formed, and fourth buffer patterns BP4 may be formed on sidewalls of the conductive patterns CP. The process of forming the stack structure STA, the memory layer ML, the channel structure CS, and the fourth buffer patterns BP4 may be similar to that described in FIGS. 2A to 2L, 3A to 3C, or 4A to 4E.

Empty spaces defined between the conductive patterns CP adjacent to each other in the third direction D3 may be defined as air gaps AR. The air gaps AR may be connected to a first trench TR1.

Referring to FIG. 6B, the fourth buffer patterns BP4 may be oxidized. While the fourth buffer patterns BP4 are being oxidized, a volume of the fourth buffer patterns BP4 may become large. The oxidized fourth buffer patterns bP4 may be defined as first insulating parts IP1. The first insulating parts IP1 adjacent to each other in the third direction D3 may be spaced apart from each other in the third direction D3. The air gaps AR might not be sealed by the first insulating parts IP1. The air gaps AR may be connected to the first trench TR1 through spaces between the first insulating parts IP1.

Referring to FIG. 6C, a second insulating part IP2 connecting the first insulating parts IP1 may be formed. The forming of the second insulating part IP2 may include depositing a deposition material on the first insulating parts IP1. The deposition material may be selectively deposited, not to infiltrate into the air gaps AR. When the second insulating part IP2 is formed, the air gaps AR may be sealed. Subsequently, a source contact SC (see FIG. 5A) may be formed, which fills between the second insulating parts IP2.

In the manufacturing method of the semiconductor device in accordance with this embodiment, after the first insulating parts IP1 are formed by oxidizing the fourth buffer patterns BP4, the second insulating part IP2 may be formed by depositing the deposition material until the air gaps AR are sealed. Accordingly, the width of the second insulating part IP2 can be relatively small, and the width of the slit insulating layer SI can be smallest at a portion at which the second insulating part IP2 is located at a level equal to the central level of the air gap AR.

FIG. 7 is a sectional view of a semiconductor device in accordance with an embodiment of the present disclosure.

The semiconductor device shown in FIG. 7 may be similar to the semiconductor device shown in FIGS. 1A to 1C, except portions described below.

Referring to FIG. 7, the semiconductor device may include a stack structure STA including conductive patterns CP, a channel structure CS, a memory layer ML, and a slit structure SLS. Air gaps AR may be defined by the memory layers ML, the conductive patterns CP, and the slit structure SLS. The slit structure SLS may include a source contact SC and slit insulating layers SI.

The semiconductor device may further include second protective patterns PP2. The second protective patterns PP2 may be spaced apart from each other in the third direction D3. The second protective patterns adjacent to each other in the third direction D3 may be spaced apart from each other in the third direction D3 with the air gap AR interposed therebetween. The second protective pattern PP2 may include a first part PP2a interposed between the conductive pattern CP and the memory layer ML and second parts PP2b interposed between the air gap AR and the memory layer ML. The first part PP2a of the second protective pattern PP2 may connect the second parts PP2b of the second protective pattern PP2. A width of the first part PP2a of the second protective pattern PP2 in the first direction D1 may be smaller than a width of the second part PP2b of the second protective pattern PP2 in the first direction D1. The second protective pattern PP2 may be in contact with the conductive pattern CP and a blocking layer BKL of the memory layer ML. The second protective pattern PP2 may be in contact with a sidewall, a top surface, and a bottom surface of the conductive pattern CP. The first part PP2a of the second protective pattern PP2 may be in contact with the sidewall of the conductive pattern CP and a sidewall of the blocking layer BKL of the memory layer ML. The second part PP2b of the second protective pattern PP2 may be in contact with the top surface and the bottom surface of the conductive pattern CP. The second part PP2b of the second protective pattern PP2 may include a surface defining the air gap AR. The second protective pattern PP2 may include the same material as the insulating layer IL (see FIG. 2A). In an example, the second protective pattern PP2 may include oxide.

FIGS. 8A, 8B, 8C, 8D, and 8E are sectional views illustrating a manufacturing method of the semiconductor device shown in FIG. 7.

For convenience of description, components identical to those described with reference to FIG. 7 are designated by like reference numerals, and their overlapping descriptions will be omitted.

A manufacturing method described below is merely one embodiment of the manufacturing method of the semiconductor device shown in FIG. 7, and the manufacturing method of the semiconductor device shown in FIG. 7 might not be limited to that described below.

Figure 8A:
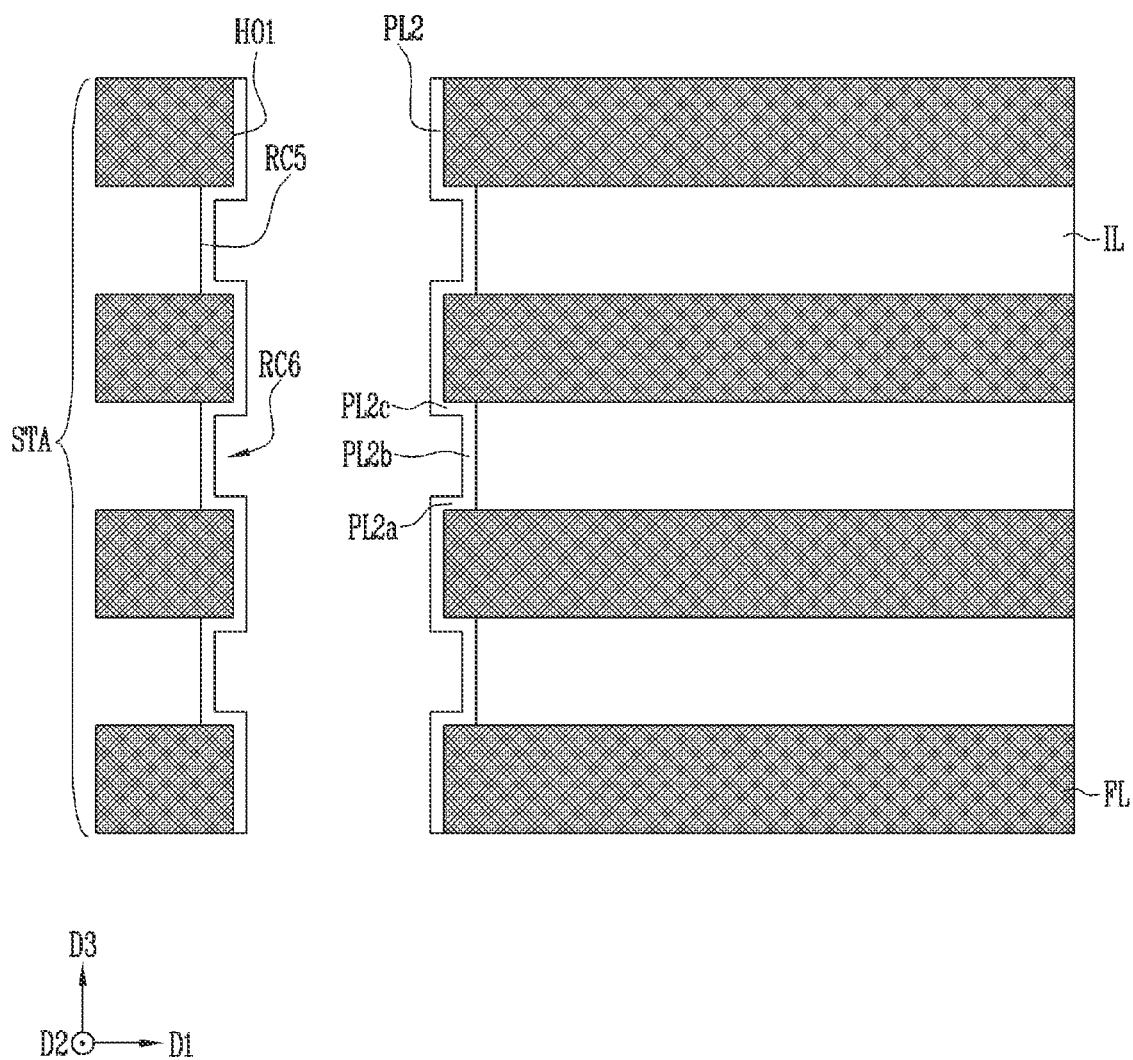

Referring to FIG. 8A, similarly to as described in FIGS. 2A and 2B, a stack structure STA may be formed, which includes sacrificial layers FL and insulating layers IL, and a first hole HO1 may be formed, which penetrates the stack structure STA.

Subsequently, the insulating layers IL may be selectively etched through the first hole HO1. Sidewalk of the insulating layers IL, which are exposed through the first hole HO1, may be etched. Fifth recesses RC5 may be formed by removing a portion of each of the insulating layers IL. The fifth recesses RC5 may be disposed between two sacrificial layers FL adjacent to each other in the third direction D3.

Subsequently, a second protective layer PL2 may be formed in the first hole HO1 and the fifth recesses RC5. The second protective layer PL2 may be conformally formed on surfaces of the sacrificial layers FL and the insulating layers IL, which define the first hole HO1 and the fifth recesses RC5. The second protective layer PL2 may cover a sidewall, a top surface, and a bottom surface of the sacrificial layer FL, and cover the sidewall of the insulating layer IL. A portion of the second protective layer PL2, which covers the top surface of the sacrificial layer FL, may be defined as a first part PL2a of the second protective layer PL2, a portion of the second protective layer PL2, which covers the sidewall of the insulating layer IL, may be defined as a second part PL2b of the second protective layer PL2, and a portion of the second protective layer PL2, which covers the bottom surface of the sacrificial layer FL, may be defined as a third part PL2c of the second protective layer PL2. The second protective layer PL2 may include the same material as the insulating layer IL. In an example, the second protective layer PL2 may include oxide, Sixth recesses RC6 may be defined by the second protective layer PL2. The sixth recess RC6 may be defined by the first to third parts PL2a, PL2b, and PL2c of the second protective layer PL2. The sixth recess RC6 may be defined between the first and third parts PL2a and PL2c of the second protective layer PL2.

Figure 8B:
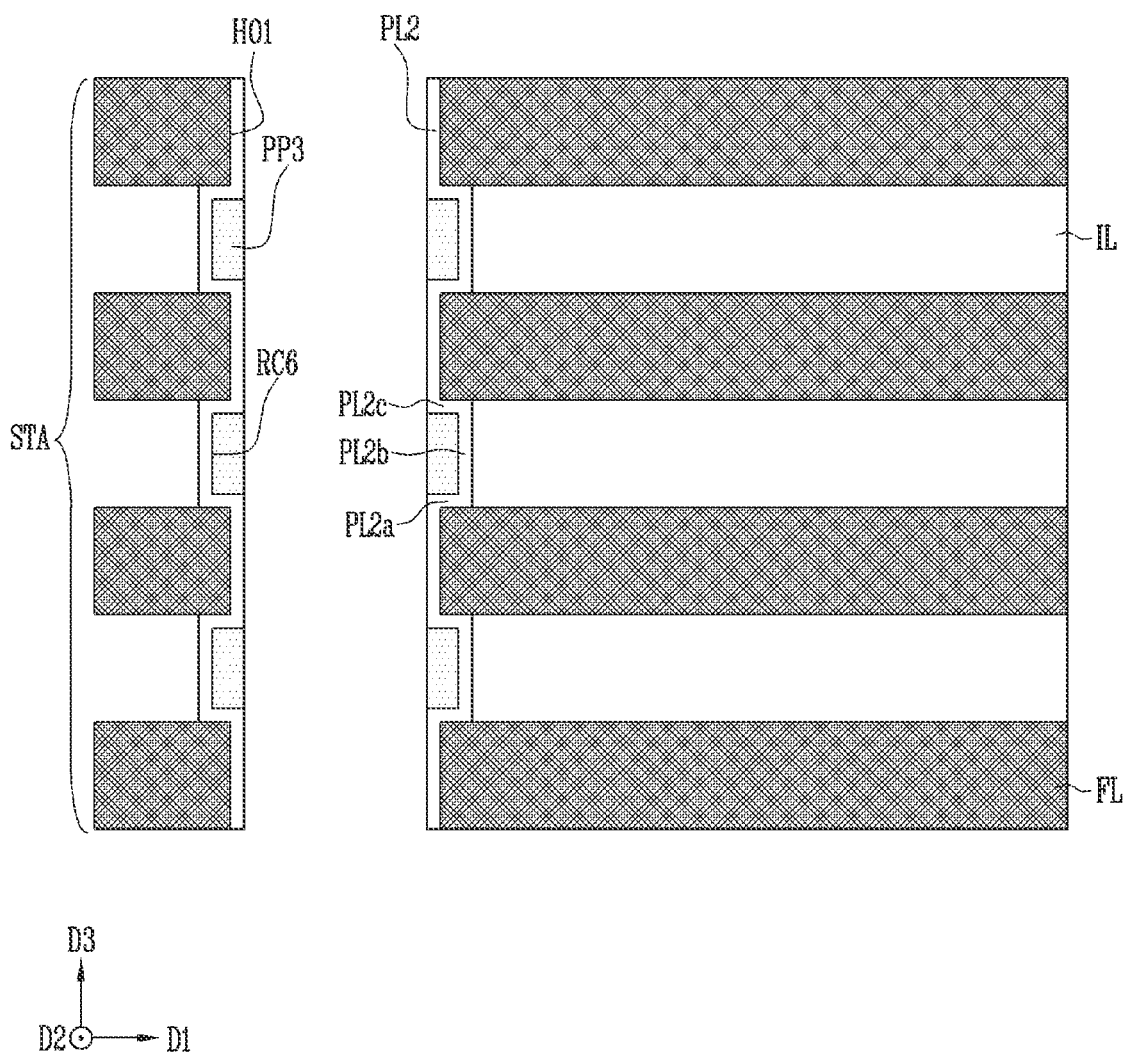

Referring to FIG. 8B, third protective patterns PP3 may be formed in the sixth recesses RC6. The forming of the third protective patterns PP3 may include forming a third protective layer filling at least a portion of the first hole HO1 and the sixth recesses RC6 and isolating the third protective layer into the third protective patterns PP3 by etching the third protective layer. The third protective pattern PP3 may be disposed between the first and third parts PL2a and PL2c of the second protective layer PL2. The third protective pattern PP3 may include a material having an etch selectivity with respect to the insulating layers IL and the second protective layer PL2. In an example, the third protective patterns PP3 may include a material having an etch selectivity with respect to oxide. In an example, the third protective patterns PP3 may include poly-silicon.

Figure 8C:
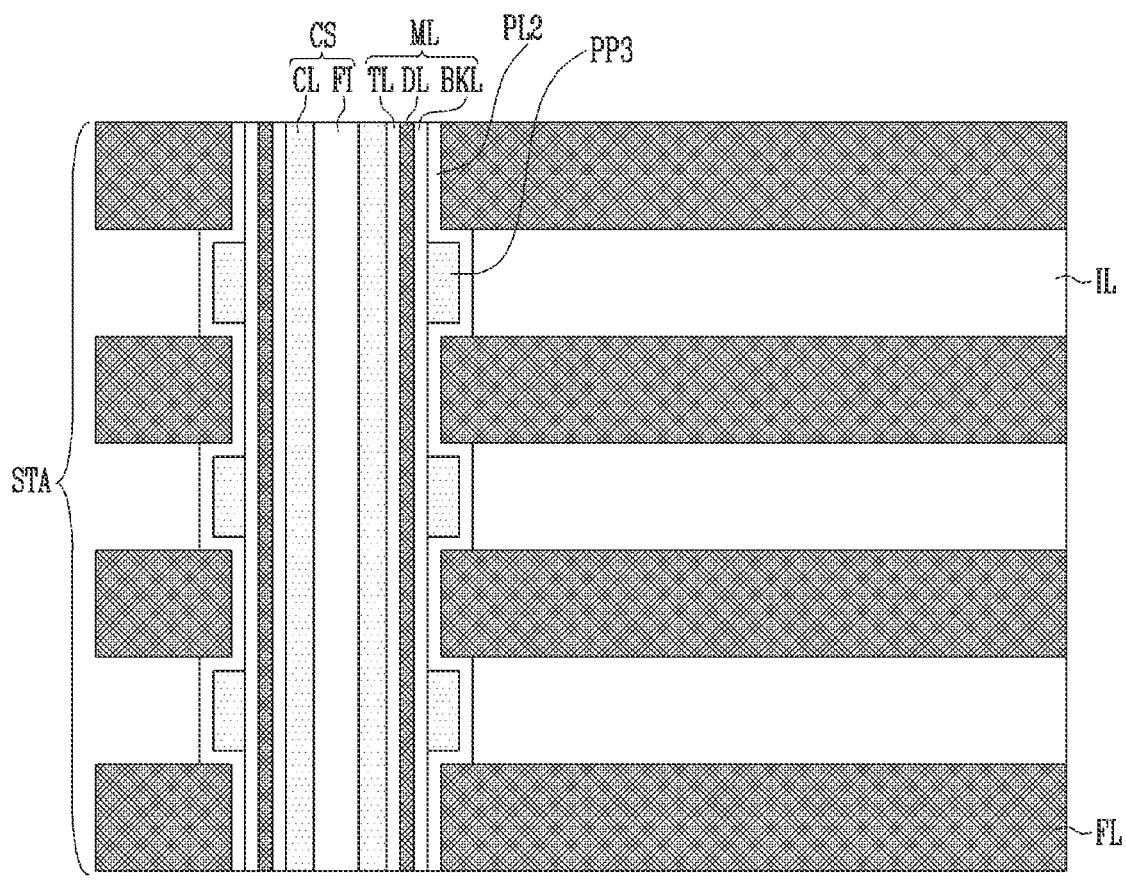

Referring to FIG. 8C, a memory layer ML and a channel structure CS may be formed in the first hole HO1. The forming of the memory layer ML and the channel structure CS in the first hole HO1 may include sequentially forming, in the first hole HO1, a blocking layer BKL, a data storage layer DL, a tunnel insulating layer TL, a channel layer CL, and a filling layer FI.

The blocking layer BKL of the memory layer ML may be in contact with the third protective patterns PP3 and the second protective layer PL2. The blocking layer BKL of the memory layer ML may be spaced apart from the insulating layers IL by the third protective patterns PP3 and the second protective layer PL2.

Figure 8D:
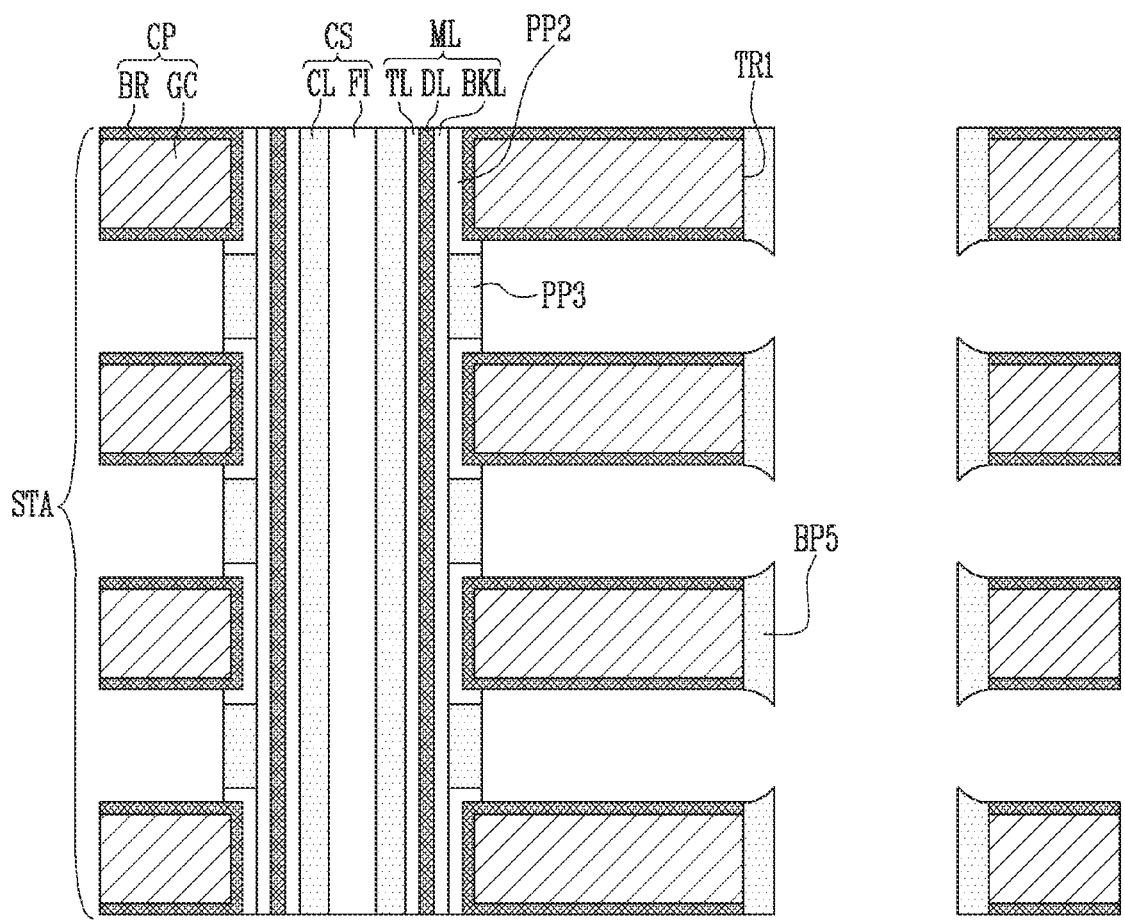

Referring to FIG. 8D, the sacrificial layers FL may be replaced with conductive patterns CP, fifth buffer patterns BP5 may be formed on sidewalls of the conductive patterns CP, and the insulating layers IL may be removed. The fifth buffer patterns BP5 may be similar to the first buffer patterns BP1 described in FIGS. 2J to 2K.

In an embodiment, similarly to as described in FIGS. 2D to 2K, the conductive patterns CP and the fifth buffer patterns BP5 may be formed, and the insulating layers IL may be removed. In another embodiment, similarly to as described in FIGS. 3A to 3C, the conductive patterns CP and the fifth buffer patterns BP5 may be formed, and the insulating layers IL may be removed.

Since the second protective layer PL2 includes the same material as the insulating layer IL, a portion of the second protective layer PL2 may be removed together with the insulating layer IL. When the second parts PL2b of the second protective layer PL2 are removed, the second protective layer PL2 may be isolated into second protective patterns PP2. The second protective patterns PP2 may be arranged to be spaced apart from each other in the third direction D3 with the third protective patterns interposed therebetween. When the second parts PL2b of the second protective layer PL2 are removed, the third protective patterns PP3 may be exposed. Since the third protective patterns PP3 include a material having an etch selectivity with respect to the insulating layers IL, the third protective patterns PP3 might not be removed in the process of removing the insulating layers IL. The memory layer ML may be protected by the third protective patterns PP3 in the process of removing the insulating layers IL.

Figure 8E:
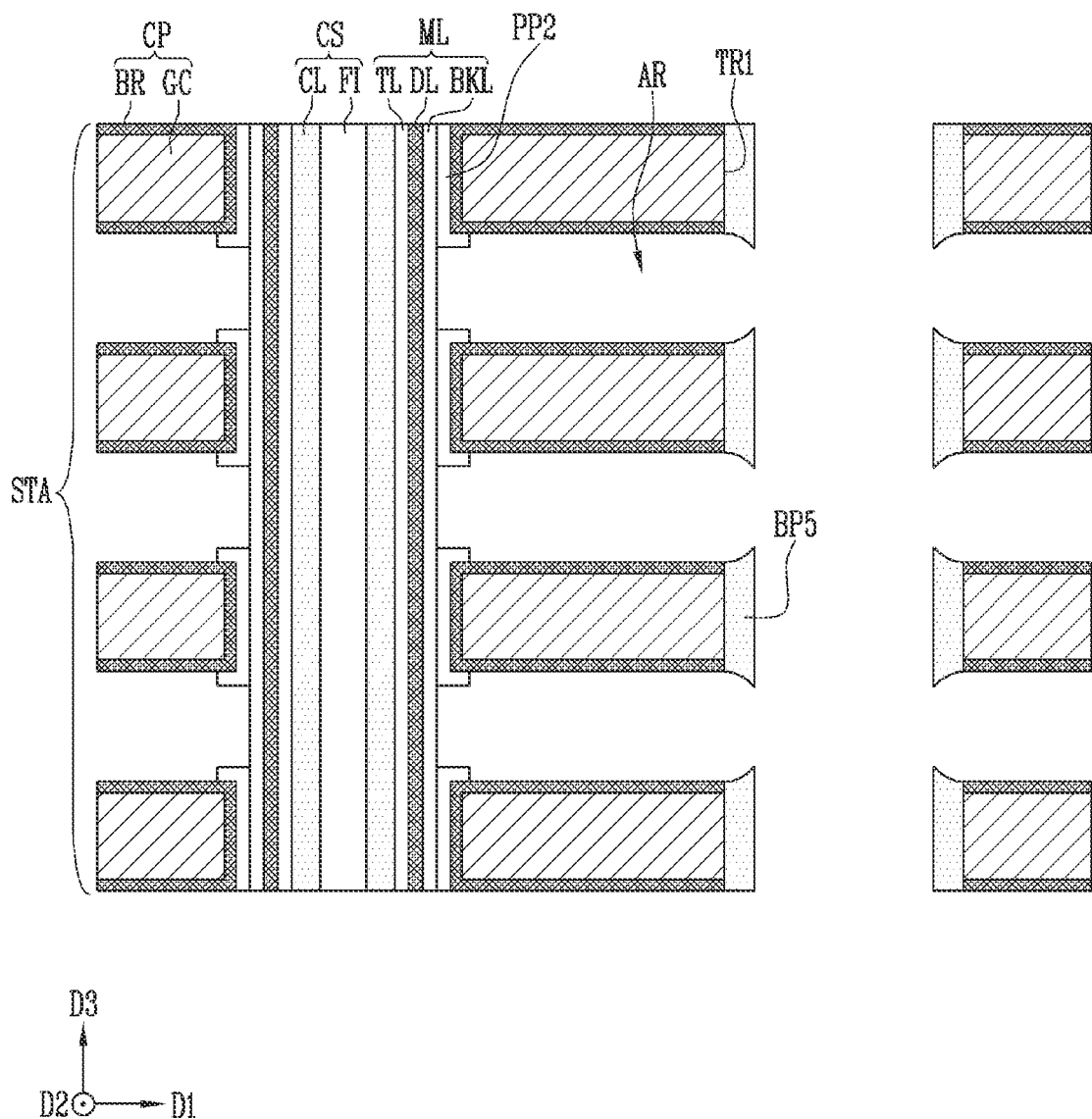

Referring to FIG. 8E, the blocking layer BKL of the memory layer ML may be exposed by removing the third protective patterns PP3. Subsequently, the fifth buffer patterns BP5 may be oxidized. When the fifth buffer patterns BP5 are oxidized, a slit insulating layer SI (see FIG. 7) may be formed, similarly to as described in FIG. 2L or FIGS. 6B and 6C. Air gaps AR (see FIG. 7) sealed by the slit insulating layer SI may be formed. Subsequently, a source contact SC (see FIG. 7) may be formed between the slit insulating layers SI.

In the manufacturing method of the semiconductor device in accordance with the embodiment of the present disclosure, the blocking layer BKL of the memory layer ML can be protected by the second and third protective patterns PP2 and PP3 which protect the blocking layer BKL of the memory layer ML in the process of removing the insulating layer IL.

FIG. 9 is a sectional view of a semiconductor device in accordance with an embodiment of the present disclosure.

The semiconductor device shown in FIG. 9 may be similar to the semiconductor device shown in FIGS. 1A to 1C. except portions described below.

Referring to FIG. 9, the semiconductor device may include a stack structure STA including conductive patterns CP, a channel structure CS, a memory layer ML, and a slit structure SLS. Air gaps AR may be defined by the memory layers ML, the conductive patterns CP, and the slit structure SLS. The slit structure SLS may include a source contact SC and slit insulating layers SI.

Each of the slit insulating layers SI may include third interposition parts IN3 and fourth interposition parts IN4. The third interposition part IN3 may be a part disposed between the conductive pattern CP and the source contact SC. The third interposition part IN3 may be a part disposed at the same level as the conductive pattern CP. The fourth interposition part IN4 may be a part disposed between the air gap AR and the source contact SC. The fourth interposition part IN4 may be a part disposed at the same level as the air gap AR. The third interposition parts IN3 and the fourth interposition parts IN4 may be alternately arranged along the third direction D3.

A width of the third interposition part IN3 in the first direction D1 may be changed according to a level. The width of the third interposition part IN3 in the first direction D1 may become smallest at a lowermost portion and an uppermost portion of the third interposition part IN3. The width of the third interposition part IN3 in the first direction D1 may become smallest at a portion at which the third interposition part IN3 is in contact with the fourth interposition part IN4. The width of the third interposition part IN3 in the first direction D1 may become largest at a central level of the third interposition part IN3. In other words, the width of the third interposition part IN3 in the first direction D1 may become largest at a level equal to a central level of the conductive pattern CP in contact with the third interposition part IN3. The width of the third interposition part IN3 in the first direction D1 may become smaller as being closer to the uppermost portion or the lowermost portion of the third interposition part IN3 at the central level of the third interposition part IN3.

A width of the fourth interposition part IN4 in the first direction D1 may be changed according to a level. The width of the fourth interposition part IN4 in the first direction D1 may be equal to a distance between the air gap AR and the source contact SC in the first direction D1. The width of the fourth interposition part IN4 in the first direction D1 may become smallest at a central level of the fourth interposition part IN4. In other words, the width of the fourth interposition part IN4 in the first direction D1 may become largest at a level equal to a central level of the air gap AR defined by the fourth interposition part IN4. A smallest width of the fourth interposition part IN4 may be smaller than a smallest width of the third interposition part IN3. A smallest width of the fourth interposition part IN4 in the first direction D1 may be smaller than a smallest width of the third interposition part IN3 in the first direction D1. A width of the slit insulating layer SI in the first direction D1 may become smallest at a level equal to the central level of the air gap AR.

The width of the fourth interposition part IN4 in the first direction D1 may become largest at a lowermost portion and an uppermost portion of the fourth interposition part IN4. The width of the fourth interposition part IN4 in the first direction D1 may become largest at a portion at which the fourth interposition part IN4 is in contact with the third interposition part IN3. The width of the fourth interposition part IN4 in the first direction D1 may become larger as being closer to the uppermost portion or the lowermost portion of the fourth interposition part IN4 at the central level of the fourth interposition part IN4. The width of the fourth interposition part IN4 in the first direction D1 may become larger as being closer to the conductive pattern CP at the central level of the fourth interposition part IN4. A largest width of the fourth interposition part IN4 in the first direction D1 may be smaller than a largest width of the third interposition part IN3 in the first direction D1.

The fourth interposition part IN4 may include a fifth sidewall SW5 in contact with the source contact SC and a sixth sidewall SW6 defining the air gap AR. The fifth sidewall SW5 and the sixth sidewall SW6 may be sidewalls facing each other. The fifth sidewall SW5 and the sixth sidewall SW6 may be formed symmetrically to each other.

FIGS. 10A, 10B, 10C, and 10D are sectional views illustrating a manufacturing method of the semiconductor device shown in FIG. 9.

For convenience of description, components identical to those described with reference to FIG. 9 are designated by like reference numerals, and their overlapping descriptions will be omitted.

A manufacturing method described below is merely one embodiment of the manufacturing method of the semiconductor device shown in FIG. 9, and the manufacturing method of the semiconductor device shown in FIG. 9 might not be limited to that described below.

Figure 10A:
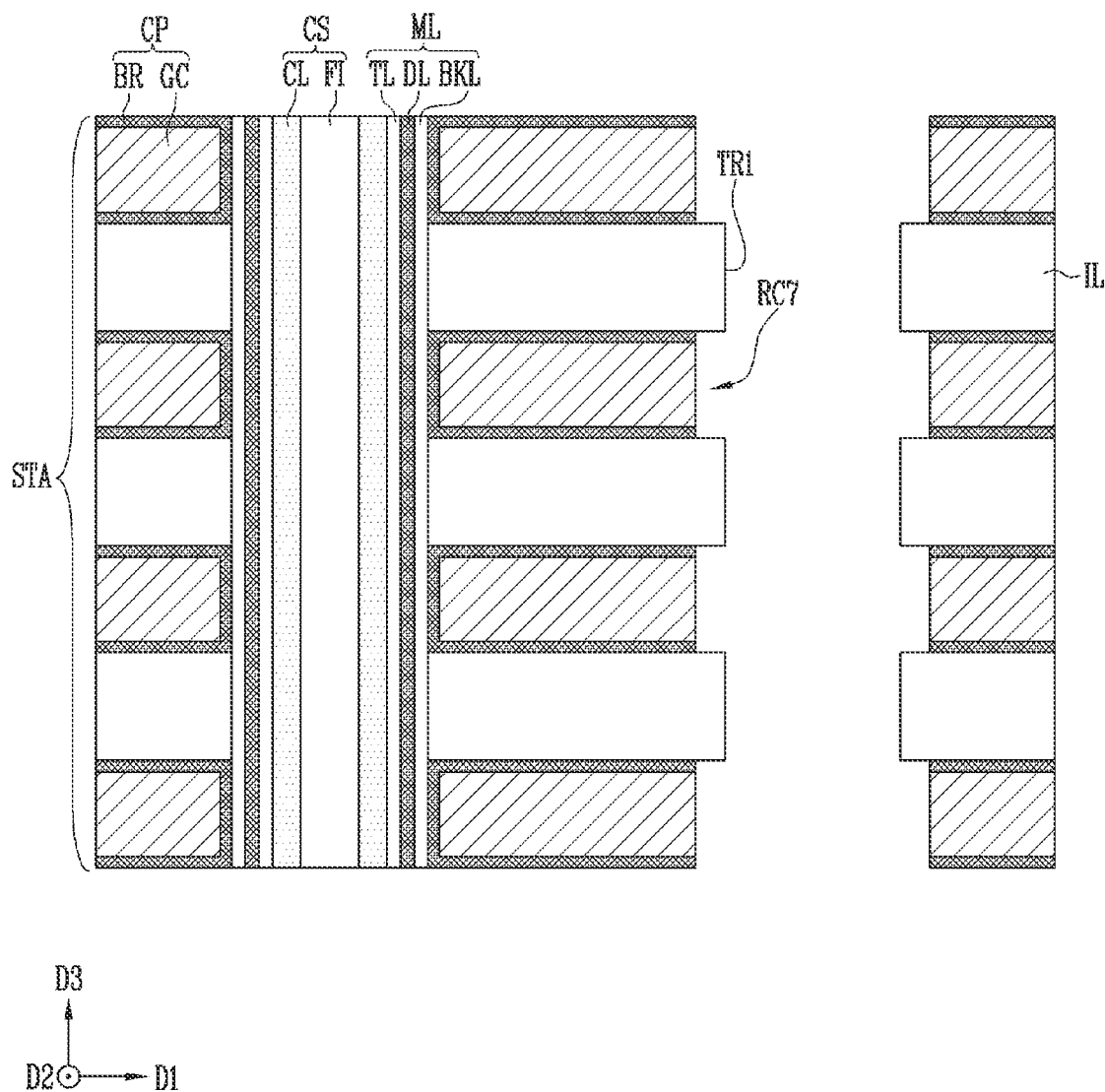

Referring to FIG. 10A, similarly to as described in FIGS. 2A to 2D, a stack structure STA including sacrificial layers and insulating layers IL, a channel structure CS, a memory layer ML, and a first trench TR1 may be formed.

Subsequently, the sacrificial layers may be replaced with conductive patterns CP. The replacing of the sacrificial layers with the conductive patterns CP may include removing the sacrificial layers through the first trench TR1, forming a conductive pattern layer filling spaces formed by removing the sacrificial layers, and etching the conductive pattern layer. When the conductive pattern layer is etched, the conductive patterns CP isolated from each other may be formed. While the conductive pattern layer is etched, a seventh recess RC7 may be formed, which is defined by a sidewall of the conductive pattern CP, a top surface of one insulating layer IL, and a bottom surface of another insulating layer IL. The seventh recess RC7 may be formed between the insulating layers IL adjacent to each other in the third direction D3.

Figure 10B:
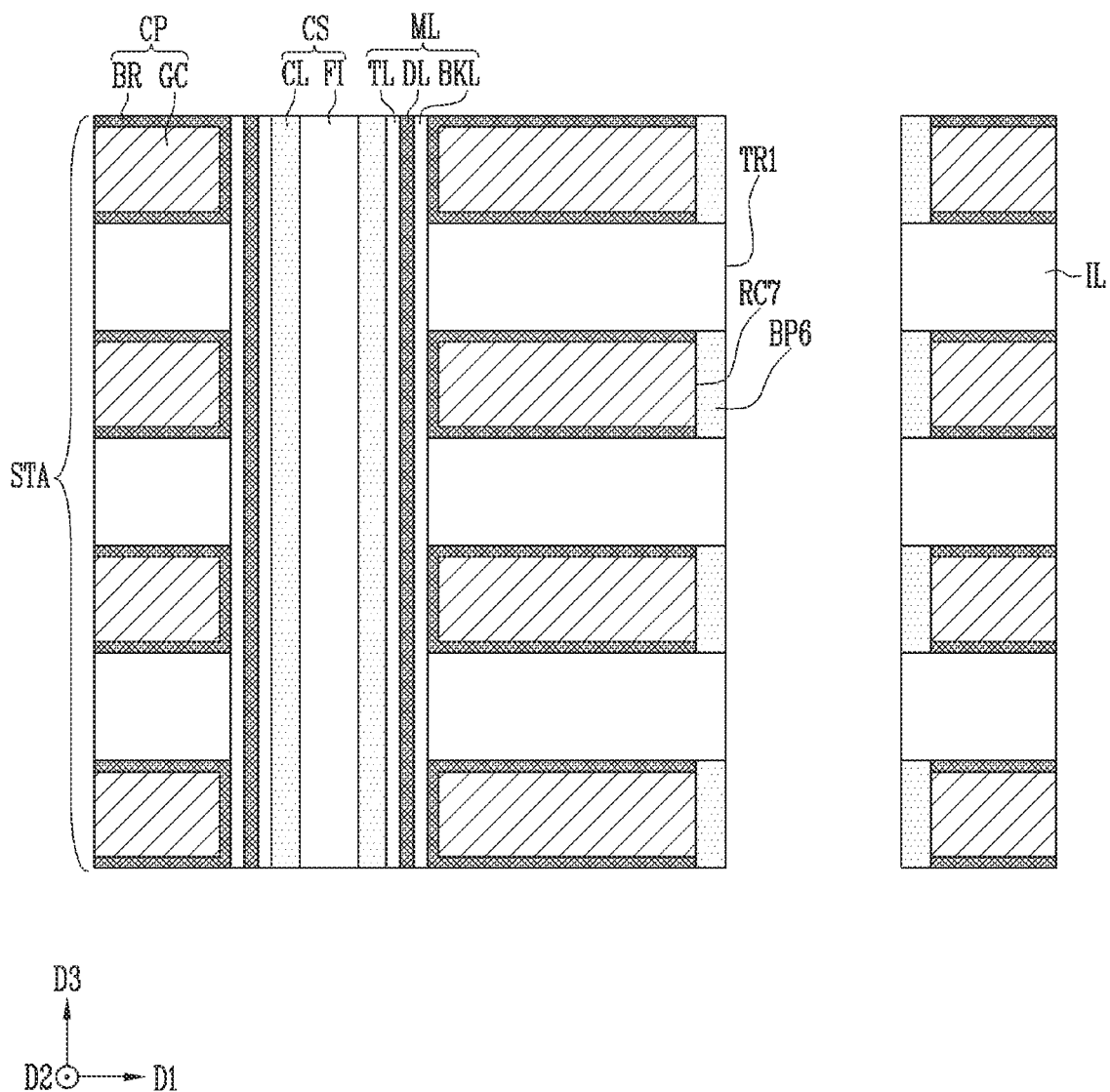

Referring to FIG. 10B, sixth buffer patterns BP6 may be formed in the seventh recesses RC7. The sixth buffer pattern BP6 may be formed between the insulating layers adjacent to each other in the third direction D3. The sixth buffer patterns BP6 may be spaced apart from each other in the third direction D3. The sixth buffer patterns BP6 may include a material which can be oxidized through an oxidation process. In an example, the sixth buffer patterns BP6 may include poly-silicon or nitride. The sixth buffer patterns BP6 may have a constant width in the third direction D3. A width of a sidewall of the sixth buffer pattern BP6, which is in contact with the conductive pattern CP, in the third direction D3 may be equal to that of a sidewall of the sixth buffer pattern BP6, which face the center of the first trench TR1, in the third direction D3.

Figure 10C:
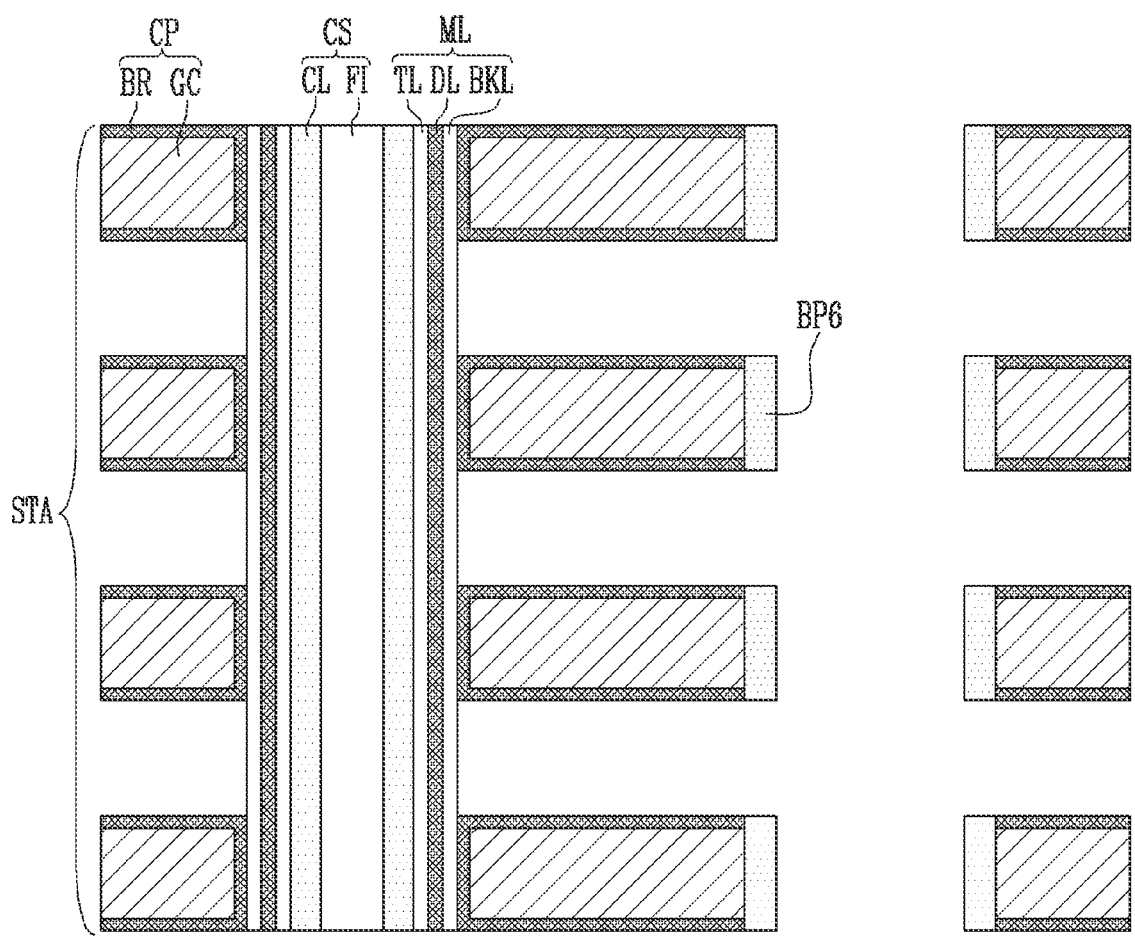

Referring to FIG. 10C, the insulating layers IL may be removed. When the insulating layer IL are removed, top and bottom surfaces of the sixth buffer patterns BP6 may be exposed.

Figure 10D:
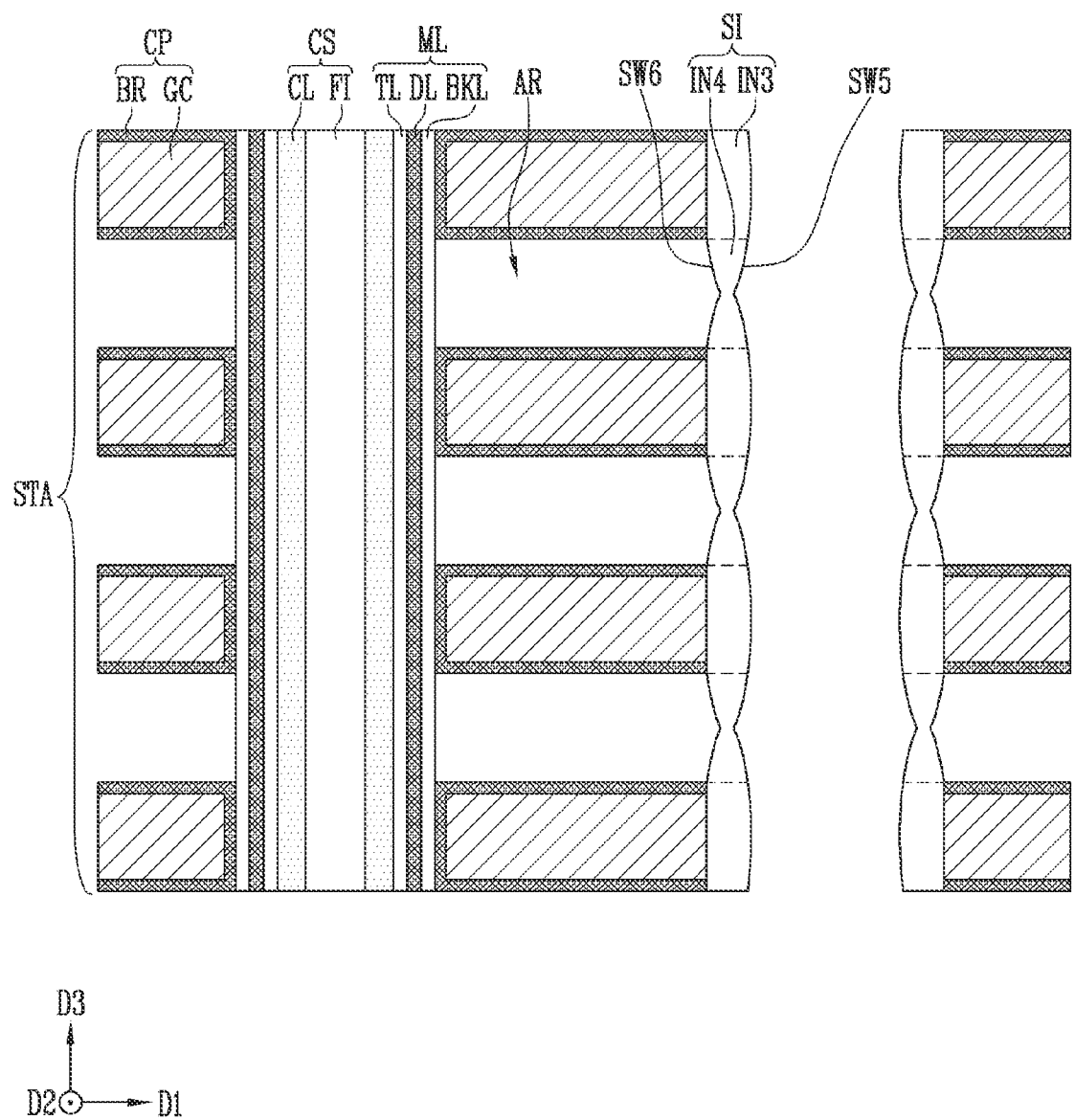

Referring to FIG. 10D, the sixth buffer patterns BP6 may be oxidized. While the sixth buffer patterns BP6 are being oxidized, a volume of the sixth buffer patterns BP6 may become large. The sixth buffer patterns BP6 arranged to be spaced apart from each other in the third direction D3 may be connected to each other in the third direction D3 while the volume of the sixth buffer patterns BP6 become large. While the sixth buffer patterns BP6 are oxidized to be connected to each other, a slit insulating layer SI may be formed. When the slit insulating layer SI is formed, air gaps AR may be defined between the conductive patterns CP.

Since the width of the sixth buffer pattern BP6 in the third direction D3 is constant, fifth and sixth sidewalls SW5 and SW6 of a fourth interposition part IN4 of the slit insulating layer SI may be formed symmetrically to each other. Subsequently, a source contact SC (see FIG. 9) may be formed between two slit insulating layers SI.

FIG. 11A is a sectional view of a semiconductor device in accordance with an embodiment of the present disclosure. FIG. 11B is an enlarged view of region E shown in FIG. 11A.

The semiconductor device shown in FIGS. 11A and 11B may be similar to the semiconductor device shown in FIG. 9, except portions described below.

Referring to FIGS. 11A and 11B, the semiconductor device may include a stack structure STA including conductive patterns CP, a channel structure CS, a memory layer ML, and a slit structure SLS. Air gaps AR may be defined by memory layers ML, the conductive patterns CP, and the slit structure SLS. The slit structure SLS may include a source contact SC and slit insulating layers SI.

Each of the slit insulating layers SI may include third insulating parts IP3 and fourth insulating parts IP4. The third and fourth insulating parts IP3 and IP4 may include the same material or include different materials. In an example, the third and fourth insulating parts IP3 and IP4 may include oxide. In another example, the third insulating parts IP3 may include oxide, and the fourth insulating parts IP4 may include nitride. The third insulating parts IP3 may be arranged to be spaced apart from each other in the third direction D3. The third insulating parts IP3 may be in contact with side walls of the conductive patterns CP, respectively. The third insulating parts IP3 may be spaced apart from the source contact SC. The third insulating part IP3 may include a seventh sidewall SW7 and an eighth sidewall SW8. The seventh sidewall SW7 may be a sidewall facing the air gap AR. The eighth sidewall SW8 may be a sidewall facing the source contact SC. The seventh sidewall SW7 and the eighth sidewall SW8 may face each other.

The fourth insulating part IP4 may be in contact with a plurality of third insulating parts IP3. The fourth insulating part IP4 may connect the plurality of third insulating parts IP3 spaced apart from each other in the third direction D3. The fourth insulating part IP4 may cover the seventh sidewall SW7 and the eighth sidewall SW8 of the third insulating part IP3. A portion of the fourth insulating part IP4, which covers the seventh sidewall SW7 of the third insulating part IP3, may define the air gap AR. A portion of the fourth insulating part IP4, which covers the eighth sidewall SW8, may be in contact with the source contact SC.

A portion of the fourth insulating part IP4, which is interposed between the third insulating parts IP3, may be defined as a first part IP4a. The first part IP4a of the fourth insulating part IP4 may define the air gap AR, and be in contact with the source contact SC. A portion at which a width of the slit insulating layer SI in the first direction is smallest may be the first part IP4a of the fourth insulating part IP4.

A process of forming the third insulating parts IP3 and the fourth insulating parts IP4 will be described. Seventh buffer patterns may be formed on the sidewalls of the conductive patterns CP, and the third insulating parts IP3 may be formed by oxidizing the seventh buffer patterns. Subsequently, the fourth insulating part IP4 may be formed on the third insulating parts IP3.

FIG. 12 is a block diagram illustrating a configuration of a memory system 1100 in accordance with an embodiment of the present disclosure.

Referring to FIG. 12, the memory system 1100 includes a memory device 1120 and a memory controller 1110.

The memory device 1120 may include the semiconductor device described above. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

FIG. 13 is a block diagram illustrating a configuration of a computing system 1200 in accordance with an embodiment of the present disclosure.

Referring to FIG. 13, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

The memory system 1210 may be configured with a memory device 1212 and a memory controller 1211, which are similar to those described with reference to FIG. 12.

In the semiconductor device in accordance with the present disclosure, the volume of air gaps between conductive patterns can be formed to become relatively large, and parasitic capacitance between the conductive patterns can be minimized.

In the manufacturing method of the semiconductor device in accordance with the present disclosure, a slit insulating layer is formed by oxidizing buffer patterns, so that the volume of air gaps can be formed to become relatively large.

Embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being dearly defined in this application, terms should not be understood in an ideally or excessively formal way.

What is claimed is:
1. A semiconductor device comprising:
a stack structure including conductive patterns spaced apart from each other;
a channel structure penetrating the stack structure;
a slit insulating layer penetrating the stack structure in a first direction; and
a source contact in contact with the slit insulating layer,
wherein air gaps are defined between the conductive patterns,
wherein the slit insulating layer includes a first interposition part covering a sidewall of one of the conductive patterns and a second interposition part covering one of the air gaps from the side,
wherein a smallest width of the second interposition part in a second direction perpendicular to the first direction is smaller than a smallest width of the first interposition part in the second direction,
wherein the source contact includes a first contact part covering the first interposition part of the slit insulating layer and a second contact part covering the second interposition part of the slit insulating layer, and
wherein an interface between the first contact part of the source contact and the first interposition part of the slit insulating layer is convex towards the first contact part of the source contact.

2. The semiconductor device of claim 1,
wherein a width of the second interposition part becomes larger as approaching the first interposition part from a central level of the second interposition part.

3. The semiconductor device of claim 1,
wherein a width of the first interposition part becomes smaller approaching the second interposition part from a central level of the first interposition part.

4. The semiconductor device of claim 1,
wherein a width of the second interposition part is smallest at a central level of an air gap adjacent to the second interposition part.

5. The semiconductor device of claim 1,
wherein a largest width of the second contact part is larger than a largest width of the first contact part.

6. The semiconductor device of claim 1,
wherein the second interposition part includes a second sidewall defining an air gap adjacent to the second interposition part and a first sidewall facing the second sidewall, and
wherein the first sidewall and the second sidewall are formed asymmetrically to each other.

7. The semiconductor device of claim 6,
wherein the first sidewall and the second sidewall are curved.

8. The semiconductor device of claim 1, further comprising:
a memory layer surrounding the channel structure; and
protective patterns disposed between the memory layer and the respective conductive patterns.

9. The semiconductor device of claim 8,
wherein each of the protective patterns is in contact with a top surface, a sidewall, and a bottom surface of each of the conductive patterns, respectively.

10. The semiconductor device of claim 8,
wherein the protective patterns are disposed between the air gaps.

11. A semiconductor device comprising:
a stack structure including conductive patterns spaced apart from each other;
a channel structure penetrating the stack structure;
a slit insulting layer penetrating the stack structure in a first direction; and
a source contact in contact with the slit insulating layer,
wherein air gaps are defined between the conductive patterns,
wherein the slit insulating layer includes a first interposition part disposed between one of the conductive patterns and the source contact, and a second interposition part disposed between one of the air gaps and the source contact,
wherein the one of the conductive patterns abuts the one of the air gaps,
wherein the first interposition part includes a first sidewall in contact with the source contact and a second sidewall in contact with the one of the conductive patterns,
wherein the first sidewall is convex in a direction away from the one of the conductive patterns, and
wherein at least a portion of the one of the air gaps protrudes more than the second sidewall toward the source contact.

12. The semiconductor device of claim 11,
wherein the first and second sidewalls are formed symmetrically to each other.

13. The semiconductor device of claim 11,
wherein a sidewall of the source contact is curved to correspond to the first sidewall of the first interposition part of the slit insulating layer.

14. The semiconductor device of claim 11,
wherein the slit insulating layer includes a first insulating part in contact with at least one of the conductive patterns and a second insulating part covering a sidewall of the first insulating part.

15. The semiconductor device of claim 14,
wherein the first insulating part comprises a plurality of first insulating parts,
wherein the first insulating parts are spaced apart from each other, and
wherein the second insulating part is in contact with the first insulating parts.

16. The semiconductor device of claim 14,
wherein a largest width of the first insulating part is larger than a largest width of the second insulating part.

* * * * *